United States Patent [19]
Ujiie

[11] Patent Number: 5,557,196
[45] Date of Patent: Sep. 17, 1996

[54] JITTER ANALYZER

[75] Inventor: Hitoshi Ujiie, Sendai, Japan

[73] Assignee: Advantest Corporation, Tokyo, Japan

[21] Appl. No.: 424,369

[22] PCT Filed: Aug. 23, 1994

[86] PCT No.: PCT/JP94/01389

§ 371 Date: Apr. 25, 1995

§ 102(e) Date: Apr. 25, 1995

[30] Foreign Application Priority Data

Aug. 25, 1993 [JP] Japan ................... 5-210211
Sep. 16, 1993 [JP] Japan ................... 5-230538
Sep. 20, 1993 [JP] Japan ................... 5-233365

[51] Int. Cl.[6] .................................................. F24F 7/00
[52] U.S. Cl. ........................ 324/76.77; 324/76.13
[58] Field of Search .................... 324/76.77, 76.13, 324/76.79, 76.82, 76.83, 76.52, 76.53, 76.61, 76.41, 76.42

[56] References Cited

U.S. PATENT DOCUMENTS

| | | | |
|---|---|---|---|
| 3,711,773 | 1/1973 | Hekimian et al. | 324/76.77 |
| 4,825,379 | 4/1989 | Luthra et al. | 324/76.77 |
| 4,876,655 | 10/1989 | Carlton et al. | 324/76.13 |
| 4,896,271 | 1/1990 | Jeng et al. | 324/76.77 |
| 4,974,234 | 11/1990 | Brandt | 375/226 |
| 5,293,520 | 3/1994 | Hayashi | 324/76.77 |
| 5,309,428 | 5/1994 | Copley et al. | 370/17 |
| 5,363,366 | 11/1994 | Wisdom, Jr. | 370/13 |
| 5,444,695 | 8/1995 | Copley et al. | 370/17 |

Primary Examiner—Michael Tokar
Attorney, Agent, or Firm—Staas & Halsey

[57] ABSTRACT

There is provided a jitter analyzer which finds various quantities in time/frequency domain of a signal to be measured including a discontinuous burst signal by using two successive period measuring circuits (17, 18), and further can perform an analysis of a frequency component of a jitter in the signal. In case the signal to be measured is a burst signal, the input of the signal from a measuring signal generating circuit (11) into the first and second successive period measuring circuits (17, 18) is inhibited during off-time intervals of the burst signal thereby eliminating data generated during the off-time intervals of the burst signal.

14 Claims, 34 Drawing Sheets

A

B

C

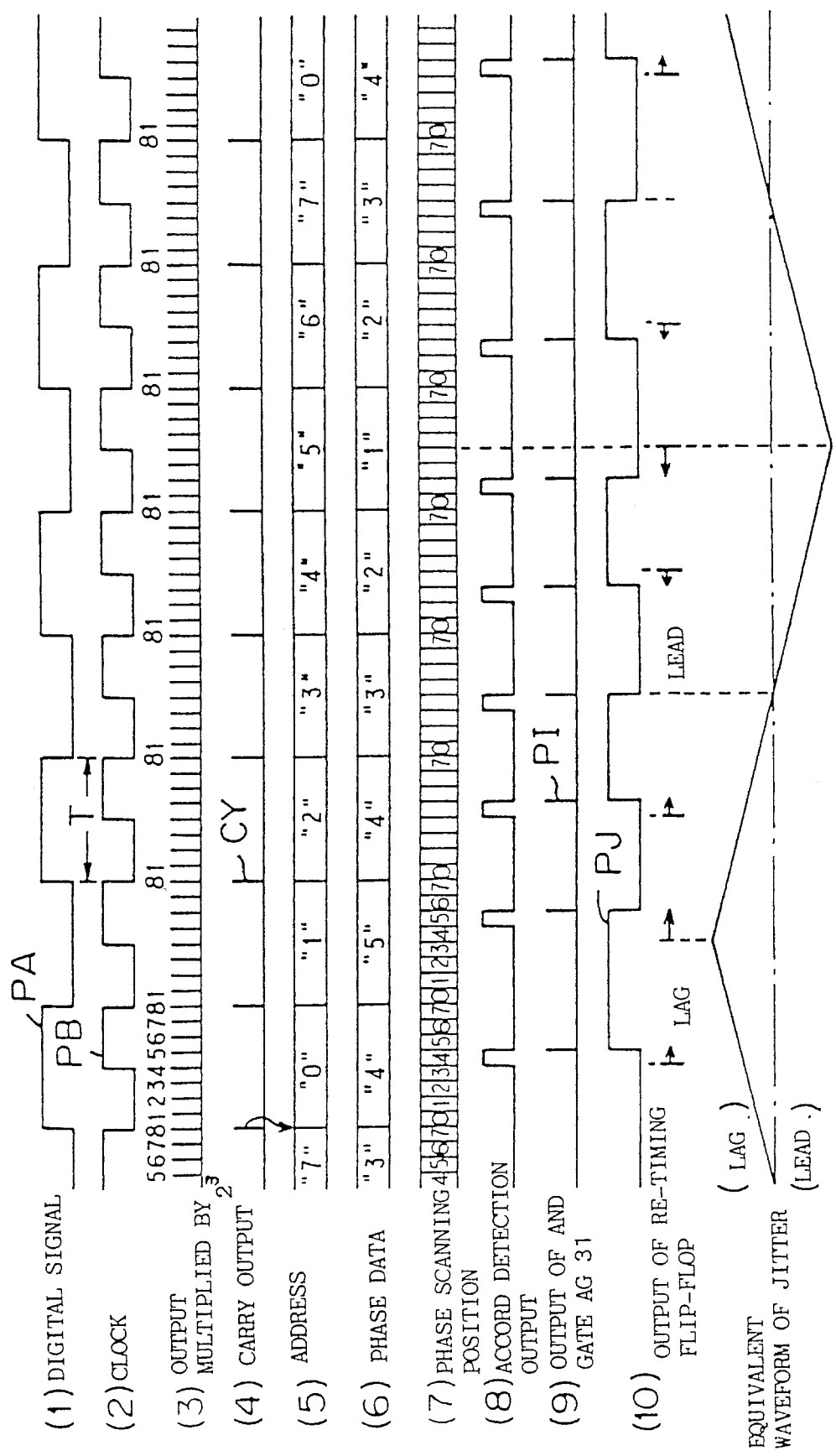

JITTER ANALYZER

TECHNICAL FIELD

The present invention generally relates to a jitter analyzer for analyzing a pulse width fluctuation, what is called a jitter or jitters, of a pulse-like signal to be measured. More particularly, the present invention relates to a jitter analyzer which is capable of continuously measuring various quantities (parameters) in the domain of time/frequency of a pulse-like signal to be measured including a discontinuous burst signal, for example, a period, a frequency, a pulse width, a duty ratio, a time interval, a phase or the like of the pulse-like signal, as well as manifesting a time on acquisition of each data and analyzing a statistical operation, a distribution of the frequency (number of occurrences), a variation relative to the time elapsed, and a frequency component of each of these parameters, and also, relates to a jitter analyzer with a time window trigger function which is capable of, in continuous measurement of such various parameters, detecting a specified section or segment in a signal to be measured and continuously acquiring data immediately after the detection of the specified section to measure them, or inhibiting the analyzer from measuring data immediately after the detection of the specified section, and further, relates to a jitter analyzer with a wander analyzing function which is capable of continuously measuring various parameters in the domain of time/frequency of a pulse-like signal to be measured, for example, a period, a time interval or the like of the pulse-like signal and analyzing with a high accuracy and efficiently an amplitude and frequency components of a jitter and a wander which is a variation in phase over a long time based on MTIE (maximum time interval error) from the measured values of the parameters.

BACKGROUND ART

There have been previously proposed various kinds of time/frequency measuring apparatus for continuously measuring various parameters in the domain of time/frequency of a pulse signal to be measured, for example, period, frequency, pulse width, duty ratio, time interval, phase or the like of the pulse signal and analyzing a pulse width fluctuation, namely, a jitter, of the pulse signal to be measured. However, the prior art measuring apparatus have problems that the accuracy of measurement is low, the circuit composition or construction is complicated, the troublesome control is required, etc.

To this end, the assignee of the present application filed a patent application for an invention entitled "jitter analyzer" for analyzing a jitter contained in an input pulse (see Japanese Patent Application Public Disclosure No. 107287/1993 or U.S. Pat. No. 5,293,520). The jitter analyzer disclosed therein is a kind of time interval analyzer for calculating a period and a pulse width of a pulse signal inputted as a signal to be measured as well as analyzing a component of a jitter contained in the pulse width by effecting the fast Fourier transform (hereinafter also referred to as FFT) of the calculated data of pulse width and analyzing the results. As to the detailed explanation thereof, see the above-mentioned Japanese Patent Application Public Disclosure No. 107287/1993 or U.S. Pat. No. 5,293,520.

Also, the assignee of the present application filed a utility model application for an invention entitled "an apparatus for continuously measuring pulse widths" on Apr. 28, 1993 (Japanese Utility Model Application No. 27920/1993). The pulse width measuring apparatus disclosed therein can continuously measure pulse widths of input pulses without being restricted by the duty ratios thereof and make higher the limitation of measurable frequency.

Recently, digital communications have been utilized by persons and as a result communications utilizing a discontinuous burst signal as represented by a TDMA (time division multiple access) communication system have prospered. Therefore, it has become important to analyze various parameters in the domain of time/frequency of the burst signal, that is, a jitter contained in the burst signal.

In digital communications or digital recording/reproducing apparatus (magnetic, optical or the like), information is divided in time within a predetermined section or segment and stored. Hence it becomes important to measure only a section of data among a stream of data or to inhibit from measuring only a section of data among a stream of data. For example, in TDMA communication system, information transmitting slots appear in a burst-like manner and so it is necessary to detect a section or segment having no desired data therein and to start to measure immediately after the detected section has been terminated. On the other hand, in an optical or magnetic recording apparatus, there may be cases in which a header information of a sector is intended to be excluded from the measurement and a section of the sector which has only a user information field or fields therein is intended to be measured.

In digital communication networks as represented by an architecture such as ISDN (integrated services digital network), SONET (synchronous optical network)/SDH (synchronous digital hierarchy), etc., a jitter and/or a wander is considered to be a main factor which prevents from implementing or effecting a high-speed transmission of data with high quality and large capacity. The jitter is prescribed in its amplitude value and frequency component according to the advice of ITU/TS (formerly CCITT) and the like, and the wander is prescribed in the maximum value of MTIE (maximum time interval error) for an observation time.

Generally, in a transmission communicating system, a PLL (phase locked loop) of a relatively low gain is used to reproduce clocks received. Accordingly, a jitter of high frequency component is suppressed to a certain degree by the PLL, but a jitter of low frequency component and/or a wander which cannot be fully removed by the PLL raises a problem in actual use.

Further, in SONET/SDH which is important as a social foundation in future, there is provided a function of insertion and extraction of a pointer existing in the heading portion of a transmission frame in order to maintain the synchronization in a network interface, and also, in ATM (asynchronous transfer mode) there is provided a function by which a reference frequency information of an originating side is transferred to a receiving side by use of a time stamp and the receiving side reproduces the reference frequency information of the originating side. These new synchronizing techniques cause a further problem that a jitter of lower frequency (1 µHz–10 Hz) and a wander are produced thereby, and it is apprehensive that a jitter is more and more lowered in frequency thereof.

The above-mentioned prior time interval analyzer is aimed principally at analyzing a continuous signal and so in case that a discontinuous burst signal is inputted into such analyzer as a signal to be measured in order to measure various parameters in the domain of time/frequency thereof, such parameters are continuously measured by the analyzer irrespective of on/off (existence/nonexistence) of the burst signal. Therefore, the necessary data during an on-interval of the burst signal (a time interval that the burst signal exists) and the unnecessary data during an off-interval of the burst signal (a time interval that the burst signal does not exist) are mixed together in the result of measurement obtained, and the analysis of the obtained data is prevented thereby. Particularly, in the analysis of a variation for the time elapsed and frequency, the obtained data including the unnecessary data during off-intervals of the burst signal are processed all together, and so there is a drawback that the desired result of analysis is not obtained.

In order to remove this prior art drawback, there are proposed some time interval analyzers having an input terminal for coping with a burst signal to which a measurement inhibiting signal is inputted. That is, each of such time interval analyzers is provided with "a measurement inhibiting signal input" as an external input terminal for measuring a burst signal, and the measurement inhibiting signal input receives a measurement inhibiting signal (which is generated during an off-interval of the burst signal) transmitted together with the burst signal which is to be measured thereby causing the analyzer to stop the measurement thereby during the off-interval of the burst signal. As a result, the measurement by the analyzer is performed only during the on-interval of the burst signal, namely, only when the measurement inhibiting signal is not received on the measurement inhibiting signal input. Therefore, in a statistical operation and an analysis of distribution of the number of occurrences the result of measurements obtained only during the on-intervals of the burst signal is processed, and the unnecessary data during the off-intervals of the burst signal are not contained in that analysis. Also, each such analyzer is constituted such that marks each indicating a measurement inhibiting interval are displayed on a graph in an analysis of a variation for the time elapsed or the like.

However, in such prior art analyzers thus constructed, in addition to a signal to be measured, a measurement inhibiting signal (a burst on/off signal synchronized with the existence and nonexistence of a burst signal) is always necessary. In general environment of measurement there are many cases that only a signal to be measured is transmitted/received and a burst on/off signal is not transmitted/received, and as a result there is a drawback that a condition for measurement is restricted. In addition, since data during measurement inhibiting intervals are not acquired, this results in an essential defect that an analysis of frequency by FFT cannot be effected.

Also, the above-mentioned prior aft time/frequency measuring apparatus, inclusive of the measuring apparatus described in the above-mentioned Japanese Patent Application filed by the assignee of the present application, have the difficulty of analyzing a jitter contained in a burst signal, and an external trigger input function by which a measurement is started after an external timing signal has been inputted and an edge of level (low/high) of this timing signal has been acquired, a delay trigger function by which a measurement is started after a time interval preset by a user has elapsed or the number of edges of a signal to be measured preset by a user has occurred, of the like is used by the prior aft apparatus as a trigger function thereof. Accordingly, it is impossible by such prior aft trigger functions to perform the measurements in which a specified section of segment in a signal to be measured is detected and data measured is started to be stored immediately after the detection of the specified section of data measured is inhibited from being stored immediately after the detection of the specified section.

Further, there is proposed a time interval measuring apparatus with a time window function which is able to acquire a specified data in a signal to be measured and is disclosed, for example, in U.S. Pat. No. 4,611,926. However, the constitution and control procedure of the time window circuit disclosed in the U.S. Pat. No. 4,611,926 are aimed at realizing a discriminating function of measured values and only when data within a range set by a user is observed, the data is adopted as a measured value.

That is, because this time window circuit is equivalent to the circuit constitution and control procedure which are aimed at only acquiring data within a range from a stream of data, it is also difficult for such time window circuit to detect a specified section or segment in the data stream and to start to store data measured immediately after the detection of the specified section or to inhibit from storing data measured immediately after the detection of the specified section.

It is said hitherto that a digital transmission analyzer is capable of analyzing a jitter contained in a pulse-like signal to be measured. This digital transmission analyzer is a tester which measures a transmission error and a jitter, and mainly comprises a transmitting part and a receiving part. The receiving part has a jitter measurable function, but parameters measured by this analyzer are restricted mainly to an amplitude of jitter and a frequency or number of occurrences of data over a certain amplitude value of jitter, and it is said that this analyzer has not a function of analyzing a frequency component. Because in case of analyzing a frequency component of a jitter in this digital transmission analyzer, there is no other way that a jitter frequency of an output signal is set by the transmitting part and the jitter amplitude at that time is measured in the receiving part, and therefore, it is impossible to effect an analysis of continuous jitter frequency components ranging from a low frequency to a high frequency. In addition, the lower limit of a region of setting a jitter frequency is of the order of 10 Hz–100 Hz which is an insufficient value to analyze a jitter of a low frequency, and a wander cannot be measured.

On the other hand, prior art SONET/SDH analyzers publicly known, generally, are aimed at mainly effecting function tests, and some of them are deemed to be ones which can analyze a jitter/wander. Such type of the analyzers comprise a transmitting part and a receiving part separated from each other similar to the above-mentioned digital transmission analyzer, and a frequency and amplitude of a jitter are set by the transmitting part and the jitter amplitude is measured in the receiving part. In addition, the lower limit of a region of setting a jitter frequency is as low as 1 Hz which makes it possible to effect an analysis of jitter frequency to 1 Hz, but this lower limit of 1 Hz is still insufficient. Also, such analyzers have a function capable of measuring a wander in an observation interval of 100 msec (0.1 sec) to 100 sec. However, this observation interval is merely a little bit of the scope of observation interval according to the advice of ITU/TS and it is extremely insufficient.

The observation interval of MTIE manifested by the advice of ITU/TS ranges from 50 msec to $10^9$ sec and this observation interval is divided by two ranges, one being the range from 50 msec to 500 sec, the other being the range from 500 sec to $10^9$ sec. Among them the range from 50 msec to $10^7$ sec is regarded as important for a wander in view of realization of the observation interval (the advice G. 811). Accordingly, it is impossible by the above-mentioned observation interval from 0.1 sec to 100 sec to measure a wander with a high accuracy.

DISCLOSURE OF INVENTION

An object of the present invention is to provide a jitter analyzer which, in an analysis of a jitter contained in a discontinuous burst signal, can remove data generated during an off-interval of the burst signal without being supplied with an external burst on/off signal so that an analysis of a continuous signal as well as an analysis of a discontinuous burst signal can be effected.

An another object of the present invention is to provide a jitter analyzer with a time window trigger function which can detect a specified section or segment in a pulse-like signal to be measured inclusive of a burst signal and start to store data measured in a memory immediately after the completion of the specified section or can inhibit from storing data measured in the memory immediately after the completion of the specified section.

A further object of the present invention is to provide a jitter/wander analyzer which can measure and analyze jitters of lower frequencies with a high accuracy and can measure and analyze wanders based on MTIE according to the advice of ITU/TS with a high accuracy and efficiently.

In accordance with a first aspect of the present invention, there is provided a jitter analyzer which comprises: a first successive period measuring circuit supplied with one edge of each waveform of a pulse-like signal to be measured including a discontinuous burst signal, for continuously measuring the period between the edges; a second successive period measuring circuit supplied with one edge of each waveform of a pulse-like signal to be measured including a discontinuous burst signal or the other edge of each waveform of the signal to be measured inputted into the first successive period measuring circuit, for continuously measuring the period between the edges; first and second memories for storing measured period data therein each time the measured period data are provided from the first and second successive period measuring circuits, respectively; measuring quantity operating means for calculating various quantities in time/frequency domain of the signal to be measured on the basis of the measured period data stored in the first and second memories, the various quantities in time/frequency including at least a period and a pulse width; analysis means for performing an analysis of the calculated various quantities in time/frequency of the signal to be measured; and first and second gate circuits for controlling the passage of the edges therethrough provided to the first and second successive period measuring circuits, respectively.

With the above-mentioned construction of the present invention, in case a discontinuous burst signal is inputted, it is possible by controlling on/off of the first and second gate circuits to inhibit any signal from being inputted into the successive period measuring circuits during the off-intervals of the burst signal. Therefore, whether the signal to be measured is a continuous pulse signal or a discontinuous burst signal, the measurement and/or analysis of various quantities in time/frequency domain, for example, period, frequency, pulse width, duty ratio, time interval, phase or the like, of the signal to be measured can be continuously performed with a high accuracy. In addition, by providing a gate on/off control circuit which generates gate on/off signals for controlling on/off of the first and second gate circuits based on edges of the signal to be measured, in case a discontinuous burst signal is inputted and a burst on/off signal is not inputted from the outside, the gate on/off signals from the gate on/off control circuit can be supplied to the first and second gate circuits thereby inhibiting any signal from being inputted into the successive period measuring circuits during the off-intervals of the burst signal. Accordingly, even in case an input pulse is a discontinuous burst signal and there is no external burst on/off signal, the measurement and/or analysis of various quantities in time/frequency domain can be continuously performed with a high accuracy. Also, since there is provided a function which creates a burst on/off signal by taking the measure of a timing in the inside and each data has the acquisition time thereof recorded regardless of on/off of the burst signal, when an analysis of a statistical operation, distribution of the number of occurrences, variation relative to the elapsed time, frequency components or the like as to the various quantities in time/frequency domain of the signal to be measured is performed, data generated during the off-intervals of the burst signal can be eliminated and also an interpolation of data can be done on the basis of the relation between the times before and after the eliminated data, and so, in addition to the analysis of the jitter in a continuous signal, the analysis of the jitter in a discontinuous burst signal can be also performed which could not have been done previously.

In accordance with a second aspect of the present invention, there is provided a jitter analyzer which comprises: a first successive period measuring circuit supplied with one edge of each waveform of a pulse-like signal to be measured including a discontinuous burst signal, for continuously measuring the period between the edges; a second successive period measuring circuit supplied with one edge of each waveform of a pulse-like signal to be measured including a discontinuous burst signal or the other edge of each waveform of the signal to be measured inputted into the first successive period measuring circuit, for continuously measuring the period between the edges; first and second memories for storing measured period data therein each time the measured period data are provided from the first and second successive period measuring circuits, respectively; means having a time window trigger function for sequentially comparing measured period data outputted from the first or second successive period measuring circuit with a reference data preset by a user and inhibiting the measured data outputted from the first and second successive period measuring circuits from being stored in the first and second memories until a condition is satisfied as well as, when the condition is satisfied, generating a time window trigger signal thereby making it possible that the measured data outputted from the first and second successive period measuring circuits after the generation of the time window trigger signal are stored in the first and second memories, respectively, or for making it possible that the measured data outputted from the first and second successive period measuring circuits are stored in the first and second memories until a condition is satisfied as well as, when the condition is satisfied, generating a time window trigger signal thereby inhibiting the measured data outputted from the first and second successive period measuring circuits after the generation of the time window trigger signal from being stored in the first and second memories; measuring quantity operating means for calculating various quantities in time/frequency domain of the signal to be measured on the basis of the measured period data stored in the first and second memories, the various quantities in time/frequency including at least period and pulse width; and analysis means for performing the analysis of the calculated various quantities in time/frequency of the signal to be measured.

With the above-mentioned construction of the present invention, since it is possible by a time window trigger function to detect a specified section or segment in a pulse-like signal to be measured including a burst signal and continuously acquire measuring data immediately after the detection of the specified section to measure them, or to inhibit the analyzer from measuring immediately after the detection of the specified section, in case whether a signal to be measured such as a continuous pulse signal is inputted or a discontinuous burst signal is inputted, the measurement of various quantities in time/frequency domain, for example, period, frequency, pulse width, duty ratio, time interval, phase or the like, in a desired section of the signal to be measured can be continuously performed with a high accuracy whereby the analysis of a statistical operation, distribution of the number of occurrences, variation relative to the elapsed time, frequency components or the like as to these various quantities can be performed with a high accuracy. In particular, in case a discontinuous burst signal is inputted, the measurement of the signal to be measured can be done immediately after the end of the first off-interval of the burst signal detected, and further, the measurement of the signal to be measured can be inhibited during the off-intervals of the burst signal after the first off-interval. Accordingly, even in case the discontinuous burst signal is inputted, the measurement of the various quantities in time/frequency domain, for example, period, frequency, pulse width, duty ratio, time interval, phase or the like, can be continuously performed with a high accuracy. Also, since each data has the acquisition time thereof recorded regardless of on/off of the burst signal, when an analysis of a statistical operation, distribution of the number of occurrences, variation relative to the elapsed time, frequency components or the like as to the various quantities in time/frequency domain of the signal to be measured is performed, data generated during the off-intervals of the burst signal can be eliminated and also an interpolation of data can be done on the basis of the relation between the times before and after the eliminated data, and so, in addition to the analysis of the jitter in a continuous signal, the analysis of the jitter in a discontinuous burst signal can be also performed which could not have been done previously.

In accordance with a third aspect of the present invention, there is provided a jitter analyzer which comprises: a first successive period measuring circuit supplied with one edge of each waveform of a pulse-like signal to be measured, for continuously measuring the period between the edges; a second successive period measuring circuit supplied with one edge of each waveform of a pulse-like signal to be measured or one edge of each waveform of a test signal having a reference phase and a predetermined frequency created within the analyzer, for continuously measuring the period between the edges; first and second memories for storing measured period data therein outputted from the first and second successive period measuring circuits, respectively; measuring quantity operating means for calculating various quantities in time/frequency domain of the signal to be measured on the basis of the measured period data stored in the first and second memories, the various quantities in time/frequency including at least period and time interval; analysis means for performing the analysis of the calculated various quantities in time/frequency of the signal to be measured; and first and second frequency dividing means for selectively dividing in frequency the signals to be measured inputted into the first and second successive period measuring circuits, respectively.

With the above-mentioned construction of the present invention, the periods of the two signals to be measured can be concurrently and continuously measured by the first and second successive period measuring circuits, and also the frequency spectrums of the jitters in the two signals to be measured can be concurrently found with a high accuracy by effecting the fast Fourier transform of the variation relative to the elapsed time of each of the measured values calculated in the measuring quantity operating means and analyzing the transformed results by the analysis means. The relative frequency spectrum of the jitters in the two signals to be measured can be concurrently found with a high accuracy by calculating a time interval value between the two signal to be measured from respective values of the measured periods in the measuring quantity operating means, and by effecting the fast Fourier transform of the variation relative to the elapsed time of the time interval value calculated in the measuring quantity operating means and analyzing the transformed results by the analysis means. In addition, since the overall time interval of the measurement can be made long by dividing in frequency the signals to be measured into appropriate frequencies in the first and second frequency dividing means and measuring the periods of the frequency divided signals to be measured in the first and second successive period measuring circuits, the relatively low frequency spectrums of the jitters in the two signals to be measured can be found with a high accuracy by effecting the fast Fourier transform of the variation relative to the elapsed time of each of the measured values calculated in the measuring quantity operating means and analyzing the transformed results by the analysis means. Moreover, a wander which is a variation in phase over a long time can be analyzed efficiently by dividing in frequency the signal to be measured and the test signal having the reference phase and the predetermined frequency into an appropriate frequency where both the signals accord with each other in frequency in the first and second frequency dividing means, measuring the periods of the frequency divided signals in the first and second successive period measuring circuits, calculating a time interval value between the both frequency divided signals from respective values of the measured periods thereof in the measuring quantity operating means, and calculating the maximum value and the minimum value of the time interval values between the both signals calculated in the measuring quantity operating means and concurrently calculating MTIEs and frequency deviations over long time intervals in plural observation times from the calculated maximum and minimum values by the analysis means. Further, by providing a jitter adding means for adding a jitter to the test signal having the reference phase and the predetermined frequency and outputting the jitter added test signal to the outside, a jitter added test signal having any waveform and any frequency which a user can set can be outputted from the jitter adding means to an external device to be tested. Therefore, by inputting the output signal from the device to be tested into the analyzer as a signal to be measured, the jitter suppressing effects and the jitter-resistant capability of the device to be tested can be analyzed accurately. Furthermore, by providing a terminal for outputting the test signal having the reference phase and the predetermined frequency and outputting a pure test signal having no jitter from the terminal to an external device to be tested and inputting an output signal from the device to be tested into the analyzer as a signal to be measured, the jitter produced only by the device to be tested can be analyzed with a high accuracy.

In such manner, the jitter analyzer according to the present invention can analyze continuous frequency components of jitters ranging from a low frequency to a high frequency with a high accuracy, and also can effect a sufficient analysis of jitters of lower frequencies, and moreover can measure wanders based on MTIE according to the advice of ITU/TS over the observation interval ranging from 50 msec to $10^7$ sec, which is regarded as important, with a high accuracy and efficiently.

BRIEF DESCRIPTION OF DRAWINGS

FIG. 35 is a timing chart showing waveforms at respective portions of the jitter adding circuit of FIG. 34.

BEST MODE FOR CARRYING OUT THE INVENTION

Now, the present invention will be described in detail as to the embodiments thereof with reference to the drawings.

Figure 1:
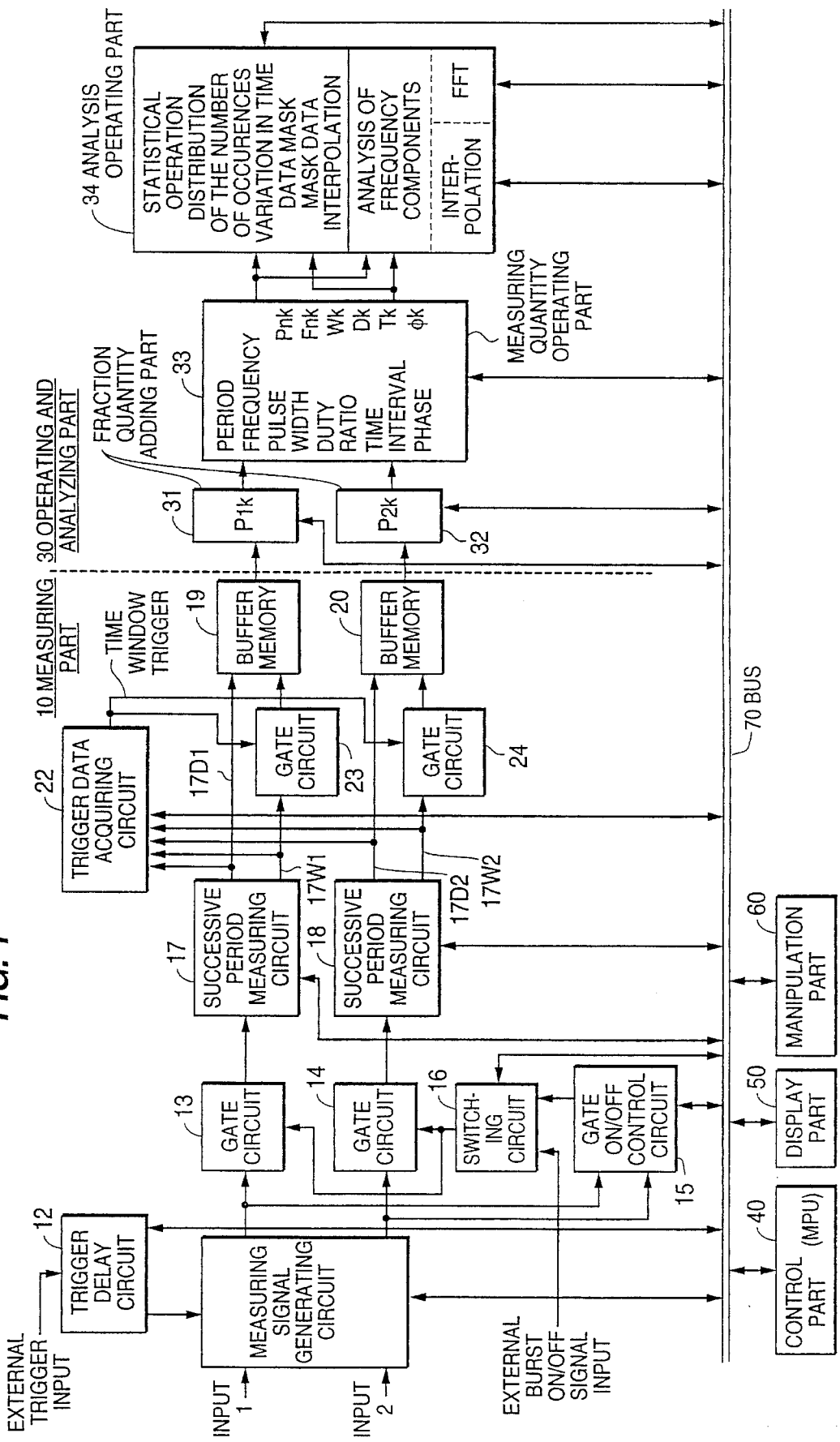
FIG. 1 is a block diagram showing the whole constitution of a first embodiment of a jitter analyzer according to the present invention.

FIG. 1 is a block diagram showing the whole constitution of a first embodiment of a jitter analyzer according to the present invention. Though the jitter analyzer of the first embodiment shown in FIG. 1 is provided with a time window trigger function, this jitter analyzer is capable of continuously measuring with a high accuracy various quantities in the domain of time/frequency of a pulse-like signal to be measured including a discontinuous burst signal, for example, period, frequency, pulse width, duty ratio, time interval, phase or the like thereof, as well as manifesting a time on acquisition of each data and analyzing precisely a statistical operation, a distribution of the number of occurrences (frequency), a variation in the time elapsed, and a frequency component of each of these quantities, without using the time window trigger function thereof as described later.

The jitter analyzer comprises roughly a measuring part 10, an operating and analyzing part 30, a control part 40, a display part 50, and a manipulation or console part 60. The control part 40, the display part 50 and the manipulation part 60 are mutually connected to the measuring part 10 and the operating and analyzing part 30 via a bus 70.

The measuring part 10 comprises a measuring signal generating circuit 11, a trigger delay circuit 12, first, second, third and fourth gate circuits 13, 14, 23 and 24, a gate on/off control circuit 15, a switching circuit 16, first and second successive period measuring circuits 17 and 18, first and second buffer memories 19 and 20, and a trigger data acquiring circuit 22.

At first, the operation of the jitter analyzer of the first embodiment of the present invention will be described in case the time window trigger function is not used. In this case, the third and the fourth gate circuits 23 and 24 as well as the trigger data acquiring circuit 22 are eliminated from the circuit composition of FIG. 1, and so data outputs and write pulses from the first and the second successive period measuring circuits 17 and 18 are directly supplied to the first and the second buffer memories 19 and 20, respectively.

A pulse-like signal to be measured such as a pulse signal and a burst signal is supplied to the measuring signal generating circuit 11 of the measuring part 10. The measuring signal generating circuit 11 is arranged to be able to independently receive two inputs, namely, an input 1 and an input 2 as shown, and can measure concurrently two separate signals to be measured in two systems with respect to the period, frequency, or the like thereof as described later. Also, since the measuring signal generating circuit 11 has the trigger delay circuit 12 connected thereto, when an external trigger signal for starting the measurement is supplied to the trigger delay circuit 12, the trigger signal is supplied to the measuring signal generating circuit 11 after it is delayed by a predetermined time duration thereby starting the measurement of a signal to be measured (also hereinafter referred to simply as "measured signal") inputted to the measuring signal generating circuit 11. The delay time of the trigger signal is preset by a user who can inputs a desired delay time into the trigger delay circuit 12 through the manipulation part 60.

The measuring signal generating circuit 11 determines whether positive or negative edges of the measured signal inputted are to be used for the measurement, and also starts the measurement of the input measured signal in response to the external trigger signal from the trigger delay circuit 12. In addition, the measuring signal generating circuit 11 switches two inputs thereof as the following, depending upon a measuring quantity set by a user and transmits to the first gate circuit 13 and the second gate circuit 14 subsequent thereto from corresponding two output terminals thereof.

| measuring quantity | connection |
|---|---|
| period | input 1 → first gate circuit 13 |
| | input 2 → second gate circuit 14 |
| frequency | input 1 → first gate circuit 13 |
| | input 2 → second gate circuit 14 |
| pulse width | input 1 → first gate circuit 13 |
| | input⁻1 → second gate circuit 14 |
| duty ratio | input 1 → first gate circuit 13 |
| | input⁻1 → second gate circuit 14 |
| time interval | input 1 → first gate circuit 13 |
| | input 2 → second gate circuit 14 |
| phase | input 1 → first gate circuit 13 |
| | input 2 → second gate circuit 14 |

("input⁻1" means the logical inversion of input 1)

The first and second gate circuits 13 and 14 control the transfer of edges to be measured from the measuring signal generating circuit 11 to the first and second successive period measuring circuits 17 and 18 in response to a gate on/off signal outputted from the gate on/off control circuit 15 (accordingly, it is also an internal burst on/off signal), or a burst on/off signal inputted from an external input terminal (namely, an external burst on/off signal), respectively. The gate on/off signal and the external burst on/off signal are supplied to the switching circuit 16 by which either one of them is selected and is supplied to the first and second circuits 13 and 14. The switching circuit 16 may be a mechanical switch such as a relay or a logical switch using a gate or gates, and selects either one of the two on/off signals by a command from the control part However, in case there is used a measuring system to which an external burst on/off signal is not supplied, the switching circuit 16 naturally selects the gate on/off signal.

Further, the gate on/off control circuit 15 has a function which can produce a gate on/off signal by taking the measure of a timing therewithin (self-gating function), as described later in detail. The edge signals to be measured of the measured signal from the measuring signal generating circuit 11 are supplied to the gate on/off control circuit 15 and various types of commands from the control part 40 are also supplied to the gate on/off control circuit 15. By controlling the first and second gate circuits 13 and 14 using the output signal (gate on/off signal) of the gate on/off control circuit 15, the time interval during the measurement and a pause interval are determined. These intervals are preset by a user through the control part 40 depending upon the number of occurrences and/or occurrence time of the edges of the measured signal.

When two pulse signals of input 1 and input 2 are supplied, as measured signals, to the measuring signal generating circuit 11, edge signals consisting of either one of rise edges (positive edges) or fall edges (negative edges) of the input 1 and the input 2 are continuously supplied to the first and second successive period measuring circuits 17 and 18 through the first and second gate circuits 13 and 14, respectively, and a period of occurrence of the edges of the measured signals supplied thereto are continuously measured. Whether the edge signals supplied to the successive period measuring circuits 17 and 18 are rise edges or fall edges of the measured signals is determined by the measuring signal generating circuit 11. The measured results (data) are sent to the first and second buffer memories 19 and 20 via data lines 17D1 and 17D2, respectively. These buffer memories 19 and 20 cannot store the inputted data unless a write pulse is applied to each of the buffer memories, and hence they store all of the measured data sent thereto via the data lines 17D1 and 17D2 when write pulses are applied to them via write lines 17W1 and 17W2 from the first and second successive period measuring circuits 17 and 18, respectively. The number of data stored in the buffer memories 19 and 20 are preset by a user through the manipulation part 60. The operating and analyzing part 30 subsequent thereto will calculate or compute various quantities in time/ frequency using the measured results obtained in the measuring part 10.

Figure 2:
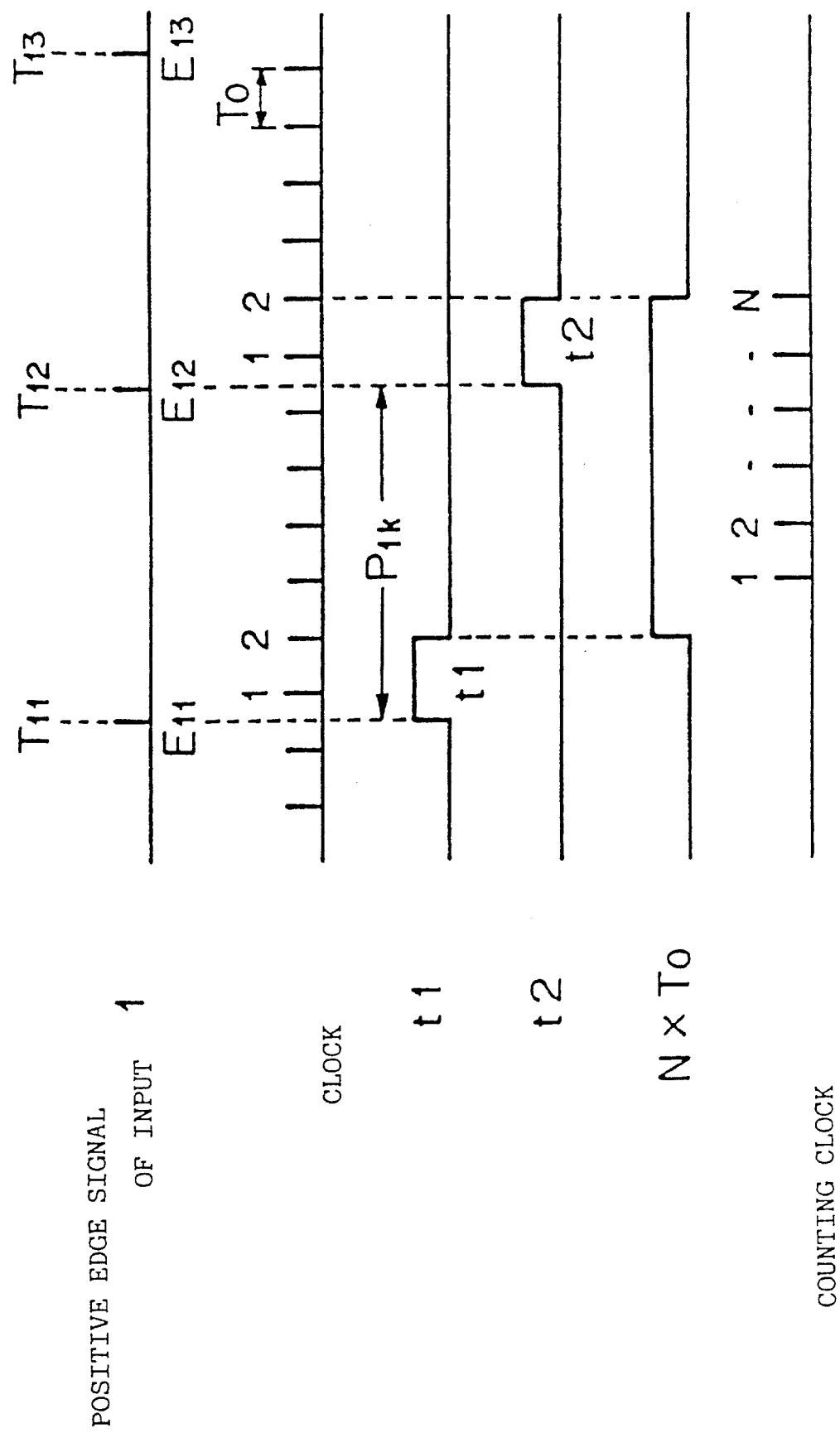
FIG. 2 shows waveforms for explaining the successive period measuring operation of a successive period measuring circuit in the jitter analyzer of FIG. 1.

The first and second successive period measuring circuits 17 and 18 may be the same construction with each other, and the measurement of the period will be performed as shown in FIG. 2 in case positive edges of the input 1 are supplied to the first successive period measuring circuit 17 as a typical example. As shown in FIG. 2, a period P1k to be measured is, for example, a time interval between a positive edge E11 of the input 1 at a time T11 and a positive edge E12 thereof at the next time T12, and this period P1k can be calculated by finding a time interval t1 from the edge E11 which is the starting edge of the period P1k to the second counting clock after the edge E11, a time interval t2 from the edge E12 which is the terminating edge of the period P1k to the second counting clock after the edge E12, and a time interval of N·T0 where N is the number of counting clocks generated during the time interval from the end of the time interval t1 to the end of the time interval t2 and T0 is the period of the clock. That is, since the equation P1k+t2= NT0+t1 is formed between the results t1, t2 and NT0, the period P1k is found by the following equation:

$$P1k = N \cdot T0 + t1 - t2$$

Here, the reason that the second counting clock after the edge E11 or E12 is selected is that if the first counting clock after the edge E11 or E12 is selected, the edge and the first clock are very close in time to each other and as a result it may be possible that the time intervals of t1 and t2 cannot be measured with a high accuracy. Therefore, it goes without saying that if the time intervals of t1 and t2 can be measured with a high accuracy, the first counting clock immediately after the edge may be selected.

The first and second successive period measuring circuits 17 and 18 output data Np1kT0 and Np2kT0 (corresponding to time intervals) and data $\Delta$Vp1k and $\Delta$Vp2k among the data calculated and obtained as stated above to the first and second buffer memories 19 and 20, respectively, where Np1k is the number of counting clocks generated during the time interval from the end of the time interval t1 to the end of the time interval t2, Np2k is also the number of counting clocks generated during the time interval from the end of the time interval t1 to the end of the time interval t2, and T0 is the period of the counting clock. The data Np1kT0 and Np2kT0 are digital data and so they are outputted from the first and second successive period measuring circuits 17 and 18 without any conversion, whereas the fraction time intervals t1 and t2 are subtracted to obtain the difference (t1–t2) (hereinafter referred to as "fraction quantity") which is converted into a voltage which is further converted into the digital values $\Delta$Vp1k and $\Delta$Vp2k by an analog-digital converter (A/D converter). The buffer memories 19 and 20 store the data Np1kT0 and Np2kT0 and the data $\Delta$Vp1k and $\Delta$Vp2k therein, respectively. Further, k in the count values Np1k and Np2k is an integer of 1 to m, and m is the number of measurements set by a user. The cumulated value of the measured results of the successive period represents the time when the data was acquired. Accordingly, the times on acquisition of the data are all measured and stored.

Figure 3:
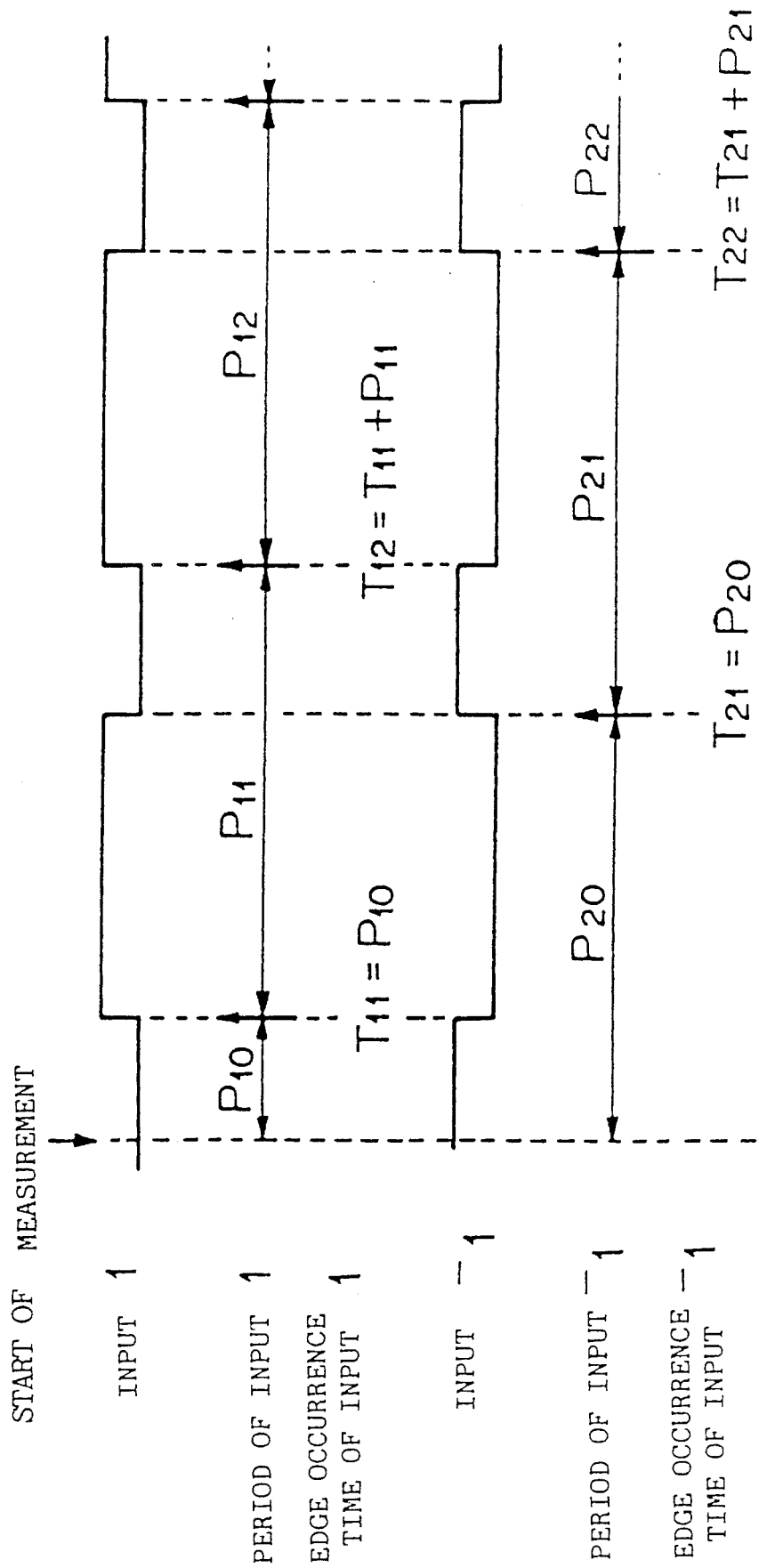
FIG. 3 is a timing chart for explaining how to accord the starting times of measurement of two successive period measuring circuits with each other in case of measuring a pulse width or a duty ratio of an input pulse in the jitter analyzer of FIG. 1.

As mentioned above, in case of measuring a pulse width or a duty ratio, an input 1 and an input –1 (a logical inversion of the input 1) are supplied to the measuring signal generating circuit 11 as the input 1 and the input 2, and hence, in case the measuring signal generating circuit 11 outputs positive edges of these two input signals as edges to be measured, after the measurement is started, positive edges of the input 1 at times T11, T12, . . . are inputted into the first successive period measuring circuit 17 and positive edges of the input –1 at times T21, T22, . . . (negative edges of the input 1) are inputted into the second successive period measuring circuit 18, as shown in FIG. 3. Since a measuring value is calculated from the difference between the acquisition times of the period data by both the circuits 17 and 18, it is necessary to accord the starting times of measurement of the first and second two successive period measuring circuits 17 and 18 with each other. Accordingly, these two successive period measuring circuits 17 and 18 measure time intervals (P10, P20) from the measurement starting time to the time of the first edge to be measured, and store them therein as the initial time offset values (P10, P20). Further, as shown in FIG. 3, if the input 1 and input –1 are concurrently inputted and the measurement starting times are set to, for example, time T11, then the positive pulse width of the input 1 comes to the initial time offset value.

As described above, the first and second buffer memories and 20 store all the period data measured by the first and second successive period measuring circuits 17 and 18 when write pulses are applied to the buffer memories 19 and 20, respectively. The number of data stored in the these buffer memories 19, 20 are preset by a user through the manipulation part 60. The data stored in the buffer memories 19, 20 are used by the operating and analyzing part 30 at the subsequent stage, in order to measure various quantities in the domain of time/frequency of the measured signal, for example, period, frequency, pulse width, duty ratio, time interval, phase or the like thereof, and also to analyze a statistical operation, a distribution of the number of occurrences (frequency), a variation for the time elapsed, and a frequency component of each of these quantities.

The operating and analyzing part 30 comprises, in the first embodiment of the present invention, first and second fraction quantity adding parts 31 and 32, a measuring quantity operating part 33, and an analysis operating part The first and second fraction quantity adding parts 31 and 32 turn the digital values ($\Delta$Vp1k, $\Delta$Vp2k) of the voltages corresponding to the times of the fraction quantities which cannot be measured out by the counting clocks into data in time domain, and add the turned data to the period data (Np1kT0, Np2kT0) which were measured out by the counting clocks thereby calculating the final period data (P1k, P2k), respectively, based on the equations of calculation mentioned above. That is:

$$P1k = Np1kT0 + \Delta Vp1k$$

$$P2k = Np2kT0 + \Delta Vp2k$$

As an example, assuming that the fraction quantity time t1–t2 is $\Delta T$ ns, Np1k and Np2k are N, $\Delta$Vp1k and $\Delta$Vp2k are $\Delta V$, the number of digital bits of the voltages corresponding to the fraction quantity times in the A/D converters of the successive period measuring circuits 17 and 18 is 12 bits, and the period T0 of the counting clock is 10 ns, and assuming that the voltages of sample and hold circuits, as described later, of the successive period measuring circuits 17 and 18 are –2048, –1024, 0, +1024, 2048 mV, and the outputs ($\Delta V$) of the A/D converters thereof are 0, 1024, 2048, 3072, 4096 counts when $\Delta T$=–20, –10, 0, +10, +20 ns, then the period P (=P1k=P2k) to be found is:

$$\begin{aligned} P &= NT0 + \Delta T \\ &= NT0 + (\Delta V - 2048)T0/1024 \\ &= T0(N + \Delta V - 2048)/1024 \end{aligned}$$

Assuming T0=1000, the above equation is as follows:

$$P=1000(N-2+\Delta V/1024)$$

Accordingly, if the A/D converters have an accuracy of 1 bit, the measurement up to 10 ps can be performed. Further, the relation of 10 ns=1024 mV can be formed by appropriately setting C, R or a voltage of the integrator of each of the fraction time measuring circuits.

The measuring quantity operating part 33 calculates various quantities in the domain of time/frequency of the measured signal, in this embodiment, frequency Fnk, pulse width Wk, duty ratio Dk, time interval Tk, and phase $\phi k$, using the final period data (Pnk) obtained in the fraction quantity adding parts 31, 32 as the case may be. Where n denotes an input channel number (a channel supplied with the input 1 is the input channel 1 and a channel supplied with the input 2 or input −1 is the input channel 2), and k=1 to m and m is the number of measurements set by a user.

Now, a method of calculating these various quantities in time/frequency domain will be described.

Figure 4:
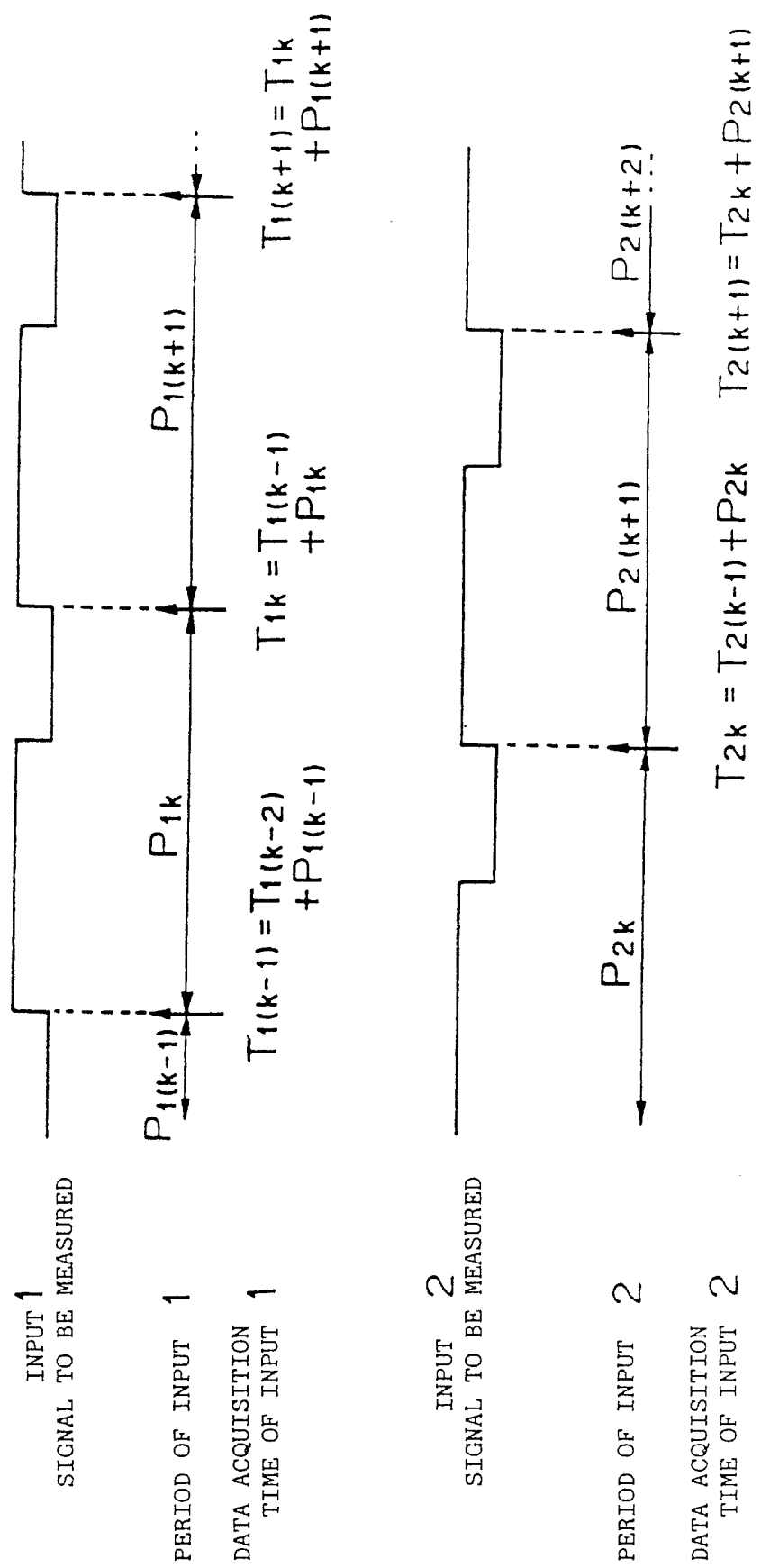
FIG. 4 is a timing chart for explaining the operation of the jitter analyzer of FIG. 1 in case of measuring a period and a pulse width of an input pulse.

The period Pnk when the measured signals (input 1 and input 2) in two systems are supplied to the input channel 1 and the input channel 2 of the measuring signal generating circuit 11, are calculated by the first and second fraction quantity adding parts 31 and 32 as P1k for the period of the measured signal (input 1) to the input channel 1 and as P2k for the period of the measured signal (input 2) to the input channel 2 based on the above-mentioned equations of calculation. These periods are shown in FIG. 4. As apparent from FIG. 4, the periods of the measured signals in two systems supplied to both the input channels can be measured concurrently.

Since the frequency Fnk of each of the measured signals is 1/period(Pnk), by using the periods P1k and P2k of the input 1 and the input 2 calculated by the first and second fraction quantity adding parts 31 and 32, the frequency F1k of the input 1 can be calculated as follows:

$$F1k=1/P1k$$

also, the frequency F2k of the input 2 can be calculated as follows:

$$F2k=1/P2k$$

Accordingly, as to the frequencies of the measured signals the concurrent measurements of them in two systems supplied to both the input channels can be performed.

On the other hand, the pulse width Wk of the measured signal can be calculated by supplying the inverted version of the measured signal applied to the input channel 1, that is, the input −1 which is the inverted signal of the input 1, to the input channel 2 (of course, it is possible that the measured signal is supplied to the input channel 2 and the inverted signal the measured signal is supplied to the input channel 1). Thus, the concurrent measurements of the pulse widths of the measured signals in two systems are impossible.

Figure 5:
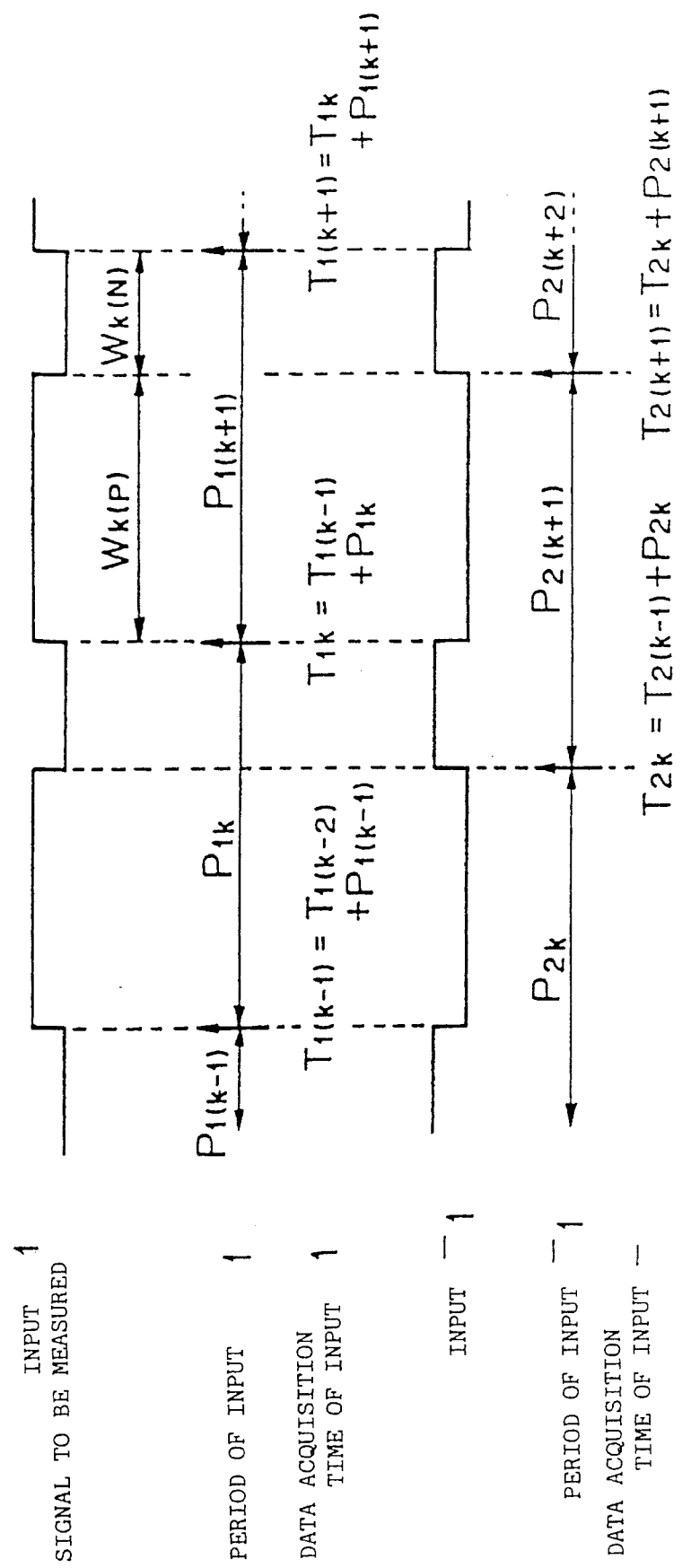
FIG. 5 is a timing chart for explaining the operation of the jitter analyzer of FIG. 1 in case of measuring a pulse width and a duty ratio of an input pulse.

Assuming that a measured signal (input 1) on the input channel 1 is a pulse signal as shown in FIG. 5, a signal on the input channel 2 is the inverted version of the input 1, and in case both the pulse signals are inputted concurrently, both waveforms of these pulse signals are symmetrical as shown in FIG. 5 and so a positive edge of the input 1 and a negative edge of the input −1 appear at the same time. Therefore, the positive pulse width Wk(P) of the input 1 corresponds to a time interval from a positive edge of the input 1 at each time T1(k−1), T1k, . . . to a negative edge of the input 1 immediately following this positive edge, accordingly, a positive edge of the input −1 at each time T2k, T2(k+1), . . . , and the negative pulse width Wk(N) of the input 1 corresponds to a time interval from a positive edge of the input −1 at each time T2k, T2(k+1), . . . to a negative edge of the input −1 immediately following this positive edge, accordingly, a positive edge of the input 1 at each time T1(k−1), T1k, . . . Thus, the positive pulse width Wk(P) of the measured signal on the input channel 1 can be calculated by the following equation by way of a typical example:

$$Wk(P)=T2(k+1)-T1k$$

and the negative pulse width Wk(N) thereof can be calculated by the following equation by way of a typical example:

$$Wk(N)=T1(k+1)-T2(k+1)$$

Further, in case the input time of the input −1 into the input channel 2 is late relative to that of the input 1, the initial offset values stored in the first and second successive period measuring circuits 17 and 18 are used to accord the input times of the input 1 and the input −1 with each other.

The duty ratio Dk of the measured signal on the input channel 1 can be calculated by the following equation:

$$Dk=Wk(P) \text{ (positive pulse width)}/P1k(\text{period})\times100(\%)$$

Therefore, similar to the pulse width, duty ratio Dk can be obtained by calculating the positive pulse width Wk(P) of the measured signal supplied to the input channel 1 by supplying the inverted version of the measured signal on the input channel 1 to the input channel 2, dividing the calculated positive pulse width Wk(P) by the period P1k thereof, and multiplying the result of the division by 100. The concurrent measurements of the duty ratio of the measured signals in two systems are likewise impossible.

Next, a case of measuring a time interval between a measured signal supplied to the input channel 1 and a measured signal supplied to the input channel 2 will be described. In the specification of the present application the difference between specified edges of two signals having the same rate is referred to as "time interval".

The time interval Tk can be calculated, as is apparent from FIG. 4 mentioned above, by subtracting the time of a positive edge T2k (typical example) of the input 2 from the time of a positive edge T1k (typical example) of the input 1. That is:

$$Tk=T1k-T2k$$

since $T1K=t1(K-1)+P1k$ and $T2k=T2(k-1)+P2k$, the time interval Tk can be calculated by finding the periods P1k and P2k and the occurrence times T1k and T2k of positive edges of the input 1 and the input 2.

Similarly, the phase $\phi k$ between the measured signal on the input channel 1 and the measured signal on the input channel 2 is obtained by dividing the time interval Tk by the period of the input 1 and multiplying the result of the division by 360°, and so it can be calculated by the following equation by way of a typical example with reference to FIG. 4:

$$\phi k=\{(T1k-T2k)/P1(k+1)\}\times360°$$

The various quantities in time/frequency domain arithmetically operated by the measuring quantity operating part 33 as described above are analyzed in the analysis operating part 34 as the case may be. Main analysis methods are statistical operation, distribution of the number of occurrences, variation in time (variation relative to a time elapsed), data mask, masked data interpolation, and frequency component analysis as shown in the block of FIG. 1. These analysis methods will be described briefly.

The analysis method of statistical operation is a method in which an analysis is performed by using mean, variance, sample variance, standard deviation, sample standard deviation, maximum value, minimum value, Allan variance, root of Allan variance, normalization, ±offset, and multiplication and division of constant, of the calculated data.

Figure 6:
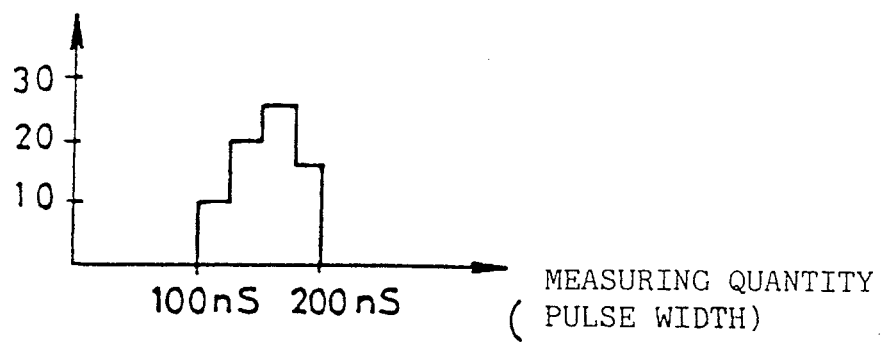
FIG. 6 is a graph showing an example of an analysis of data calculated by a display of distribution of the number of occurrences.

The analysis method of distribution of the number of occurrences is a method in which an analysis is performed by putting a measuring quantity, for example, a pulse width Wk, on the abscissa and putting the number of occurrences (frequency) of the pulse width Wk on the ordinate, and displaying a distribution of the number of occurrences, as shown in FIG. 6.

Figure 7:
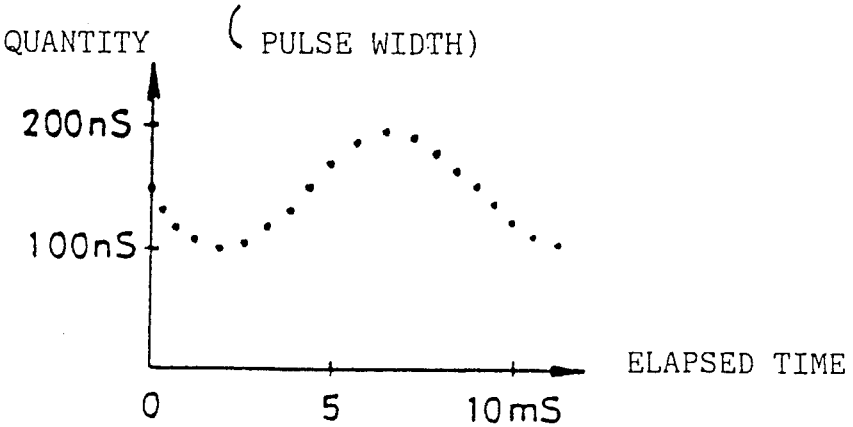
FIG. 7 is a graph showing an example of an analysis of data calculated by a display of variations in the time elapsed.

The analysis method of variation in time is a method in which an analysis is performed by putting a time elapsed tk on the abscissa and putting a measuring quantity, for example, a pulse width Wk, on the ordinate, and displaying a variation of the pulse width Wk relative to the time, as shown in FIG. 7.

The data mask function serves, in case of performing an analysis of statistical operation or distribution of the number of occurrences and an analysis of frequency component by fast Fourier transform as to various quantities in time/frequency domain of a discontinuous burst signal, to prevent data beyond a value set by a user among data generated during the off-intervals of the burst signal from being reckoned in as the measuring quantity. More particularly, the data mask function serves to automatically mask unnecessary data generated during the off-intervals of the burst signal by comparing the data with a reference value. Alternatively, a user may retrieve the list of the measuring quantity after end of the measurement and mask any of the data in the list.

Figure 8:
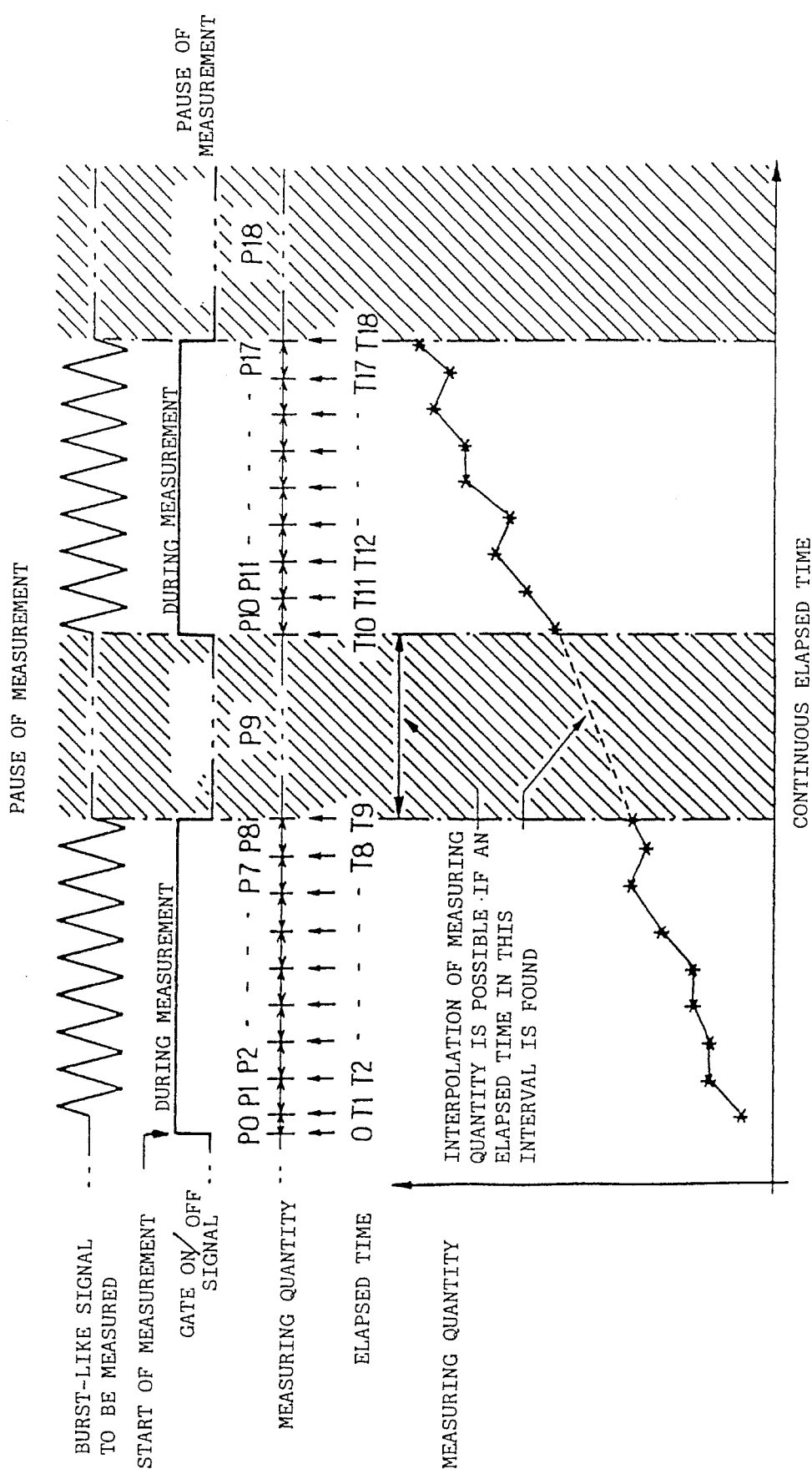
FIG. 8 is a timing chart for explaining the manner that the interpolation of data is done on the basis of the context of data removed.

The masked data interpolation function serves to interpolate the measuring quantity by using data and time information before and after a masked data. In case of performing an analysis of frequency component by fast Fourier transform as to various quantities in time/frequency domain of a discontinuous burst signal, data generated during the off-intervals of the burst signal are needed to be masked by the above-mentioned data mask function, but the continuity of the data measured is lost by such data mask function. For this end, the masked data interpolation function is used to interpolate the measuring quantity by using data and time information before and after each of the masked data. That is, as shown in FIG. 8, if the time elapsed in the pause interval of the measurement from time T9 to time T10 which is shown by oblique lines is found, the interpolation of the measuring quantity can be done as shown by the dotted line in FIG. 8. The pause interval of the measurement from time T9 to time T10 corresponds to the off-interval of the burst signal. This masked data interpolation function is applied to other pause intervals of the measurement in the same manner as mentioned above.

The analysis method of frequency component is a method in which an analysis is performed by fast. Fourier transforming the variation relative to the elapsed time as to the measured various quantities in time/frequency domain by the FFT part (fast Fourier transform part) and deriving a frequency spectrum of the variation therefrom. The measuring quantity data obtained from the present analyzer are not data which have been measured at a regular time intervals, and so they are converted into the measuring quantity data which would have been obtained when measured at regular time intervals in the interpolation part using a interpolation method based on the measuring quantity data and the acquisition time data thereof.

Figure 9:
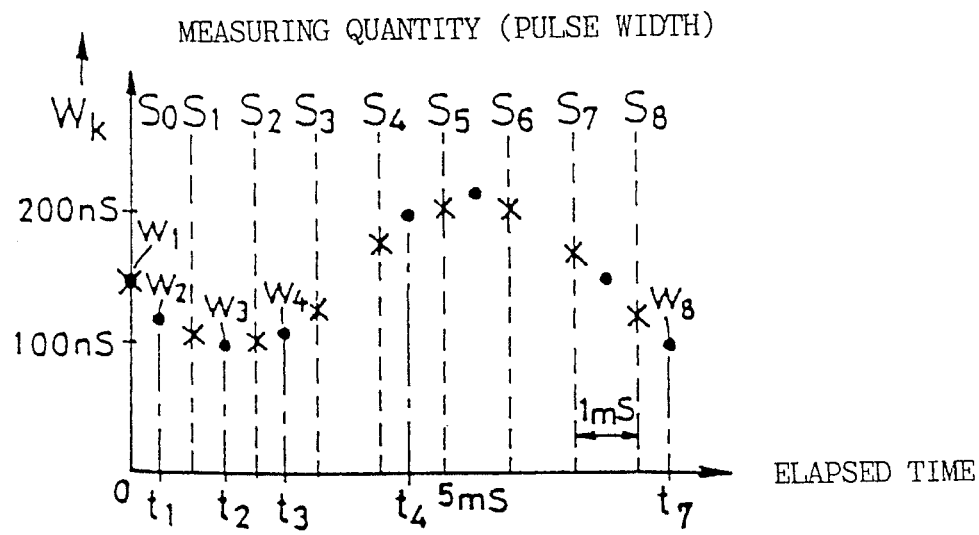
FIG. 9A is a graph showing a relationship between a pulse width and the time elapsed.
FIG. 9B is an illustration for explaining a linear interpolation.
FIG. 9C is a graph showing an example of the frequency spectrum of a pulse width jitter.

One example of the interpolation methods used in the interpolation part will be shown. Assuming that each of the measured period data obtained in the first and second fraction quantity adding part 31 and 32 of the operating and analyzing part 30 is $P_1, P_2, P_3, \ldots$, these period data are added with their preceding measured values for each measuring cycle, and the added values thereof are stored as $P_1=t_1$, $P_1+P_2=t_2$, $P_1+P_2+P_3=t_3$, ... in an elapsed time memory (not shown). These times $t_1, t_2, t_3, \ldots$ are representative of elapsed times from the start of the measurement, and it is shown that at time $0$ the measured value $W_1$ of the pulse width has been obtained, at time $t_1$ the measured value $W_2$ of the pulse width has been obtained, and at time $t_2$ the measured value $W_3$ of the pulse width has been obtained. If the lapse of time in the variations of the pulse width Wk is shown based on these values, it is, for example, as shown in FIG. 9A wherein the measured values Wk have been obtained at irregular time intervals.

The pulse width data $W_{sk}$ which can be regarded as having been obtained by measuring pulse widths at regular time intervals are calculated in the interpolation part from the measured pulse width data Wk based on the measured period data Pk. For example, in FIG. 9A, the pulse width data which are regarded as having been obtained by measuring pulse widths at sampling points $S_0, S_1, S_2, \ldots$ at regular time intervals starting at time $0$ are found by use of a linear interpolation method which can be easiest to utilize. The eight pulse width data Wk measured are represented at the coordinates (tk, Wk) as $I$ $(0, W_1)$, $2$ $(t_1, W_2)$, $3$ $(t_2, W_3)$, $4$ $(t_3, W_4)$, $\ldots$, $8$ $(t_7, W_8)$, respectively. It is a matter of course that the pulse width at the sampling point $S_0$ is $W_1$. The sampling point $S_1$ is found as follows. That is, assuming that a straight line 44 passing through three points $(t_1, W_2)$, $(S_1, W_{s1})$, and $(t_2, W_3)$ shown in FIG. 9B is $W=At+B$, $$A=(W_2-W_3)/(t_1-t_2)$$

$$B=(t_1W_3-t_2W_2)/(t_1-t_2)$$

Substitution of A, B and $S_1$ into the equation of the straight line gives the following equation:

$$W_{s1}=S_1(W_2W_3)/(t_1-t_2)+(t_1W_3t_2W_2)/(t_1-t_2)$$

Thus, the pulse width $W_{s1}$, at the sampling point $S_1$ is found. Similarly, the pulse widths $W_{s2}, W_{s3}, W_{s4}, \ldots$ can be found.

The pulse width data $W_{sk}$ (data indicated by a mark X in FIG. 9A) at regular time intervals thus obtained are subjected to the fast Fourier transform in the FFT part. By displaying the frequency spectrum of the transformed results on a display device (not shown) of the display part 50, a display shown in FIG. 9C, for example, can be obtained. The frequency components of the fluctuation (jitter) of the pulse widths Wk can be known from such display. In this case, the values of the pulse widths Wk or the mean values thereof can be also displayed at the same time or the above frequency spectrum can be also displayed as a ratio thereof relative to Wk. To increase the precision of the pulse width data $W_{sk}$ which can be regarded as having been obtained at regular time intervals, a spline method or other interpolation methods can be used.

Likewise, as to the measured period data Pk, the frequency components of the jitter of the period data can be known by calculating the period data Psk which can be regarded as having been obtained by measuring at regular time intervals and effecting the fast Fourier transform of the period data Psk, and further, the percentage of the jitter relative to the period can be also found.

Next, the operation of the first embodiment of the jitter analyzer with a time window trigger function as shown in FIG. 1 will be described. The operation of this jitter analyzer in this case is the same as that of the jitter analyzer having no time window trigger function mentioned above, except that the measured data from the first and second successive period measuring circuits 17 and 18 are supplied to the first and second buffer memories 19 and 20 and the trigger data acquiring circuit 22, respectively, and the measured data is monitored by the trigger data acquiring circuit 22, and when the monitored data accords with a condition of a reference data set by a user, a time window trigger signal is generated from the trigger data acquiring circuit 22 whereby write pulses are applied to the first and second buffer memories 19 and 20, and after the application of the write pulses the measured data are stored in the first and second buffer memories 19 and 20. Therefore, the operation of the jitter analyzer will be described hereinafter by laying emphasis on the time window trigger function.

The measured data on the data lines 17D1 and 17D2 and the write pulses on the write lines 17W1 and 17W2 outputted from the first and second successive period measuring circuits 17 and 18 are also supplied to the trigger data acquiring circuit 22 wherein whether each of the measured data satisfies a condition of the trigger data with respect to a reference value or values set by a user or not is checked. Assuming that the measured data is Pn and the reference values set by a user are Pr, Pr1, Pr2, the conditions such as the following are generally considered to be required as the trigger data condition:

accord: Pr=Pn disaccord: Pr≠Pn large: Pr<Pn small: Pr>Pn within the limits: Pr1<Pn<Pr2 beyond the limits: Pn<Pr1, Pn>Pr2

To implement these conditions, a magnitude comparator which is one of hardwares (a comparator which compares the magnitudes of data values with each other) is used to compare the reference value with data value, and a time window trigger signal is generated depending upon the result of the comparison. When this time window trigger signal is once generated, it is never generated until a sequence of the measuring operations ends (until the number of the measurements set by a user ends or the measuring operation is caused to end manually by the user). The trigger data acquiring circuit 22 latches the time window trigger signal thereby turning the time window trigger signal to a continuous analog signal, and when the write of the measured data is started, the trigger data acquiring circuit 22 inputs the continuous analog signal into the third and fourth gate circuits 23 and 24 as a data acquisition start signal to turn on the third and fourth gate circuits 23 and 24 so that the write pulses from the successive period measuring circuits 17 and 18 are inputted into the buffer memories 19 and 20 and so the measured data (the period data) from the successive period measuring circuits 17 and 18 are all stored in the buffer memories 19 and 20. When the write of the measured data is caused to end, the trigger data acquiring circuit 22 inputs the continuous analog signal into the third and fourth gate circuits 23 and 24 as a data acquisition end signal to turn off the third and fourth gate circuits 23 and 24 so that the write pulses from the successive period measuring circuits 17 and 18 are inhibited from being inputted into the buffer memories 19 and 20 and so the measured data from the successive period measuring circuits 17 and 18 are not stored in the buffer memories 19 and 20.

The number of data stored in the buffer memories 19 and 20 is preset by a user through the manipulation part 60. The data stored in the buffer memories 19 and 20 are used by the operating and analyzing part 30 at the subsequent stage as described above, in order to measure various quantities in time/frequency domain of the measured signal, for example, period, frequency, pulse width, duty ratio, time interval, phase or the like thereof, and also to analyze a statistical operation, a distribution of the number of occurrences, a variation relative to the elapsed time, and frequency components of each of these quantities.

Next, the respective parts of the analyzer of the present embodiment will be described in detail. It is desired that the measuring part 10 can continuously acquire data without omitting them possibly and the time when the data was acquired (the time elapsed) can be accurately known. At first, specific examples of the measuring signal generating circuit 11, the first, second, third and fourth gate circuits 13, 14, 23 and 24, and the first switching circuit 16 are described with reference to FIG. 10, respectively.

The measuring signal generating circuit 11 comprises first, second, third and fourth, four D-type flip-flops F1, F2, F3 and F4, an inverter INV, two OR gates G2 and G3, an exclusive-OR gate G4, an AND gate G5, a delay circuit DL, and a change-over switch SW1 for switching between an input 1 and an input 2 in response to a switch (SW) on/off control command, and a first input terminal 11a supplied with the input 1 is connected directly to the trigger terminal T of the first D-type flip-flop F1 and connected to one of the fixed contacts of the switch SW1 through the inverter INV, respectively. The movable contact of the switch SW1 is connected to the trigger terminal T of the second D-type flip-flop F2 and a second input terminal 11b supplied with the input 2 is connected to the other fixed contact of the switch SW1.

The trigger input signal from the trigger delay circuit 12 is supplied to the trigger terminal T of the fourth D-type flip-flop F4 the data terminal D of which has a high level signal H applied thereto, and the high level signal H is supplied from the output terminal Q of the flip-flop F4 to the trigger terminal of the first D-type flip-flop F1. The output terminal Q of the D-type flip-flop F1 is connected to the first gate circuit 13 (AND gate G6), the gate on/off control circuit 15 and the trigger terminal T of the second D-type flip-flop F2, respectively, and the high level signal H applied to the data terminal of the flip-flop F1 is outputted from the output terminal Q thereof.

The high level signal H is also applied to the data terminal of the second D-type flip-flop F2, and the output terminal Q of the flip-flop F2 is connected directly to the data terminal D of the third D-type flip-flop F3 and one input of the AND gate G5 and also connected to one input of the exclusive-OR gate G4 through the delay circuit DL. The other input of the exclusive-OR gate G4 has the output Q (logical inversion of Q) of the third D-type flip-flop F3 connected thereto, and the output of the exclusive-OR gate G4 is connected to the other input of the AND gate G5. The output of the AND gate G5 is connected to the second gate circuit 14 (AND gate G7) and the gate on/off control circuit 15, respectively. These delay circuit DL, the exclusive-OR gate G4 and the AND gate G5 serve as a pulse shaping function part for shaping a pulse waveform.

The first and second gate circuits 13 and 14 are constructed by simple AND gates G6 and G7, and the other inputs of the AND gates G6 and G7 are connected to the movable contact of the change-over switch which forms the switching circuit 16, respectively. A burst on/off signal inputted from the outside is supplied to one of the fixed contacts of the switch, and a gate on/off signal created within the inside from the gate on/off control circuit 15 is supplied to the other fixed contact of the switch. This change-over switch controls whether the edge signals to be measured of the input 1 and input 2 outputted from the measuring signal generating circuit 11 are inputted into the first and second successive period measuring circuits 17 and 18 at the subsequent stage or not inputted.

Similarly, the third and fourth gate circuits 23 and 24 are constructed by simple AND gates G8 and G9, and the write pulses are applied from the first and second successive period measuring circuits 17 and 18 to one inputs of the AND gates G8 and G9, respectively, and the time window trigger signal from the trigger data acquiring circuit 22 is supplied as a data acquisition start signal to the other inputs of the AND gates G8 and G9, respectively. The outputs of these gate circuits 23 and 24 are connected to the buffer memories 19 and 20, and when the gate circuits 23 and 24 turns on by application of the time window trigger signal from the trigger data acquiring circuit 22 thereto, the write pulses are inputted into the buffer memories 19 and 20 and so the measured data are stored therein. In case the time window trigger function is not used, of course, the trigger data acquiring circuit 22 and the third and fourth gate circuits 23 and 24 are unnecessary and as a result the write pulses from the first and second successive period measuring circuits 17 and 18 are directly supplied to the first and second buffer memories 19 and 20. Alternatively, the same operation as immediately stated above is performed if the third and fourth gate circuits 23 and 24 are always open (in conductive states).

Figure 10:
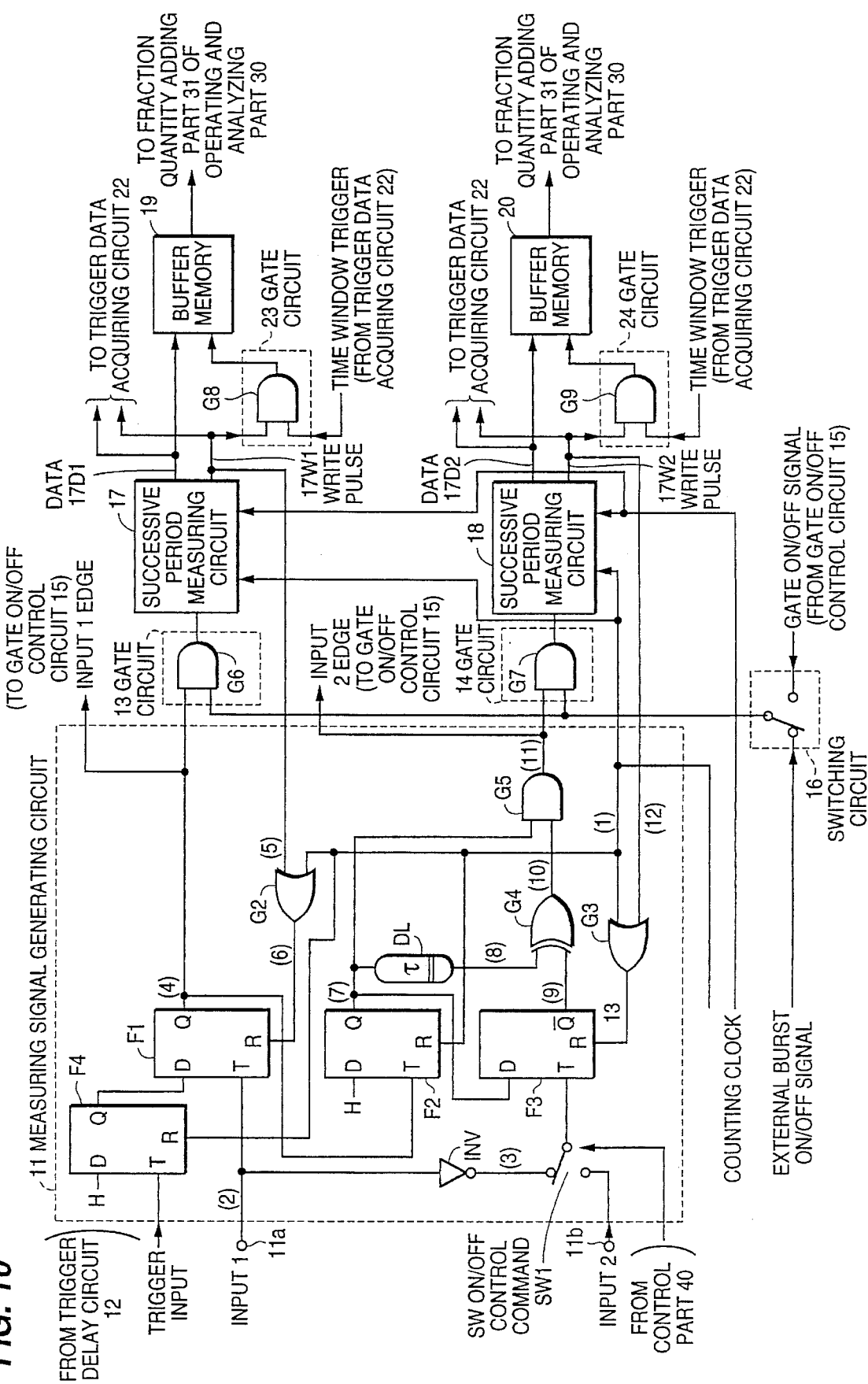
FIG. 10 is a block diagram schematically showing a measuring signal generating circuit, gate circuits, and a switching circuit used in the jitter analyzer of FIG. 1.
Figure 12:
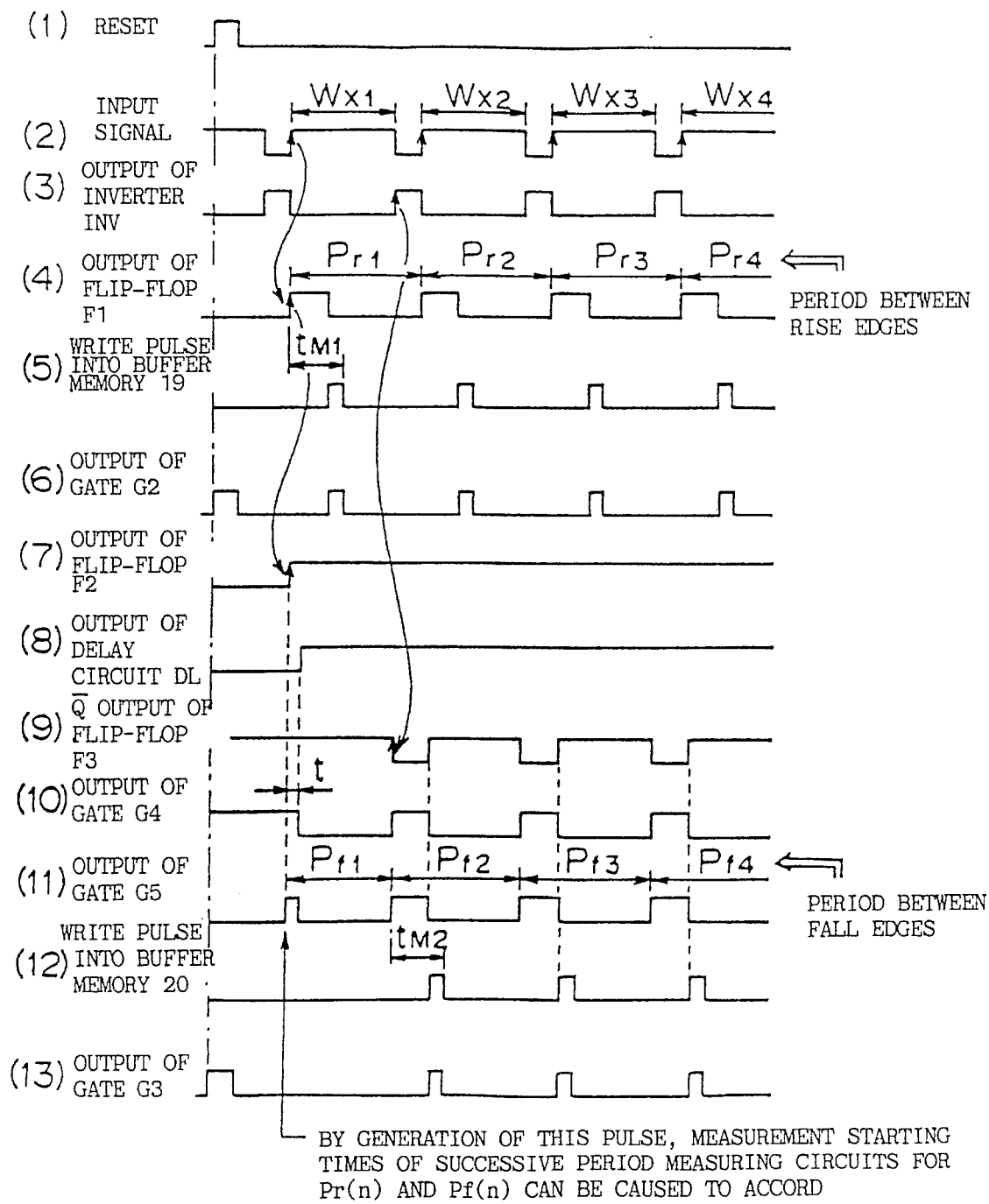
FIG. 12 is a timing chart showing signal waveforms at respective portions of the measuring signal generating circuit of FIG. 10.

With the construction as mentioned above, it is obvious that, when the trigger signal is inputted from the trigger delay circuit 12 into the trigger terminal T of the fourth D-type flip-flop F4 in the measuring signal generating circuit 11, the measurement operation is started, and the change-over switch operates, in response to a command inputted from the control part 40 depending upon the measuring quantity, to determine whether the second input terminal 11b or the output of the inverter INV is connected to the input channel 2, and the input 1 and input 2 or input⁻1 are supplied to the measuring signal generating circuit 11 whereby the edges to be measured thereof are continuously generated, and the edges generated are supplied to the first and second gate circuits 13 and 14 and the gate on/off control circuit 15, and hence the waveforms at respective portions indicated by the indicia (1) through (13) in FIG. 10 are shown in FIG. 12 and the explanation of the operation thereof is omitted. Further, the waveforms shown in FIG. 12 are ones in case a positive pulse signal as shown is inputted as the input 1, and the movable contact of the change-over switch SW1 is connected to the input 1 side as shown in FIG. 10 so that the input⁻1 inverted by the inverter INV is inputted as the input 2 to the trigger terminal T of the third D-type flip-flop F3. Also, the trigger pulse inputted into the trigger terminal T of the fourth D-type flip-flop F4 after delayed by a predetermined time interval in the trigger delay circuit 12, in order to start the measurement operation, is omitted from FIG. 12 since there is no need to particularly manifest.

Some explanation will be added as to FIG. 12. The second and fourth D-type flip-flops F2 and F4 are reset directly by the reset pulse (1), and the first D-type flip-flop F1 is reset through the OR gate G2 and the third D-type flip-flop F3 is reset through the OR gate G3 by the reset pulse (1), respectively, and simultaneously therewith the first and second successive period measuring circuits 17 and 18 are reset by the reset pulse (1). Also, the output Q of the first D-type flip-flop F1 is inverted by the rise edge of the input 1 so that the first D-type flip-flop F1 operates. In this respect, the first successive period measuring circuit 17 is constituted that after a predetermined time period has elapsed from the time that the output Q of the first D-type flip-flop F1 was inverted, the first successive period measuring circuit 17 generates the write pulse (5) and when the third gate circuit 23 is turned on, the measured data (periods Pr1, Pr2, . . . between the rise edges) are written into the buffer memory 19. This is for the sake of allowing for the time interval which is deemed to be needed by the first successive period measuring circuit 17 for dealing with in the inside thereof. The time interval tM1 in FIG. 12 is this time interval (including the generation of the write pulse (5)) which is deemed to be needed by the first successive period measuring circuit 17 for dealing with in the inside thereof.

The second successive period measuring circuit 18 is similarly constituted that the output⁻Q of the third D-type flip-flop F3 is inverted by the rise edge of the input⁻1 (3) from the inverter INV, which rise edge is generated at the same time that the fall edge at the trailing edge of the pulse width Wx1 of the input 1 is generated, and after a predetermined time period has elapsed from the time that the output⁻Q of the third D-type flip-flop F3 was inverted, the second successive period measuring circuit 18 generates the write pulse (12) and when the fourth gate circuit 24 is turned on, the measured data (periods Pf1, Pf2, . . . between the fall edges) are written into the buffer memory 20. The time interval tM2 in FIG. 12 is the time interval (including the generation of the write pulse (12)) which is deemed to be needed by the second successive period measuring circuit 18 for dealing with in the inside thereof.

Figure 13:
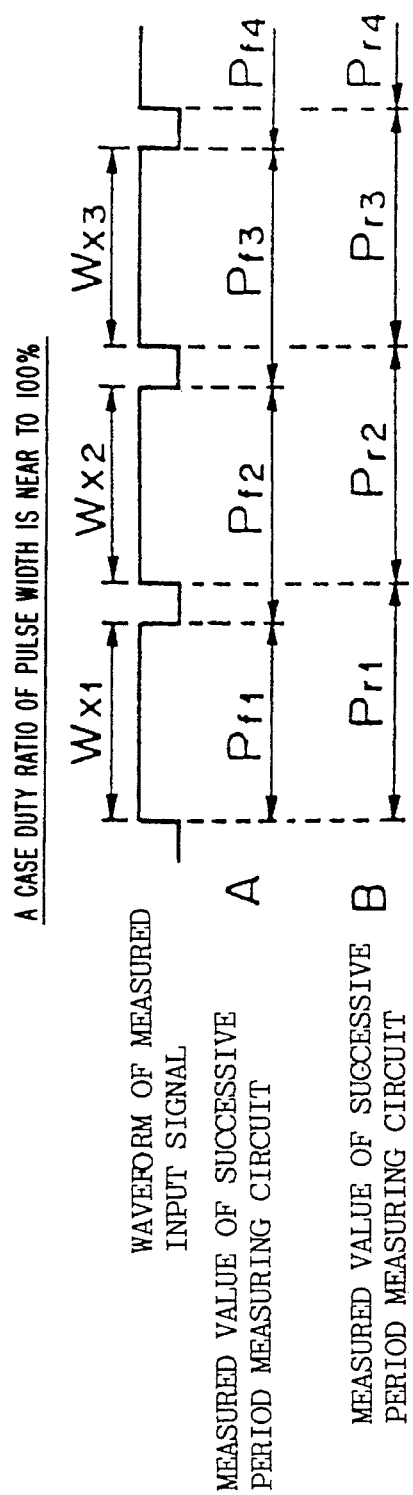
FIG. 13(a) is an illustration showing an input signal waveform and measured values in the successive period measuring circuit in case the duty ratio of the input pulse is approximately 100%.
FIG. 13(b) is a table showing a relationship between measured values and the contents stored in buffer memories.

The first and third D-type flip-flops F1 and F3 are reset by the generation of the write pulses (5) and (12) through the OR gates G2 and G3, whereas the second D-type flip-flop F2 retains the high level at its output Q as it is because no reset pulse is applied thereto. In this respect, since the output Q of the second D-type flip-flop F2 is supplied to one input of the exclusive-OR gate G4 after delayed by a time interval t in the delay circuit D1, a pulse of the pulse duration t (see waveform (11)) is first generated from the AND gate G5. On the generation of this pulse it is possible to accord the measurement starting times of the first and second successive period measuring circuits 17 and 18 with each other. Also, among the periods between the fall edges Pf1, Pf2, . . . outputted from the AND gate G5, the first period Pf1 is equal to the pulse width Wx1 of the input 1. The contents of data (in case the duty ratio is near to 100%) written into the buffer memories 19 and 20 in such manner are shown in FIG. 13. In FIG. 13, (a) shows the relation between the measured values and the pulse signal of the input 1, and (b) shows the contents of the buffer memories 19 and 20. The equation of calculating or computing the pulse width in this case is as follows:

$$\text{pulse width } Wxn = Wx(n-1) + Pfn + Pr(n-1)$$

Figure 11:
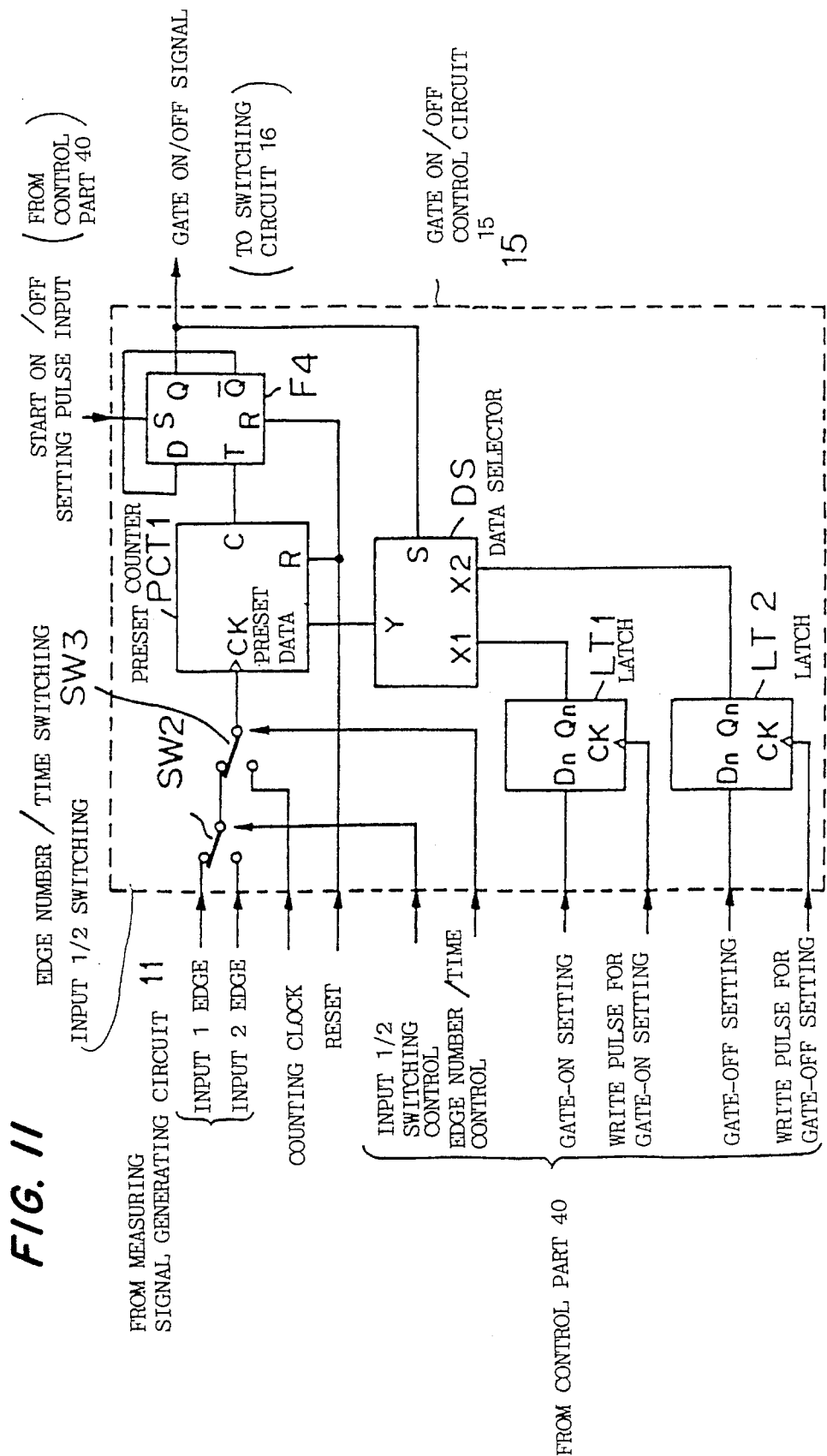
FIG. 11 is a block diagram schematically showing a gate on/off control circuit used in the jitter analyzer of FIG. 1.

The gate on/off control circuit 15 one specific example of which is shown in FIG. 11 comprises a change-over switch SW2 for switching between the input 1 and the input 2 or input⁻1, a change-over switch SW3 for switching between the number of edges and time, a preset counter PCT1, a D-type flip-flop F5, first and second latches LT1 and LT2, and a data selector DS. The gate on/off control circuit 15 serves to count by the preset counter PCT1 the edge signal to be measured of the input 1, the input 2 or the input⁻1 which is a signal to be measured, or the counting clock produced by the internal reference frequency, and determine on/off-time intervals of the gate on/off signal based on the number of edges of the signal to be measured or time set by a user.

The edge signal to be measured of the input 1 from the measuring signal generating circuit 11 is supplied to one of the fixed contacts of the change-over switch SW2 to the other fixed contact of which is supplied the edge signal to be measured of the input 2 or the input⁻1. The change-over switch SW2 has a movable contact which is switched by an input 1/2 switching control command from the control part 40, and selects either one of the edge signals to be measured by the switching of the movable contact to supply the selected one to one of the fixed contacts of the change-over switch SW3 for switching the number of edges and time. The movable contact of the change-over switch SW3 is switched by an edge number/time control command from the control part 40, and the switch SW3 selects either one of the edge signal supplied to one fixed contact and the counting clock produced by the internal reference frequency supplied to the other fixed contact to supply the selected one to the clock terminal CK of the preset counter PCT1.

Also, a gate-on setting command for determining the on-time interval of the first and second gate circuits 13 and 14 from the control part 40 is sent to the first latch LT1, and a gate-off setting command for determining the off-time interval of these gate circuits 13 and 14 is sent to the second latch LT2 so that data for the on-time interval and data for the off-time interval are separately latched thereinto. The output signals from the latches LT1, LT2 are supplied to the input terminals X1, X2 of the data selector DS. The data selector DS alternately provides data supplied to the input terminals X1, X2 to the preset data input terminal of the preset counter PCT1 by the output signal generated on the output terminal Q of the D-type flip-flop F5 each time a carry signal is generated from the carry terminal C of the preset counter PCT1. The timing of occurrence of the carry signal from the preset counter PCT1 is controlled in response to the preset data, and the carry signal is inputted into the trigger terminal T of the D-type flip-flop F5 as a clock therefor to create the gate on/off signal. This D-type flip-flop F5 is arranged in circuit so as to operate in a toggle switch manner. In order to set the initial state of the gate on/off signal to s desired state of either on or off, s user can input previously s start on/off setting pulse from the control part 40 into the preset input terminal S of the D-type flip-flop F5 to set it to the desired state that the user wants before the start of the measurement.

Figure 14:
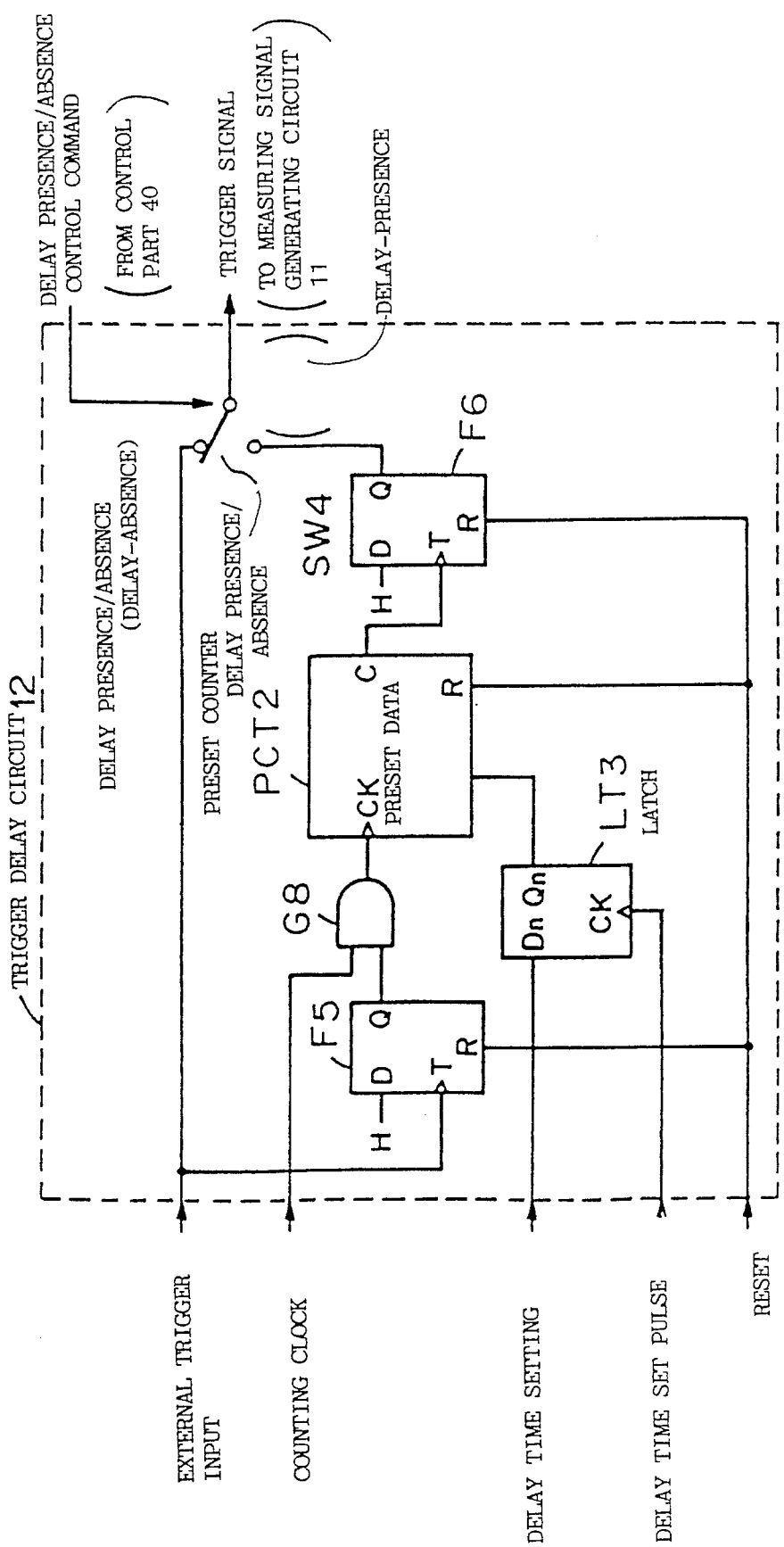
FIG. 14 is a block diagram schematically showing a trigger delay circuit used in the jitter analyzer of FIG. 1.

A specific example of the trigger delay circuit 12 is shown in FIG. 14. The trigger delay circuit 12 comprises two D-type flip-flops F6 and F7 to respective data input terminals D of which is respectively supplied a high level signal H, an AND gate G8, a preset counter PCT2, a latch LT3, and a delay presence/absence change-over switch SW4 for switching between presence of delay and absence of delay. The trigger delay circuit 12 is so arranged that when a trigger signal is inputted thereinto from the outside, the trigger signal is sent to the measuring signal generating circuit 11 after a time interval set by a user has elapsed from the time that the external trigger signal was inputted. The timing of the lapse of time is taken by inputting the counting clock created by the internal reference frequency into the preset counter PCT2 and utilizing a carry signal generated from the carry terminal C of the preset counter PCT2.

The delay time setting command for determining the delay time for the trigger delay circuit 12 is sent from the control part 40 to the latch LT3 which latches the delay time setting command thereinto. The latched delay time setting command is previously inputted into the preset counter PCT2 through its preset data input terminal by a delay time set pulse before the start of the measurement. The external trigger input is supplied to the trigger terminal T of the D-type flip-flop F6 and a fixed contact for delay absence of the delay presence/absence changeover switch SW4, respectively, and the output Q of the D-type flip-flop F6 is supplied to one input of the AND gate G8. The other input of the AND gate G8 has the counting clock applied thereto, and the output thereof is supplied to the clock terminal of the preset counter PCT2.

Figure 15:
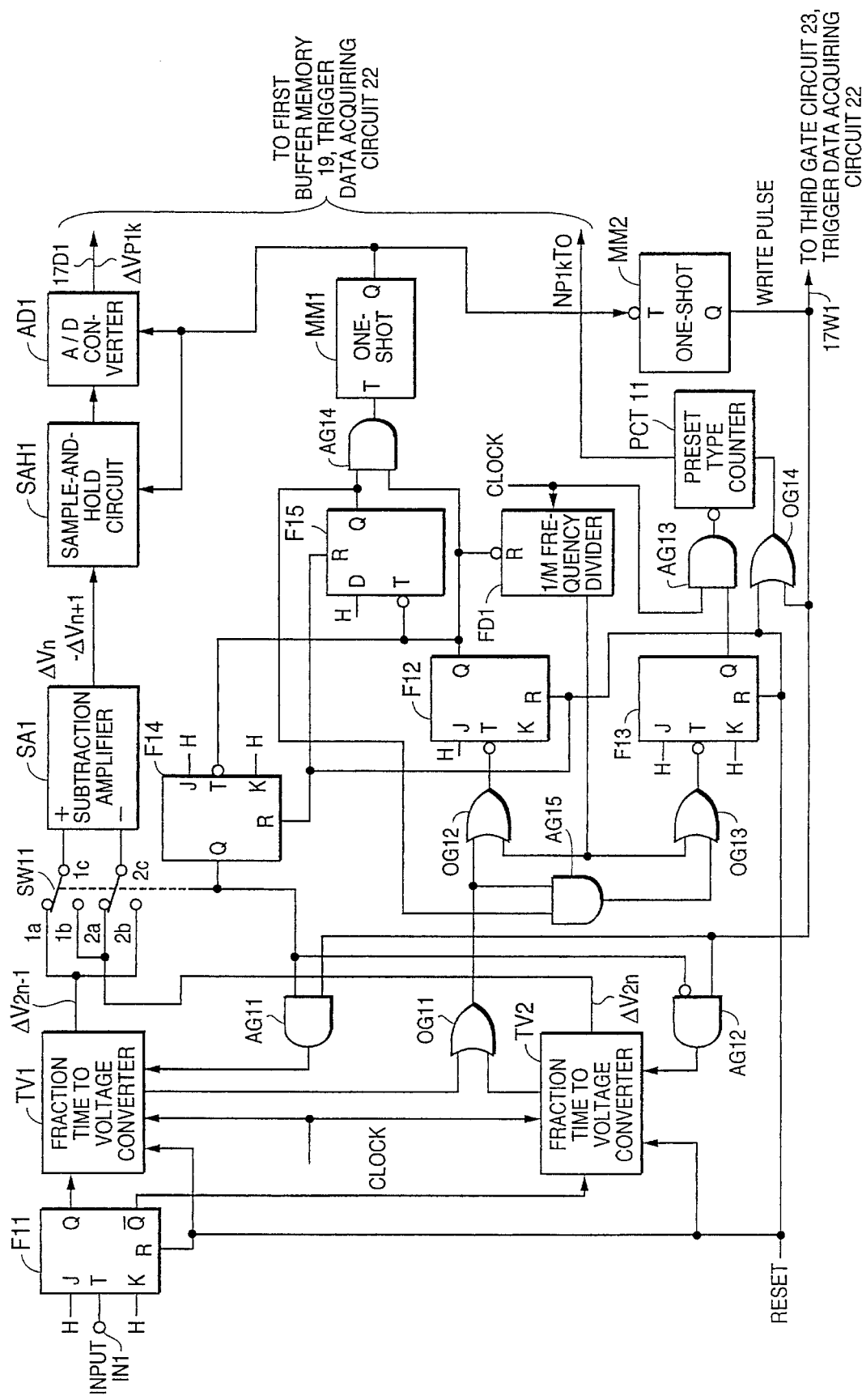
FIG. 15 is a block diagram schematically showing a successive period measuring circuit used in the jitter analyzer of FIG. 1.

With the construction as mentioned above, when the movable contact of the delay presence/absence change-over switch SW4 is connected to the delay-presence fixed contact thereof at the side of the output Q of the D-type flip-flop F7, the output Q of the D-type flip-flop F6 is inverted so that the counting clock is applied to the preset counter PCT2 through the AND gate G8 and a carry signal is generated from the carry terminal C of the preset counter PCT2 after the set time interval by the preset data inputted thereinto has elapsed. This carry signal is inputted into the trigger terminal T of the D-type flip-flop F7 as a clock therefor. This D-type flip-flop F7 is arranged in circuit so as to operate in a toggle switch manner. As a result, a pulse signal, namely, a trigger signal is generated from the output Q of the D-type flip-flop F7 and is sent to the measuring signal generating circuit 11 through the delay-presence fixed contact of the delay presence/absence change-over switch SW4. In case there is no need for delaying the trigger signal, the delay time is set to zero so that the movable contact of the delay presence/absence change-over switch SW4 is connected to the delay-absence fixed contact thereof and the external trigger input is directly outputted to the measuring signal generating circuit Specific examples of the first and second successive period measuring circuits 17 and 18 will be now described with reference to FIG. 15, respectively. As the successive period measuring circuits 17 and 18, the technique disclosed, for example, in Japanese Patent Application No. 25326/1987 (Patent Application Public Disclosure No. 191970/1988) can be utilized as a basic circuit composition. As stated above, the circuit compositions of the successive period measuring circuits 17 and 18 may be identical, and as explained with reference to FIG. 2, may be ones in which the fraction time intervals t1, t2 and data Np1kT0, Np2kT0 which are data of multiplying Np1k by T0 and Np2k by T0 can be calculated, where Np1k and Np2k are the number of counting clocks generated during the time interval from the end of the time interval t1 to the end of the time interval t2, respectively, and T0 is the period of the counting clock, and among the data calculated the data Np1kT0, Np2kT0 can be outputted as they are, and as to the fraction time intervals t1 and t2, the digital values $\Delta Vp1k$ and $\Delta Vp2k$ can be outputted, which are obtained by converting the difference (t1−t2) into a voltage and further converting the voltage into the digital values by an A/D converter. FIG. 15 shows a specific example of the first successive period measuring circuit 17 which utilizes the technique disclosed in Japanese Patent Application No. 25326/1987 as a basic circuit construction and can perform the above operation by modifying a portion of the disclosed technique. Of course, the second successive period measuring circuit 18 may have the same circuit construction as that of the first successive period measuring circuit, and also they are not limited to the circuit construction shown in FIG. 15.

The successive period measuring circuit 17 shown in FIG. 15 comprises, first to fourth, four J-K flip-flops F11 to F14, a D-type flip-flop F15, first and second fraction time to voltage converters TV1 and TV2, first to fifth, five AND gates AG11 to AG15, first to fourth, four OR gates OG11 to OG14, a subtraction amplifier SA1 for performing a subtraction between output values of the first and second fraction time to voltage converters TV1 and TV2, a change-over switch SW11 capable of switching the output values of the first and second fraction time to voltage converters TV1 and TV2 to input the switched output values into the subtraction amplifier SA1, a 1/M frequency divider FD1 for dividing in frequency the clock by M, first and second one-shot multivibrators MM1 and MM2, a preset type counter PCT11 for counting Np1kT0, a sample-and-hold circuit SAH1 for effecting a sample-and-hold action of the fraction quantity (t1–t2) voltage, and an analog-digital converter (A/D converter) AD1 for converting the sampled fraction quantity voltage into a digital signal. The electrical connection of these components or elements are as shown in the drawing and so the explanation thereof is omitted. Further, H represents a high level signal, which is applied to the J and K terminals of each of the first to fourth J-K flip-flops F11 to F14 and the data terminal D of the D-type flip-flop F15, respectively.

In the above circuit construction, the input terminal IN1 has the edge signal to be measured of the input 1 supplied thereto which has passed through the first gate circuit 13. (In case of the second successive period measuring circuit 18, the input terminal IN1 has the edge signal to be measured of the input 2 or the input⁻1 supplied thereto which has passed through the second gate circuit 14.) The following explanation of the operation is given as to the first successive period measuring circuit 17, and it goes without saying that the second successive period measuring circuit 18 also performs the same operation as that of the first successive period measuring circuit 17.

The edge signal to be measured of the input 1 supplied to the input terminal IN1 is inputted into the trigger (clock) terminal T of the first J-K flip-flop F11, and the output Q of the J-K flip-flop F11 which has been inverted in level by the first edge signal is supplied to the first fraction time to voltage converter TV1. The first fraction time to voltage converter TV1 calculates the time interval t1 (see FIG. 2) from this edge (for example, E11 in FIG. 2) to the second counting clock after this edge and converts the calculated time interval t1 into a voltage signal $\Delta V1$. The output $\overline{Q}$ (logically inverted output of Q) of the J-K flip-flop F11 is connected to the second fraction time to voltage converter TV2, and when the output $\overline{Q}$ which has been inverted in level by the next inputted edge signal to be measured (the second edge signal) is supplied to the second fraction time to voltage converter TV2, this second fraction time to voltage converter TV2 calculates the time interval t2 (see FIG. 2) from this edge (for example, E12 in FIG. 2) to the second counting clock after this edge and converts the calculated time interval t2 into a voltage signal $\Delta V2$. In like wise, the first fraction time to voltage converter TV1 will generate voltage signals $\Delta V2n-1$ corresponding to the time intervals from the edges of the odd numbers such as the third, the fifth, ... to the second counting clock after these edges, and the second fraction time to voltage converter TV2 will generate voltage signals $\Delta V2n$ corresponding to the time intervals from the edges of the even numbers such as the fourth, the sixth, ... to the second counting clock after these edges.

These voltage signals $\Delta V2n-1$ and $\Delta V2n$ are supplied to the subtraction amplifier SA1 through the change-over switch SW11. The change-over switch SW11 comprises two interlocking change-over switches, and the movable contact 1c of the first change-over switch is connected to the (+) input of the subtraction amplifier SA1, one fixed contact 1a thereof is connected to the output side of the first fraction time to voltage converter TV1 and the other fixed contact 1b thereof is connected to the output side of the second fraction time to voltage converter TV2. Also, the movable contact 2c of the second change-over switch is connected to the (−) input of the subtraction amplifier SA1, one fixed contact 2a thereof is connected to the output side of the second fraction time to voltage converter TV2 and the other fixed contact 2b thereof is connected to the output side of the first fraction time to voltage converter TV1.

Since the arithmetic operation in the subtraction amplifier SA1 is to calculate the voltage of the fraction quantity (t1–t2) as mentioned above, the subtraction amplifier SA1 subtracts the voltage at the terminating side from the voltage at the starting side. Accordingly, the movable contact of the change-over switch SW11 is at the position shown in the drawing at the initial setting time, and the subtraction of ($\Delta V1-\Delta V2$) is first performed. Further, the arithmetic operation in the subtraction amplifier SA1 is one in which the voltage at the terminating side is always subtracted from the voltage at the starting side. However, in the next subtraction, since the voltage ($\Delta V2$) at the terminating side immediately before can be utilized as the voltage at the starting side, the switch SW11 is switched to subtract the second output ($\Delta V3$) of the first fraction time to voltage converter TV1 from the output ($\Delta V2$) of the second fraction time to voltage converter TV2 ($\Delta V2-\Delta V3$). In the subtraction subsequent to the next subtraction, again the switch SW11 is switched to subtract the second output ($\Delta V4$) of the second fraction time to voltage converter TV2 from the second output ($\Delta V3$) of the first fraction time to voltage converter TV1 ($\Delta V3-\Delta V4$), and thereafter, the switch SW11 is alternately switched to perform the subtractions.

The fraction quantity voltage ($\Delta Vn-\Delta Vn+1$) calculated in this manner is sampled in the sample-and-hold circuit SAH1, which is converted into a digital value by the A/D converter AD1. The converted digital value $\Delta Vp1k$ of the fraction quantity voltage is sent to the first buffer memory 19 and the trigger data acquiring circuit 22. The data Np1kT0 of multiplying Np1k by T0 where Np1k is the number of counting clocks generated during the time interval from the end of the time interval tn to the end of the time interval t(n+1) and T0 is the period of the counting clock, is outputted from the preset type counter PCT11 to the first buffer memory 19 and the trigger data acquiring circuit 22.

A write pulse generated from the second one-shot multivibrator MM2 is applied to the first buffer memory 19 through the third gate circuit 23, and when the third gate circuit 23 is turned on by the time window trigger signal from the trigger data acquiring circuit 22, the write pulse is applied to the first buffer memory 19 to start the write of the measured data inputted into the memory 19. Accordingly, from the time of the period data thus obtained, the period of the signal to be measured can be continuously measured in the operating and analyzing part 30 in the above-mentioned manner. Further, the write pulse is also applied to the trigger data acquiring circuit 22 to write thereinto the above measured data supplied thereto.

On the other hand, in case of the jitter analyzer having no time window trigger function, the digital value $\Delta Vp1k$ of the fraction quantity voltage from the A/D converter AD1 of the successive period measuring circuit shown in FIG. 15, the data Np1kT0 from the preset type counter PCT11 and the write pulse generated from the second one-shot multivibrator MM2 are supplied to the first buffer memory as they are.

Figure 16:
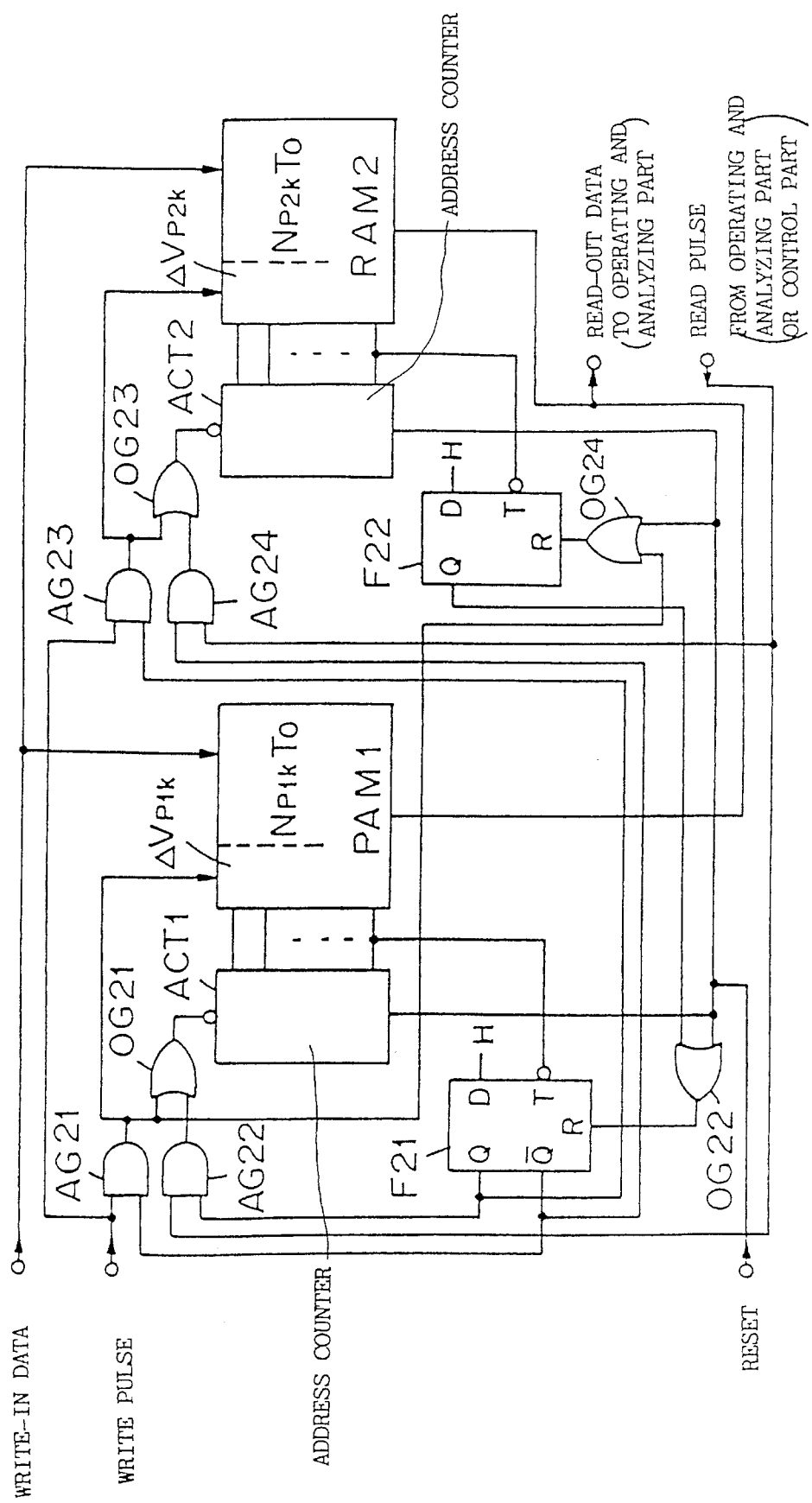
FIG. 16 is a block diagram schematically showing a buffer memory used in the jitter analyzer of FIG. 1.

Specific examples of the first and second buffer memories 19 and 20 are shown in FIG. 15. In order to continuously store all of the data from the measuring part 10 when a write pulse is inputted into the buffer memories 19 and 20, each of the buffer memories 19 and 20 is arranged as double buffers in which two sets of address counters (ACT1, ACT2) and RAM's (RAM1, RAM2) of the same scale are used and they alternately perform the write operation. During the time duration that a write operation is being performed for one set of the address counter and the RAM, the other set of the address counter and the RAM is read out. If necessary, it is possible that the speed of the readout is made higher than that of the write so that a necessary operation can be performed in that buffer memory within a time interval after the end of the read operation until the write operation for that buffer memory will be started. FIG. 16 shows a specific example of the first buffer memory 19, and the second buffer memory may also have the same circuit construction as that of the first buffer memory 19. The write data (period data) Np1kT0, Np2kT0 and $\Delta$Vp1k, $\Delta$Vp2 from the first and second successive period measuring circuits 17 and 18 are stored distinctively in the RAM's of the buffer memories 19 and 20 when the write pulses are applied thereto from the successive period measuring circuits 17 and 18. Further, in FIG. 16, AG21 to AG24 denote AND gates, OG21 to OG24 denote OR gates, and F21, F22 denote D-type flip-flops, respectively.

Figure 17:
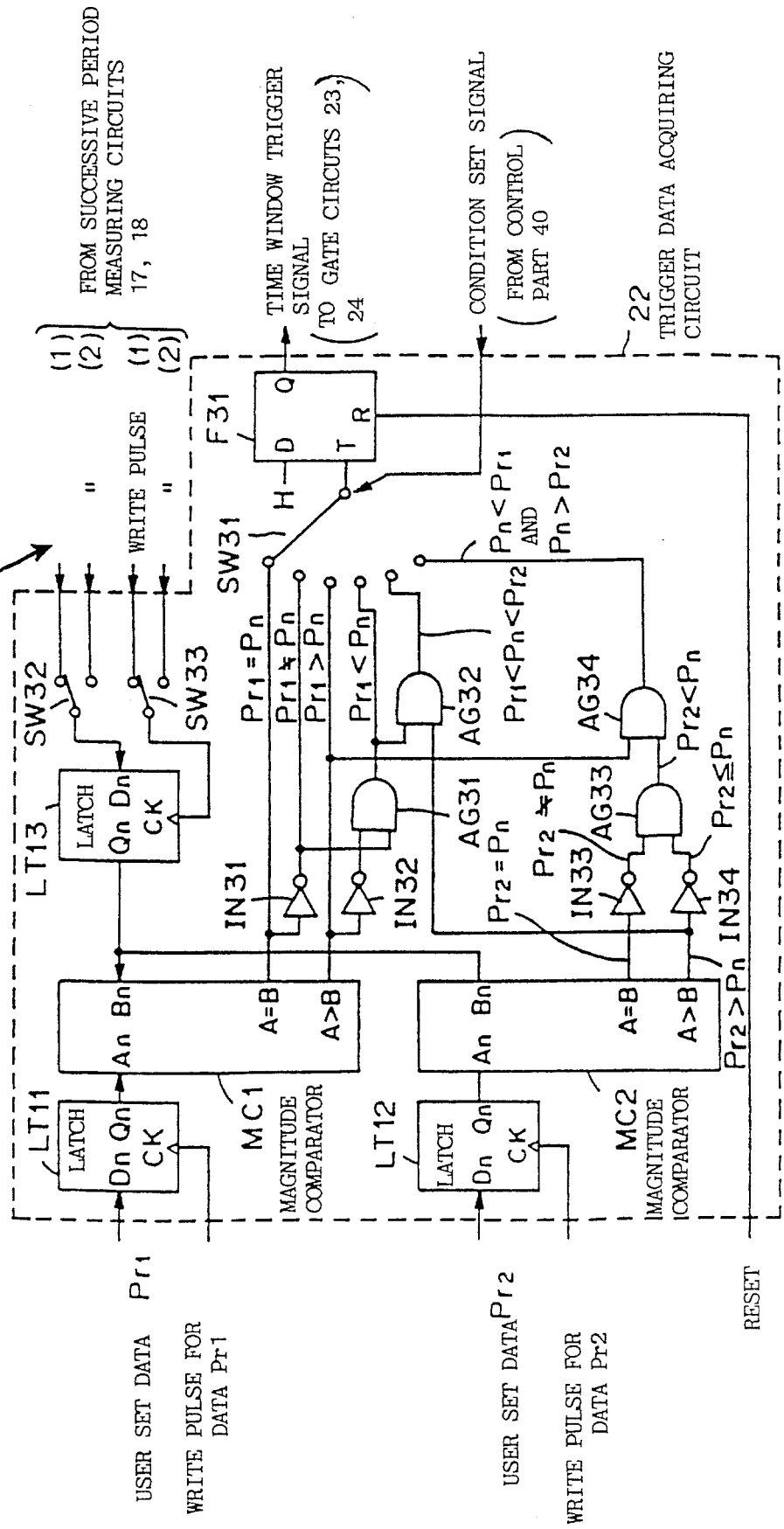
FIG. 17 is a block diagram schematically showing a trigger data acquiring circuit used in the jitter analyzer of FIG. 1.

A specific example of the trigger data acquiring circuit 22 is shown in FIG. 17. The trigger data acquiring circuit 22 is arranged to sequentially compare the reference values (Pr1, Pr2) of the trigger acquisition data preset by a user before the start of the measurement with data (Pn) of either one of the successive period measuring circuits 17 and 18 in magnitude comparators, and to generate a time window trigger signal when the above-described set conditions (accord:Pr=Pn, disaccord:Pr≠Pn, large:Pr<Pn, small:Pr>Pn, within the limits:Pr1<Pn<Pr2, beyond the limits: Pn<Pr1, Pn>Pr2) are satisfied, and to supply this time window trigger signal to the third and fourth gate circuits 23 and 24 thereby controlling the write of the measured data into the buffer memories 19 and 20.

Accordingly, as shown in FIG. 17, there are provided the first and second latch circuits LT11 and LT12 for latching into the reference values Pr1 and Pr2 of the trigger acquisition data set by a user, respectively, and the outputs of these latch circuits LT11 and LT12 are sent to the first and second magnitude comparators MC1 and MC2. The period data from the first and second successive period measuring circuits 17 and 18 are sent to the change-over switch SW32 where either one of them is selected, and the selected one is inputted into the third latch circuit LT13 and with this the corresponding one of the write pulses from the first and second successive period measuring circuits 17 and 18 is selected by the change-over switch SW33. That is, when the period data (1) from the first successive period measuring circuit 17 is written in, then the write pulse (1) from the first successive period measuring circuit 17 is supplied to and when the period data (2) from the second successive period measuring circuit 18 is written in, then the write pulse (2) from the second successive period measuring circuit 18 is supplied to the clock terminal of the third latch circuit LT13, respectively. The output of the third latch circuit LT13 is sent to the first and second magnitude comparators MC1 and MC2 where it is compared with the reference values set by the user. In the present example, the comparisons of A=B, A>B (where A denotes the reference value set by the user and B denotes the measured data) corresponding to the accord:Pr=Pn and the small:Pr>Pn among the set conditions mentioned above are only performed in the magnitude comparators MC1 and MC2 and other set conditions (the disaccord:Pr≠Pn, the large:Pr<Pn, the within the limits: Pr1<Pn<Pr2, and the beyond the limits:Pn<Pr1, Pn>Pr2) are performed by the combination of four inverters IN31 to IN34 and four AND gates AG31 to AG34. However, it is only by way of example, and various circuit constructions, of course, can be used.

The outputs obtained from the results of such comparisons are supplied to the corresponding fixed contacts of the changeover switch SW31, and when the output of the result of the comparison to which the movable contact of the switch SW31 is connected, namely, the output which satisfies the set condition, is obtained, this output is supplied to the D-type flip-flop F31 so that the flip-flop F31 generates a time window trigger signal. This time window trigger signal is sent as a continuous output to the third and fourth gate circuits 23 and 24 thereby turning on them until the measuring operation ends. The switch SW31 is arranged such that the movable contact thereof is connected to one fixed contact thereof which accords with the set condition by the condition set signal from the control part 40.

The trigger data acquiring circuit 22 constructed as mentioned above is the same in function as that of the measured value discriminating circuit for pulse jitter counters disclosed in the above-mentioned U.S. Pat. No. 4,611,926, but they differ in circuit constructions thereof. Particularly, as comparator circuits for comparing the data set by a user and the measured data, counters are utilized in the pulse jitter counter, whereas in the present example the magnitude comparators are utilized. In case of constructing them by general-purpose IC's, the presettable counters are constructed normally by 4 bits/one, whereas the magnitude comparators are constructed by 8 bits/one, and therefore the scale of the hardware becomes a half. Also, in case the discrimination of the high resolution in the order of ps (picosecond) as in the measured values is required, if it is constructed by counters, even though the discriminating counters are constructed to have the same circuits as those of the counters for the measured values having the large scale of the hardware, only the discrimination of the same resolution as that of the counting clock (in the order of 10 ns to 5 ns) can be attained, and so the discrimination of the resolution (in the order of ps) by which the fraction time intervals can be compared cannot be done. On the other hand, if it is constructed by magnitude comparators, there can be obtained remarkable advantages that, by simply increasing the number of comparison bits of the comparator in parallel, data in the resolution of the counting clock and fraction time interval data can be compared in parallel, the scale of the hardware can be reduced, and the construction can be made very simple.

Next, specific examples of analyzing real burst signals will be described by using the jitter analyzer of the first embodiment of the present invention thus constructed.

Figure 18:
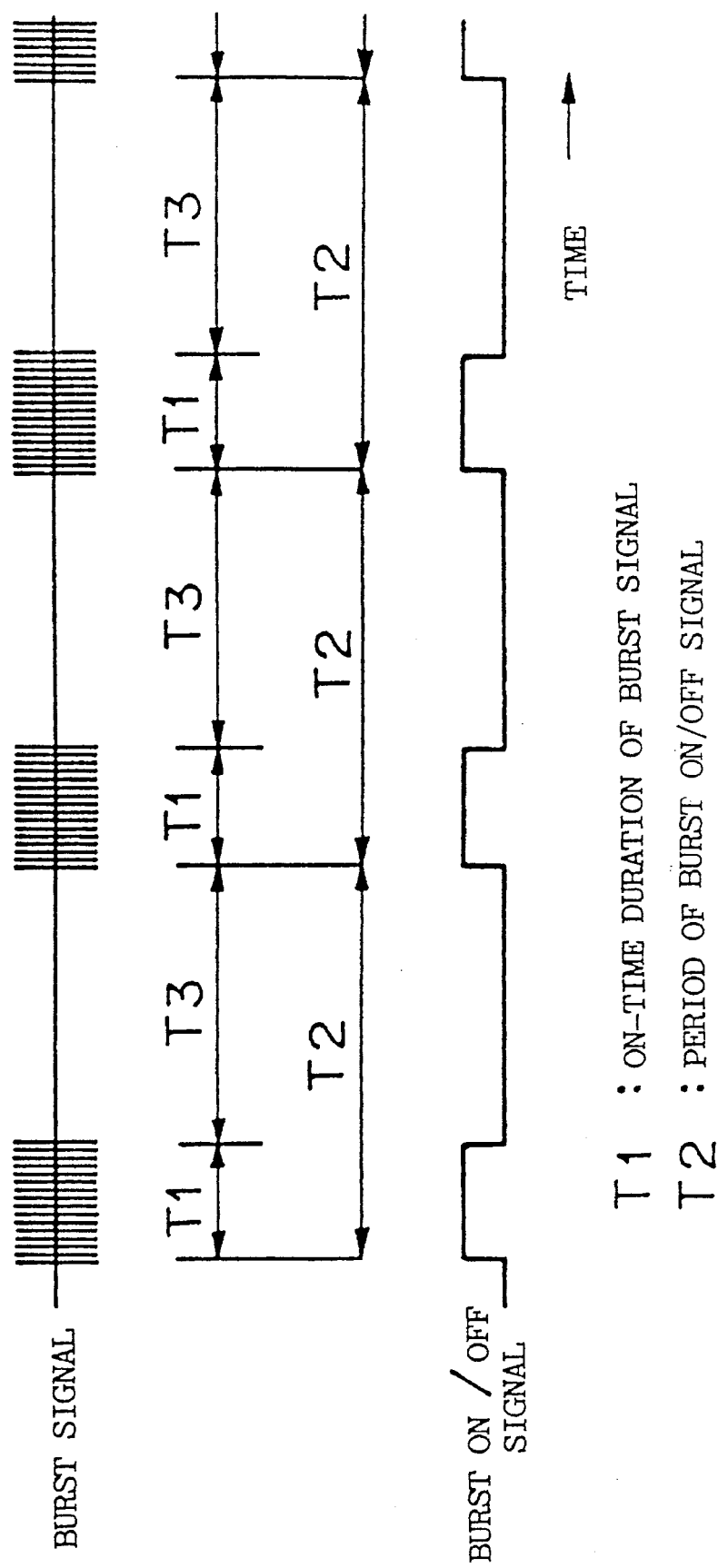
FIG. 18 is a timing chart for explaining an example of an analysis of a burst signal in the jitter analyzer of FIG. 1.

FIG. 18 shows a waveform of a general burst signal used in, for example, TDMA communication or the like. In this drawing, T1 denotes an on-time duration of the burst signal (a time duration that the burst signal is present), and T3 denotes an off-time duration of the burst signal (a time duration that the burst signal is absent), respectively, and T2 denotes the period of a burst on/off signal (a signal indicating on-time durations of the burst signal and off-time durations of the burst signal). Now specific methods of analyzing burst signals will be described by making the waveform shown in FIG. 18 as the base.

First, the analyzing methods which do not use the time window trigger function are explained.

(1) a case the burst on/off signal is inputted into from the outside

Figure 19:
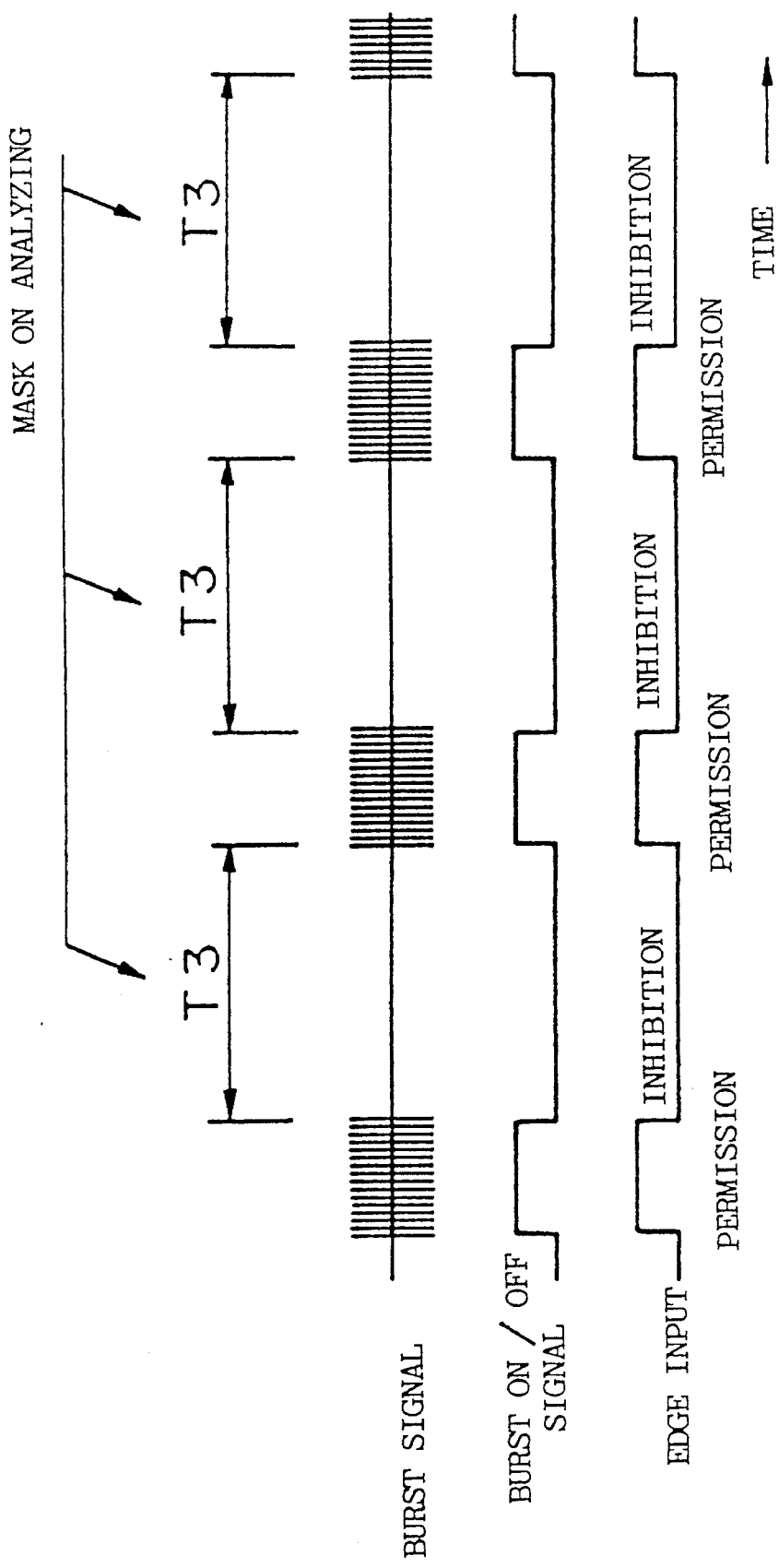
FIG. 19 is a timing chart for explaining an example of an analysis of a burst signal in the jitter analyzer of FIG. 1.

The inputted edge signals are sent to the successive period measuring circuits 17 and 18 by controlling to turn on or off the first and second gate circuits 13 and 14 by the burst on/off signal, and the period of occurrences of the edges is obtained. In such case, since the gate circuits 13, 14 are turned off during the off-time durations T3 of the burst signal, the input signals are not sent to the successive period measuring circuits 17, 18 during that off-time durations T3. In this respect, since the off-time duration T3 of the burst signal from the input edge immediately before the burst on/off signal became off to the input edge immediately after the burst on/off signal became on is taken as one continuous period data, the continuity of the elapsed time can be held. However, when the measured data are analyzed, the off-time durations T3 of the burst signal are masked so that the off-time durations T3 cannot be treated. After the off-time durations T3 have been masked, an interpolation of the dropped data by the mask is done if necessary. FIG. 19 shows a timing waveform of the analyzing operation mentioned above.

(2) a case the burst on/off signal is not inputted into from the outside

Figure 20:
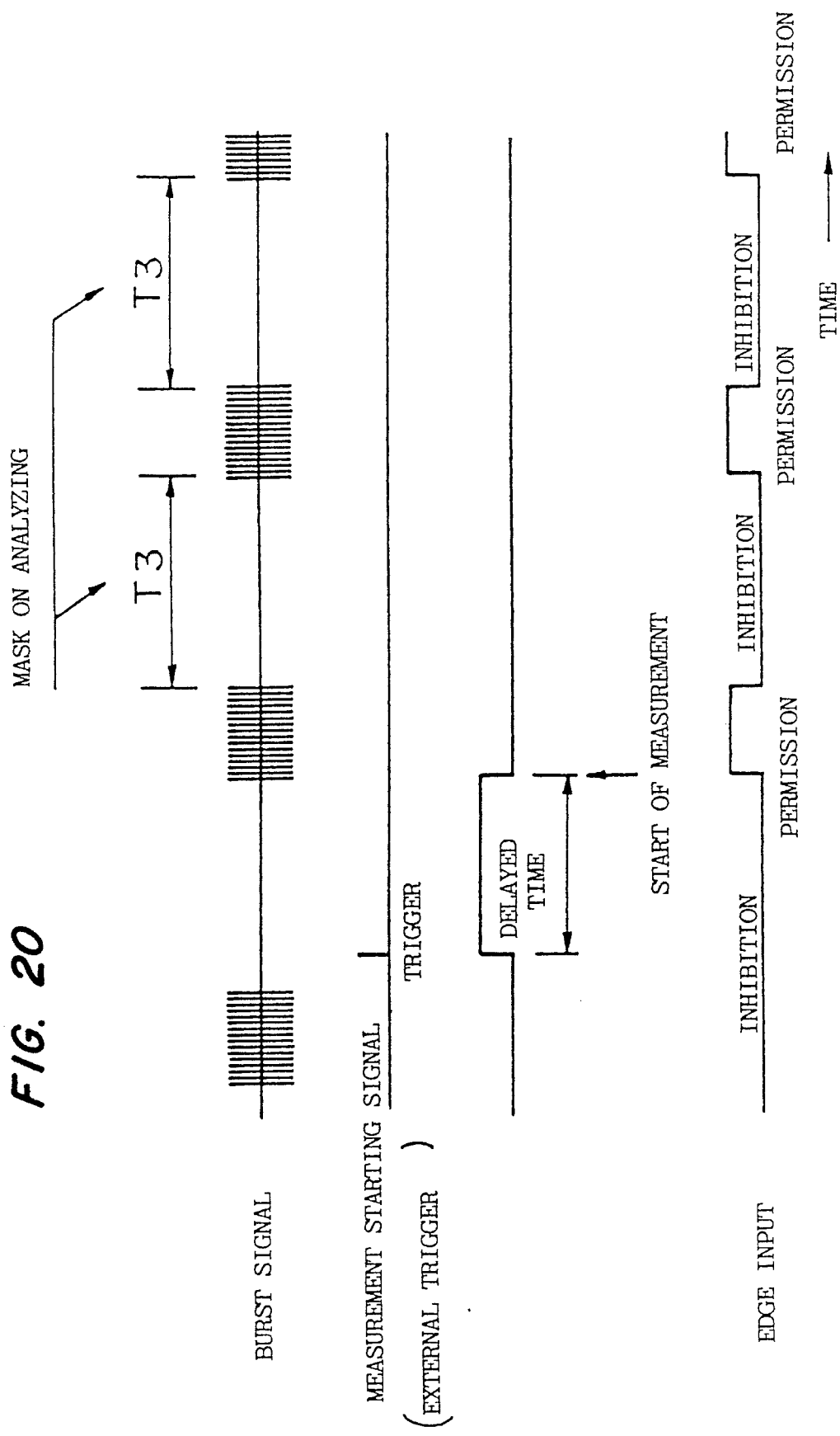
FIG. 20 is a timing chart for explaining an example of an analysis of a burst signal in the jitter analyzer of FIG. 1.

At first, the measurement starting signal is given, and when the timings of this signal and on/off of the burst are known, the setting is done so that the measurement is started with the given measurement starting signal as its starting point after the burst signal is turned on by the trigger delay function. In addition, after the measurement was started, the setting is done such that the measurement is performed during the on-time durations of the burst signal and the measurement is paused during the off-time durations of the burst signal by using a measurement pause/resumption function by the self-gating thereby automatically repeating the sequence of measurement → pause → measurement → pause. At this time, the off-time duration T3 of the burst signal from the input edge immediately before the measurement was interrupted to the input edge immediately after the measurement was resumed is obtained as one continuous period data, and so the continuity of the elapsed time can be held. However, when the measured data are analyzed, the off-time durations T3 of the burst signal are masked so that the off-time durations T3 cannot be treated. After the off-time durations T3 have been masked, an interpolation of the dropped data by the mask is done if necessary. FIG. 20 shows a timing waveform of the analyzing operation mentioned above.

Figure 21:
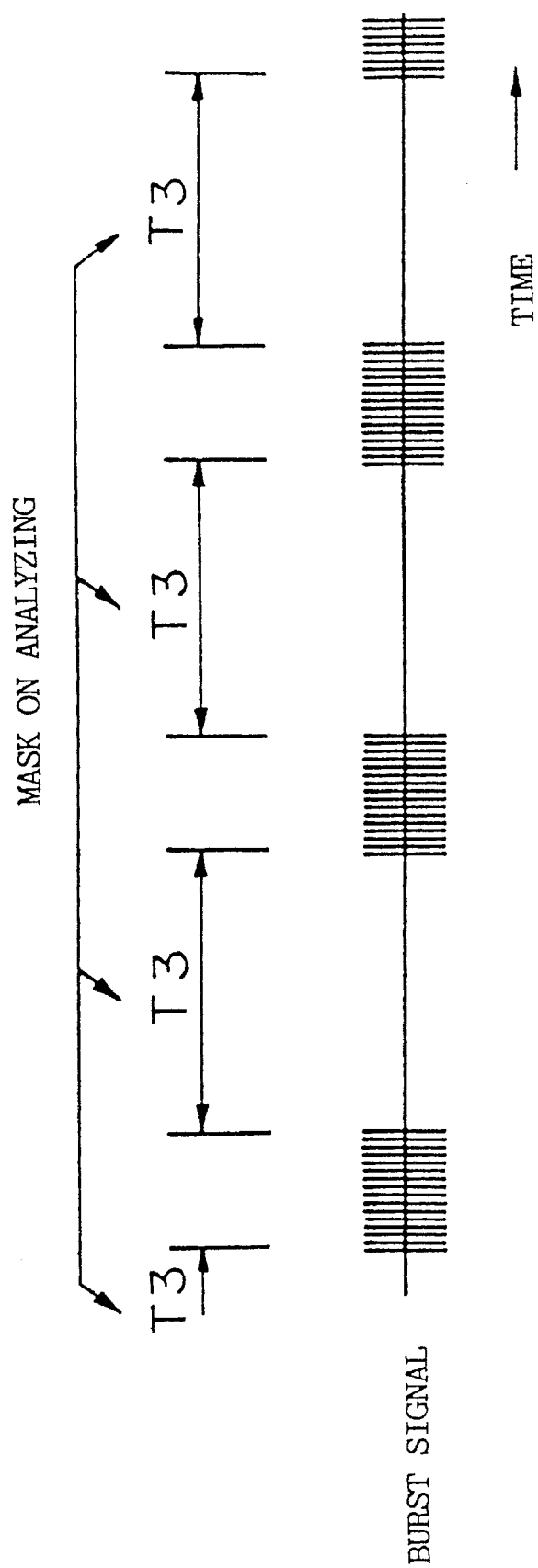
FIG. 21 is a timing chart for explaining an example of an analysis of a burst signal in the jitter analyzer of FIG. 1.

Next, when the measurement starting signal is not given (accordingly, only the signal to be measured is given), the successive period of the signal to be measured is simply measured if S/N of the signal to be measured is good. Since the input edge is not acquired during the off-time interval of the burst signal, the off-time duration T3 of the burst signal from the input edge immediately before the burst on/off signal became off to the input edge immediately after the burst on/off signal became on is obtained as one continuous period data, and so the continuity of the elapsed time can be held. However, when the measured data are analyzed, the off-time durations T3 of the burst signal are masked so that the off-time durations T3 cannot be treated. After the off-time durations T3 have been masked, an interpolation of the dropped data by the mask is done if necessary. FIG. 21 shows a timing waveform of the analyzing operation mentioned above.

Figure 22:
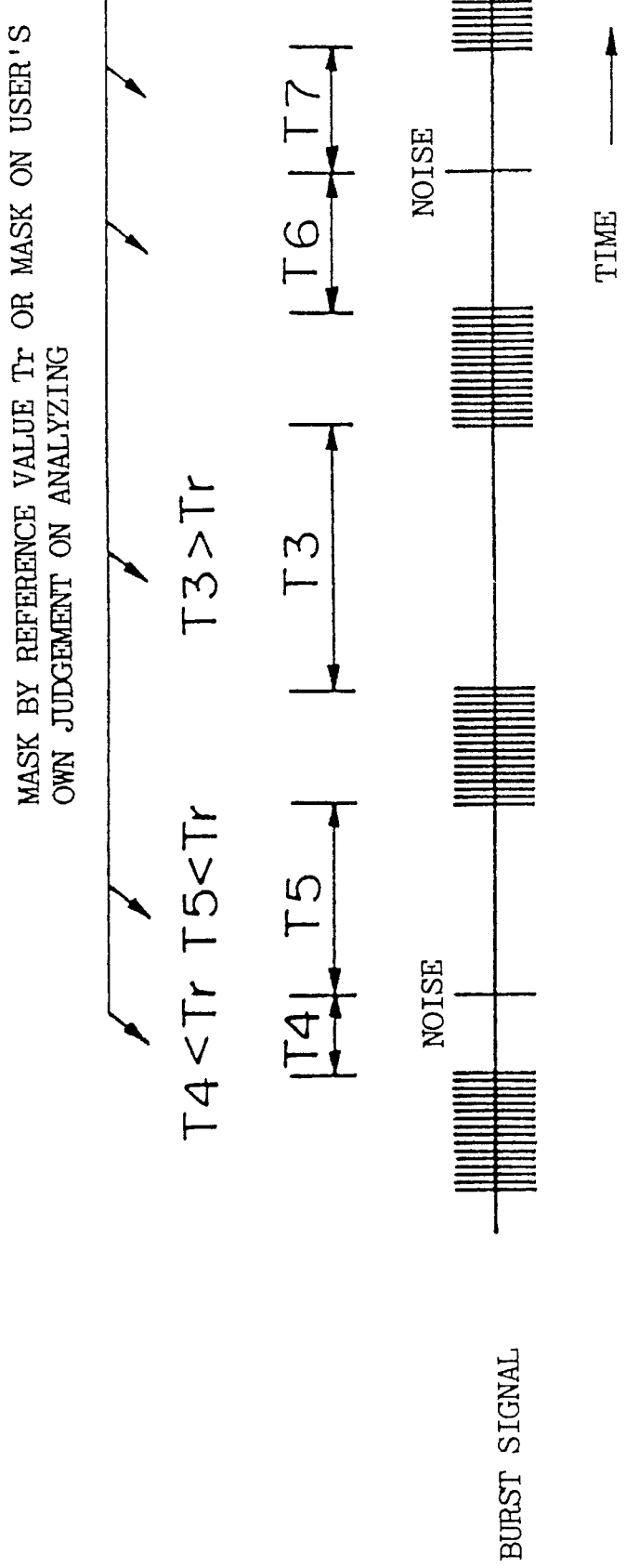
FIG. 22 is a timing chart for explaining an example of an analysis of a burst signal in the jitter analyzer of FIG. 1.

On the other hand, if S/N of the signal to be measured is bad, as shown in FIG. 22, when the measured data are analyzed, masking of data more than a fixed quantity Tr of data which is considered to have been generated during the off-time duration of the burst signal is done, or the user retrieves the list of the measuring quantities and masks any data on the user's own judgement in case it is difficult to judge simply by the reference value of Tr. After the data have been masked, an interpolation of the dropped data by the mask is done if necessary.

Thus, in accordance with the jitter analyzer of the first embodiment of the present invention, since there is also provided a function which creates a burst on/off signal by taking the measure of a timing in the inside, whether an external burst on/off signal is present or absent in addition to a burst signal which is a signal to be measured, it is possible to continuously measure the various quantities in time/frequency domain of the burst signal. Moreover, since each data has the acquisition time thereof recorded regardless of on/off of the burst signal, when an analysis of a statistical operation, distribution of the number of occurrences, variation relative to the elapsed time, frequency components or the like as to the various quantities, data generated during the off-time durations of the burst signal can be eliminated (masked) and also an interpolation of data can be done on the basis of the relation between the times before and after the eliminated data, and so, in addition to the analysis of the jitter in a continuous signal, the analysis of the jitter in a discontinuous burst signal can be also performed which could not have been done previously.

Next, specific examples of analyzing real burst signals will be described by using the time window trigger function. As is understood from the following explanation, the time window trigger function is highly effective to the analysis of a burst signal. Further, the waveform of a burst signal is the same as that shown in FIG. 18.

(1) a case on/off time duration of the burst signal is known

Figure 23:
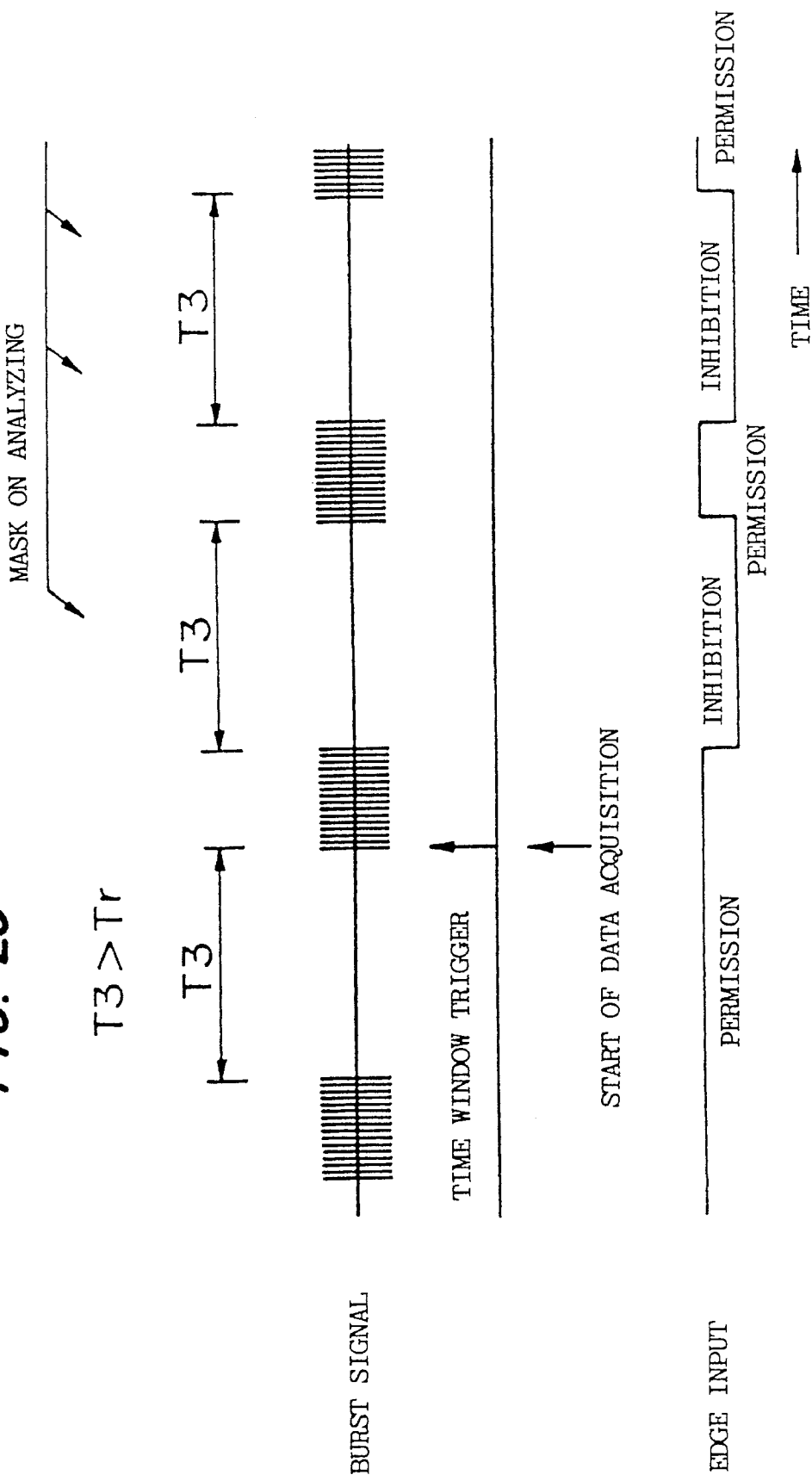
FIG. 23 is a timing chart for explaining an another example of an analysis of a burst signal in the jitter analyzer of FIG. 1.

As the timing waveform is shown in FIG. 23, a blank time duration T3 more than a fixed time (Tr) is acquired as an off-time duration of the burst signal by the time window trigger function, and a time window trigger signal is generated at the end of this off-time duration of the burst signal and immediately thereafter the acquisition of the measured data is started (the third and fourth gate circuits 23 and 24 are turned on so that the write pulses are applied to the buffer memories 19 and 20 thereby starting to write the measured data into the buffer memories 19, 20), and thereafter, the time is set such that the measurement is performed during the on-time durations of the burst signal and the measurement is paused during the off-time durations T3 of the burst signal by using the self-gating function mentioned before thereby automatically repeating the sequence of measurement → pause → measurement → pause . . . When the measured data are analyzed, the off-time durations T3 of the burst signal produced after the acquisition by the time window trigger function are masked by the data masking function so that these off-time durations T3 cannot be treated. In addition, if an interpolation of the dropped data by the mask is effected by the mask data interpolating function, the analysis of the frequency components of the measured quantities can also be performed.

Figure 24:
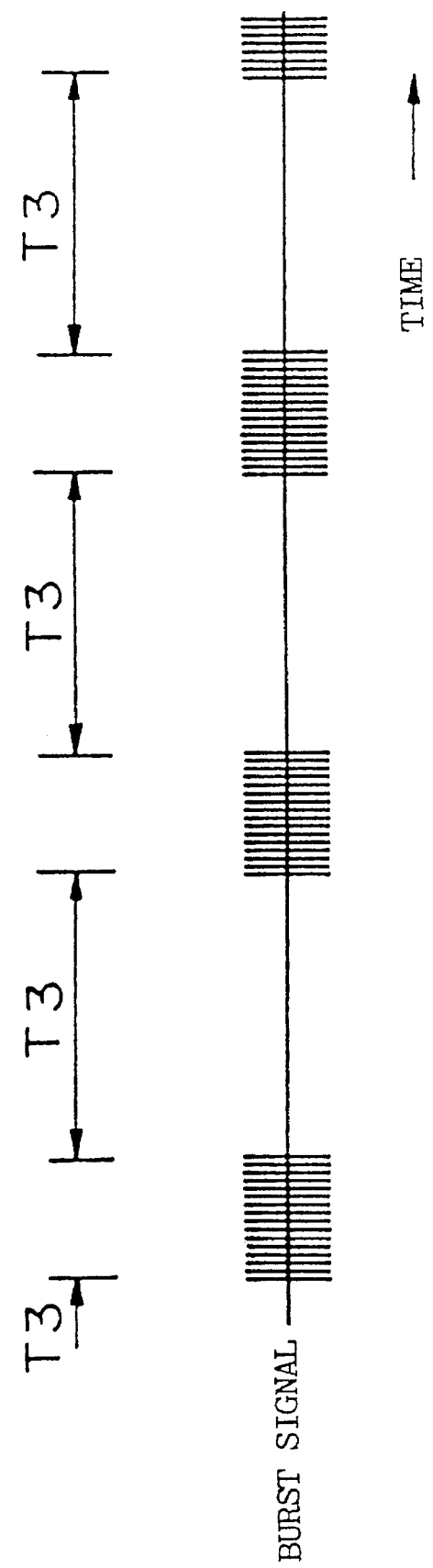
FIG. 24 is a timing chart for explaining an another example of an analysis of a burst signal in the jitter analyzer of FIG. 1.

(2) a case on/off time duration of the burst signal is not known (a) a case S/N of the signal to be measured is good First, as the timing waveform is shown in FIG. 24, the successive periods of th signal to be measured is simply measured, and from the results of a sequence of the measurements are retrieved data which represent the off-time durations of the burst signal (in the present embodiment, data which have a relatively long period and generate at periodic intervals).

Figure 25:
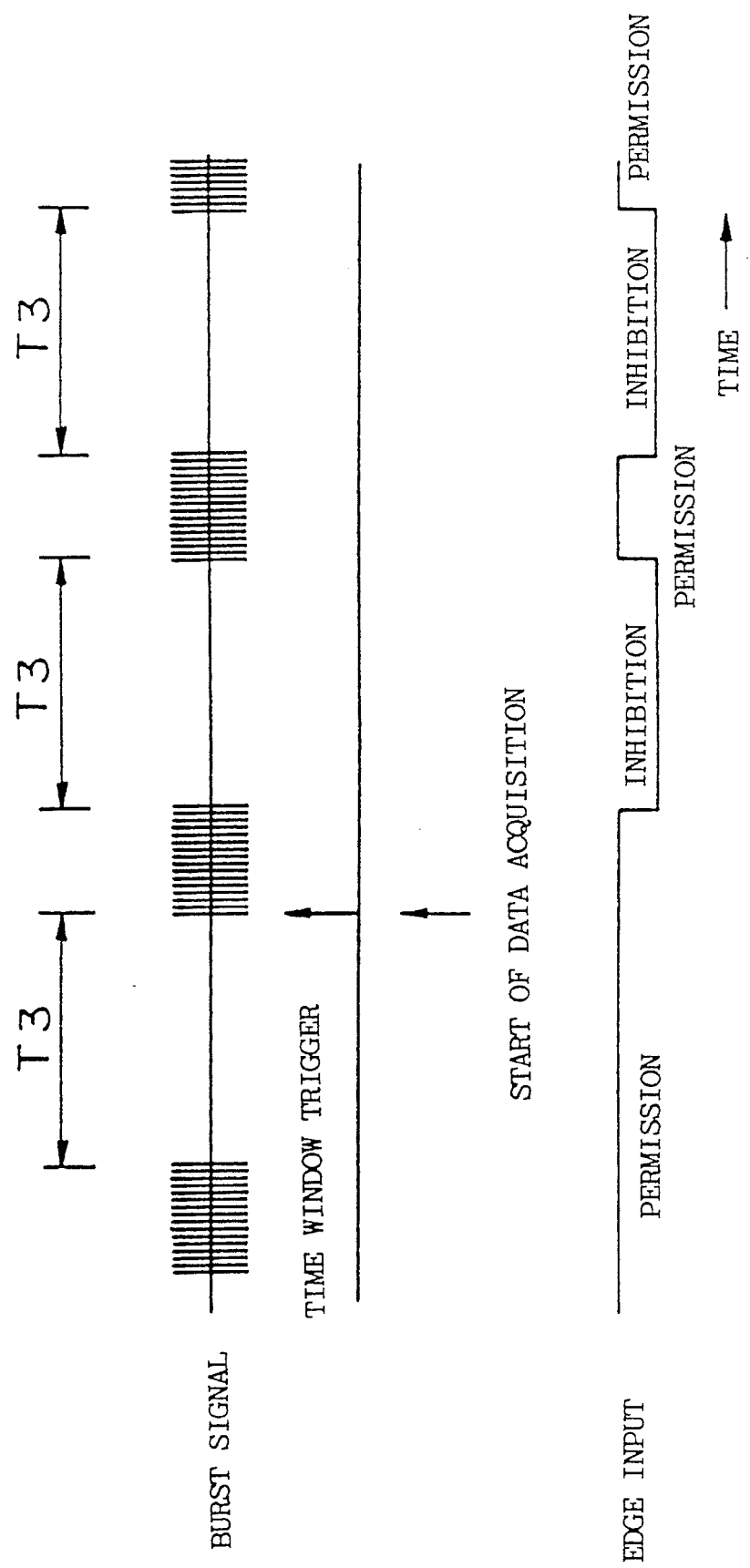
FIG. 25 is a timing chart for explaining an another example of an analysis of a burst signal in the jitter analyzer of FIG. 1.

Next, as the timing waveform is shown in FIG. 25, a data (T3 in its length) appearing at the first time among the data retrieved by the time window trigger function is acquired as an off-time duration of the burst signal, and a time window trigger signal is generated at the end of this off-time duration T3 of the burst signal and immediately thereafter the acquisition of the measured data is started (the third and fourth gate circuits 23 and 24 are turned on so that the write pulses are applied to the buffer memories 19 and 20 thereby starting to write the measured data into the buffer memories 19, 20), and thereafter, the time is set such that the measurement is performed during the on-time durations of the burst signal and the measurement is paused during the off-time durations T3 of the burst signal by using the self-gating function mentioned before thereby automatically repeating the sequence of measurement → pause → measurement → pause . . . When the measured data are analyzed, the off-time durations T3 of the burst signal produced after the acquisition by the time window trigger function are masked by the data masking function so that these off-time durations T3 cannot be treated. In addition, if an interpolation of the dropped data by the mask is effected by the mask data interpolating function, the analysis of the frequency components of the measured quantities can also be performed.

(b) a case S/N of the signal to be measured is bad

Figure 26:
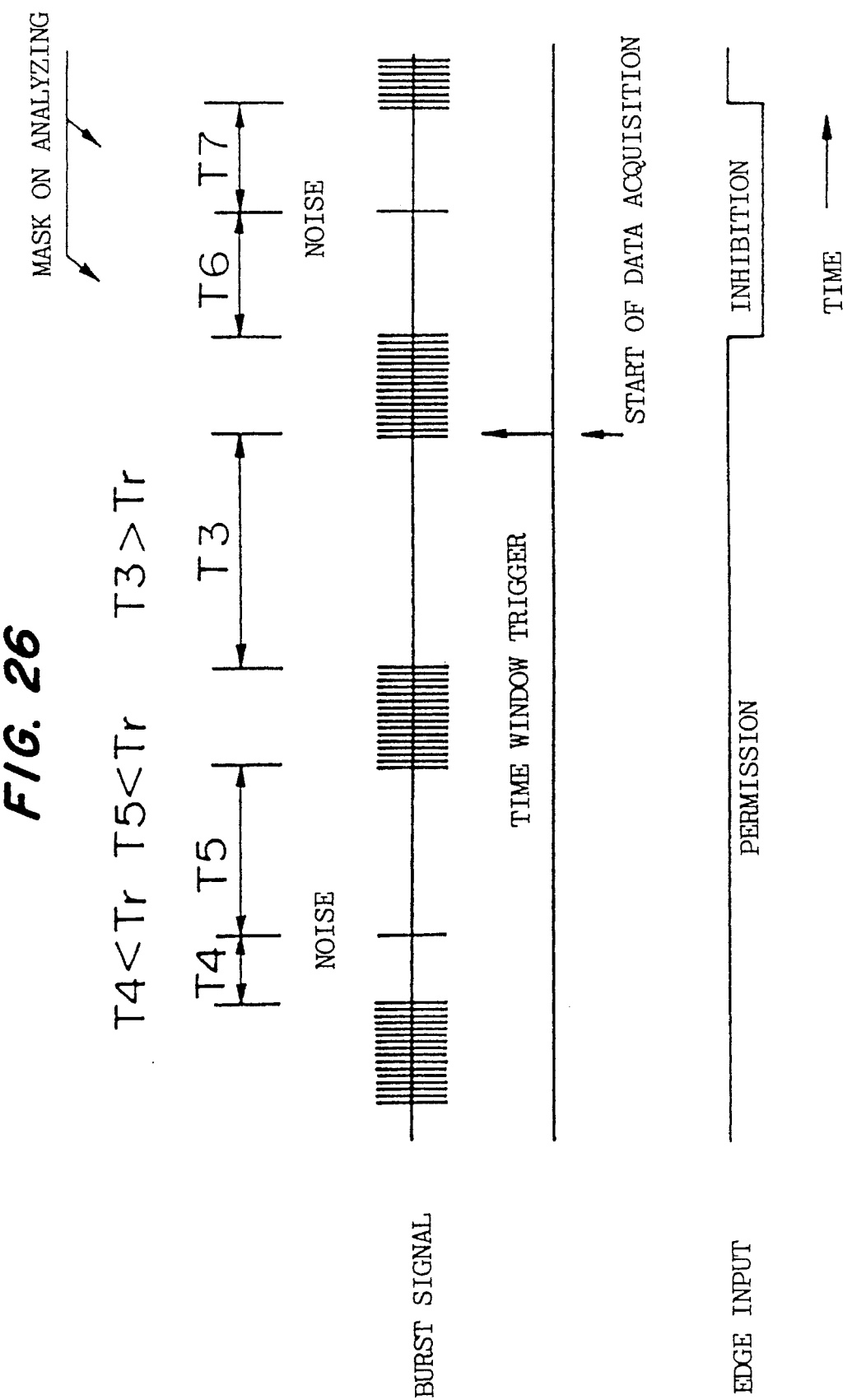
FIG. 26 is a timing chart for explaining an another example of an analysis of a burst signal in the jitter analyzer of FIG. 1.

An off-time duration of the burst signal is measured once in the same manner as the above case (a). Next, as the timing waveform is shown in FIG. 26, a blank time duration T3 more than a fixed time (Tr) is acquired as an off-time duration of the burst signal by the time window trigger function, and a time window trigger signal is generated at the end of this off-time duration of the burst signal and immediately thereafter the acquisition of the measured data is started, and thereafter, the time is set such that the measurement is performed during the on-time durations of the burst signal and the measurement is paused during the off-time durations of the burst signal by using the self-gating function mentioned before thereby automatically repeating the sequence of measurement → pause → measurement → pause . . . When the measured data are analyzed, the off-time durations (in FIG. 26, T6, T7) of the burst signal produced after the acquisition by the time window trigger function are masked by the data masking function so that these off-time durations cannot be treated. In addition, in case the frequency components of the measured data are analyzed, the dropped data by the mask are interpolated by the mask data interpolating function.

Thus, in accordance with the jitter analyzer of the first embodiment of the present invention, in case of continuously measuring various quantities in the domain of time/frequency of a pulse-like signal to be measured including a discontinuous burst signal, for example, period, frequency, pulse width, duty ratio, time interval, phase or the like thereof, it is possible by the time window trigger function to detect a specified section or segment in the signal to be measured and continuously acquire measuring data immediately after the detection of the specified section to measure them, or to inhibit the analyzer from measuring immediately after the detection of the specified section. Therefore, the measurements of the various quantities in time/frequency domain in a desired section of the signal to be measured can be continuously performed with a high accuracy, and particularly, the present jitter analyzer is effective to the analysis of a burst signal. Also, since each data has the acquisition time thereof recorded regardless of on/off of the burst signal, when an analysis of a statistical operation, a distribution of the number of occurrences, a variation relative to the elapsed time, frequency components or the like as to the various quantities is performed, data generated during the off-intervals of the burst signal can be eliminated (masked) and also an interpolation of data can be done on the basis of the relation between the times before and after the eliminated data, and so, in addition to the analysis of the jitter in a continuous signal, the analysis of the jitter in a discontinuous burst signal can be also performed which could not have been done previously.

Further, in case of using the above-mentioned time window trigger function in order to create an end of data acquisition timing (to generate a time window trigger signal for inhibiting the measured data from being written into), for example, the logical level of the time window trigger signal outputted to the buffer memories 19, 20 from the trigger data acquiring circuit 22 may be simply inverted. As a result, by monitoring data in the trigger data acquiring circuit 22, the measurement of the period in the successive period measuring circuits 17, 18 is continuously performed immediately after the signal to be measured was inputted until the condition of data set by the user is satisfied (the measurement starting time may be set by an external trigger signal) so that the measured data are written into the buffer memories 19, 20. When the condition of data set by the user is satisfied, a time window trigger signal is generated and is applied to the third and fourth gate circuits 23, 24 as an end of data acquisition signal thereby turning off the gate circuits 23, 24. Accordingly, immediately thereafter, the write of data into the buffer memories 19, 20 can be inhibited.

Next, a jitter analyzer having a wander analyzing function of the second embodiment of the present invention will be described in detail.

Figure 27:
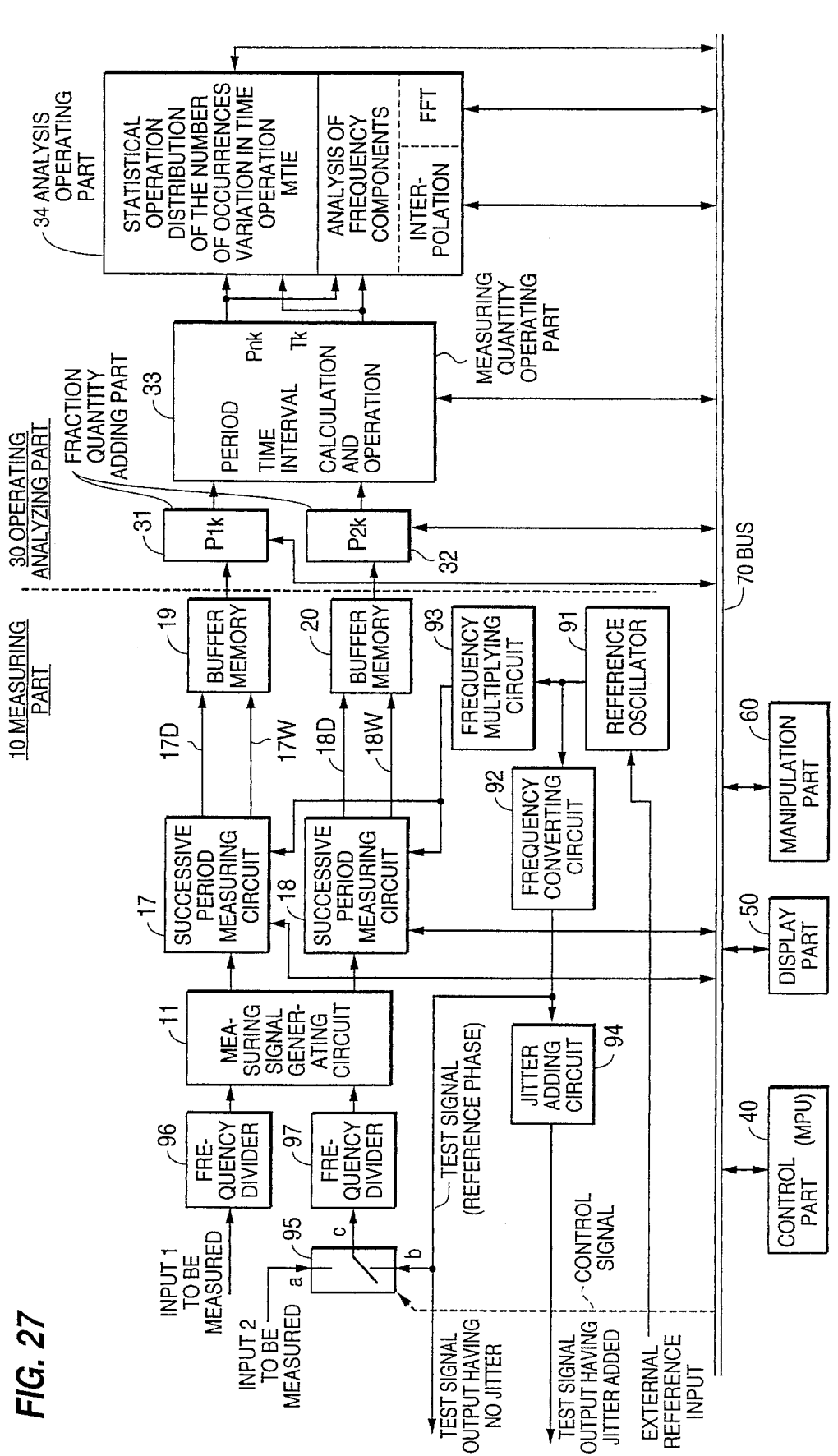
FIG. 27 is a block diagram showing the whole constitution of a second embodiment of a jitter analyzer according to the present invention.

FIG. 27 is a block diagram for showing the whole circuit construction of the second embodiment of the jitter analyzer according to the present invention. Further, for the purpose of making the explanation thereof clarity, the components or parts of FIG. 27 corresponding to those of the above first embodiment have the same characters affixed and the explanations thereof are omitted unless the need arises. The jitter analyzer of the present embodiment can measure continuously various quantities in the domain of time/frequency of a pulse-like signal to be measured, for example, period, time interval or the like thereof with a high accuracy, and also can manifest a time on acquisition of each data and analyze a statistical operation, a distribution of the number of occurrences, a variation relative to the time elapsed, MTIE (maximum time interval error), and a frequency component of a jitter as to the various quantities with a high precision. The jitter analyzer of the present embodiment comprises roughly a measuring part 10, an operating and analyzing part 30, a control part 40, a display part 50, and a manipulation or console part 60. The control part 40, the display part 50 and the manipulation part 60 are mutually connected to the measuring part 10 and the operating and analyzing part 30 via a bus 70.

The measuring part 10 comprises a measuring signal generating circuit 11, a reference oscillator 91, a frequency converting circuit 92, a frequency multiplying circuit 93, a jitter adding circuit 94, a switching circuit 95, first and second successive period measuring circuits 17 and 18, first and second buffer memories 19 and 20, and first and second frequency dividers 96 and 97.

The jitter analyzer of the present embodiment performs the analysis of jitters using the measured period data in the successive period measuring circuits. Since the two successive period measuring circuits 17, 18 are provided in this jitter analyzer, two signals to be measured can be inputted into the jitter analyzer and the analysis of a jitter as to each signal to be measured can be performed. The periods of the signals to be measured are continuously measured without any blank time as far as the successive period measuring circuits can. Also, two signals to be measured can be inputted into the jitter analyzer and the analysis of a relative jitter to the other input signal can be performed from the measured values of the time intervals of the two signals. In such case, the measured values of the time intervals are obtained by deriving the time intervals of the two signals from the elapsed times which are the cumulation of the measured period values in the two successive period measuring circuits 17, 18 and analyzing the values thereof.

On the other hand, since a long measuring time interval is needed to analyze a jitter of a low frequency, in the jitter analyzer of the present invention, the frequencies of signals to be measured are divided by the frequency dividers 96, 97 within the analyzer into suitable frequencies, respectively, to prolong respective measuring value acquisition intervals between the time durations in which measuring values are acquired, and consequently the overall measuring time interval is made long and the analysis of jitters of low frequencies can be performed.

For example, assuming that signals to be measured have a frequency of 2048 KHz, and the capacities of the buffer memories 19, 20 are 1M words, respectively, the dividing ratio in frequency thereof and the measuring time interval are as the following, and therefore, it is possible to perform the analysis of jitters having long periods.

| dividing ratio in frequency | measuring value acquisition interval | overall measuring time interval |
| --- | --- | --- |
| 1 | 488 ns | 488 ms |
| 2 | 977 ns | 977 ms |
| 4 | 1.95 μs | 1.95 s |
| 8 | 3.91 μs | 3.91 s |
| 16 | 7.81 μs | 7.81 s |
| 32 | 15.63 μs | 15.63 s |

Also, the present jitter analyzer can analyze wanders based on MTIE which has been advised by ITU/TS. In this case, likewise the examples of the wander measurement in the written advice thereof, a signal to be measured and an internal test signal to which no jitter is added are frequency divided by the frequency dividers 96, 97 into 4 KHz, respectively, and the successive periods of the two signals are measured. The measured period values are once stored in the buffer memories 19, 20, and the operating and analyzing part 30 sequentially reads the measured period values from the buffer memories 19, 20 as far as possible and adds the count values by the counting clock and the measured values of the fraction times to calculate the time interval values, and finds the maximum value and the minimum value of the measured values of the time intervals within the observation time set by a user and stores them in the memory (since the number of data is relatively low, the system memory of CPU is used). After the acquisition of all measuring values are end, the operating and analyzing part 30 calculates MTIE as to each observation times and displays data and a graph.

At this time, since the time duration of the measuring value acquisition interval is 250 μs, the observation time can be set only up to 250 s at most in case of the buffer memory capacity of 1M words. In order to solve this problem, the write of the measured data into the buffer memories is arranged so as to return to the first address thereof after data was written into the last address thereof by circulating the address counter. Because the time duration of the measuring value acquisition interval is relatively slow as much as 250 μs, CPU can read data sequentially without reservoiring the measured values, and so the circulation of the addresses is possible.

Moreover, in the present jitter analyzer, a test signal containing a jitter can be generated within the analyzer, and it is possible that by inputting this jitter-added test signal as a slave reference signal into a network clock supply apparatus or the like which is a device to be tested and inputting the slave synchronizing signal from the device to be tested into the present analyzer as a signal to be measured, the present analyzer analyzes the jitter contained in the signal to be measured and/or MTIE thereof thereby checking the unnecessary jitter output of the device to be tested and/or ascertaining the jitter suppressing effect, the jitter-resistant capability or the like of the device to be tested.

The measuring signal generating circuit 11 is arranged to receive independently two inputs (input 1, input 2) sent through the first and second frequency dividers 96 and 97, respectively, and a first pulse-like signal to be measured (input 1 to be measured) such as a pulse signal is supplied through the first frequency divider 96 to the measuring signal generating circuit 11 as an input 1, and also a second pulse-like signal to be measured (input 2 to be measured) such as a pulse signal or a test signal having a reference phase and no jitter added from the frequency converting circuit 92 is selected by the switching circuit 95 and the selected signal is supplied to the measuring signal generating circuit 11 as an input 2. The measuring signal generating circuit 11 determines sequences of edge inputs of signals to be measured in two systems. Further, as mentioned below, the measuring signal generating circuit 11 is constructed so as to be able to measure concurrently individual signals to be measured in two systems as to the periods thereof.

The switching circuit 95 has the movable contact "c" which is connected to the first fixed contact "a" thereof, in case an analysis of a jitter in each of two system-signals to be measured inputted into the present analyzer or a relative jitter thereof is desired to be performed, so that the input 2 to be measured is supplied through the second frequency divider 97 to the measuring signal generating circuit 11 as an input 2. On the other hand, when a wander is measured, the movable contact "c" is connected to the second fixed contact "b" so that the test signal of the reference phase supplied from the reference oscillator 91 through the frequency converting circuit 92 is supplied through the second frequency divider 97 to the measuring signal generating circuit 11 as an input 2. The switching circuit 95 selects either one of an external signal to be measured (input 2 to be measured) or the internal test signal of the reference phase in response to a command (a control signal) from the control part 40 and sends the selected one to the second frequency divider 97. The switching circuit 95 may be a mechanical switch such as a relay or the like, or a logical switch by a gate or gates.

The first frequency divider 96 inputs the input 1 to be measured into the measuring signal generating circuit 11 as it is without dividing it in frequency, in case of analyzing jitters of relatively high frequencies. Whereas, in case of analyzing jitters of low frequencies or wanders, the first frequency divider 96 divides in frequency the input 1 to be measured and thereafter inputs it into the measuring signal generating circuit The second frequency divider 97 divides in frequency a test signal of the reference phase to which no jitter is added supplied through the switching circuit 95 into 4 KHz and inputs it into the measuring signal generating circuit 11. Of course, likewise the first frequency divider 96, when the switching circuit 95 is connected to the side of the input 2 to be measured, the second frequency divider 97 divides in frequency the input 2 to be measured if necessary and inputs it to the measuring signal generating circuit 11. The first and second frequency dividers 96, 97 consist of programmable frequency dividers so as to be able to switch the ratio of the frequency division depending upon the measuring conditions.

The reference oscillator 91 is the time base of the jitter analyzer of the present embodiment, and an oscillator the frequency of which is very stable, for example, a quartz-crystal oscillator housed in a thermostatic chamber or the like is used. An external reference signal, for example, an external reference frequency signal synchronized with UTC (coordinated universal time), is supplied to the reference oscillator 91 to synchronize the oscillating frequency if necessary.

The output signal of the reference oscillator 91 is supplied to the frequency converting circuit 92 wherein the frequency thereof is converted into the frequency of the test signal. At the same time, the output signal of the reference oscillator 91 is also sent to the frequency multiplying circuit 93 wherein the frequency thereof is multiplied to create a counting clock for the successive period measuring circuits 18, and the counting clock is supplied to these successive period measuring circuits 17 and 18, respectively. The test signal from the frequency converting circuit 92 forms the reference phase when a wander is measured, and is applied through the switching circuit 95 and the second frequency divider 97 to the successive period measuring circuit 11 as the input 2, as described above. In addition, the test signal from the frequency converting circuit 92 is outputted to the outside as a pure test signal having no jitter in order to use in various tests, measurements or the like, and also is supplied to the jitter adding circuit 94 so that a test signal having a jitter added is outputted to the outside in order to use in various tests and measurements.

The jitter adding circuit 94 is one which artificially generates a jitter or jitters produced in, for example, various kinds of apparatus or devices and/or transmission lines, or a jitter or jitters within the allowable limits by ITU/TS, and the jitter adding circuit 94 outputs an jitter-added test signal in which a jitter of any waveform or frequency settable by a user is added to the test signal of the reference phase from the frequency converting circuit 92. In this case, the jitter adding circuit 94 creates a jitter-added test signal by making the test signal of the reference phase from the frequency converting circuit 92 the data input and the external clock input thereof. By inputting this jitter-added test signal from the jitter adding circuit 94 into, for example, a device to be tested such as a jitter eliminating circuit or the like, or a device to be tested such as a network clock supply apparatus or the like within an exchange and/or a transmission apparatus and inputting the output signal thereof into the present analyzer as a signal to be measured, the present analyzer can effect the analysis of the jitter suppressing effect, the jitter-resistant capability or the like of the device to be tested as well as the check of the unnecessary jitter output of the device to be tested.

Figure 28:
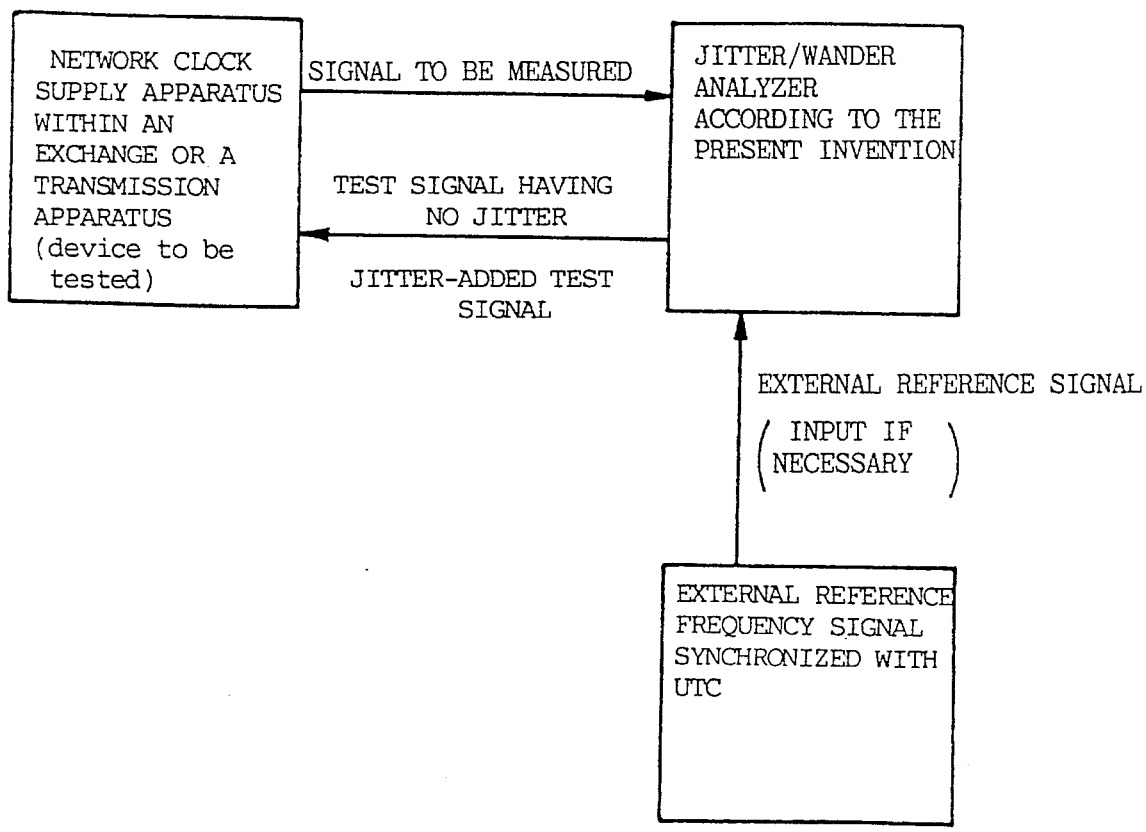
FIG. 28 is a block diagram showing an example of an apparatus for measuring and analyzing a jitter/wander of an outer device to be tested by using the jitter analyzer of FIG. 27.

FIG. 28 shows an example of circuit constructions in which test signals (having no jitter and a jitter added) are supplied from the jitter analyzer of the present embodiment to a network clock supply apparatus (device to be tested) within an exchange or a transmission apparatus and the output signal from the device to be tested is inputted into the present jitter analyzer as a signal to be measured whereby the present analyzer effects the analysis of the jitter suppressing effect, the jitter-resistant capability of the device to be tested as well as the check of the unnecessary jitter output of the device to be tested and the like. The frequency of the output clock signal of the network clock supply apparatus is generally either one of 1544 KHz (U.S.A., Japan, and some countries of Southeast Asia) or 2048 KHz (other countries), and this signal is inputted through the first frequency divider 96 to the measuring signal generating circuit 11 as the input 1 to be measured. The reason that the divided frequency by the first frequency divider is determined to 4 KHz is that a systematic diagram of measuring a wander by 4 KHz is described by way of example in the written advice of ITU/TS, and it is a matter of course that other divided frequencies may be used. Further, in case of analyzing jitters of relatively high frequencies, the output clock signal is inputted into the measuring signal generating circuit 11 as it is without frequency dividing it.

In the construction mentioned above, in case the switching circuit 95 is connected to the side of the input 2 to be measured and pulse signals are supplied as the inputs 1 and 2 to be measured through the first and second frequency dividers 96 and 97 to the measuring signal generating circuit 11, the measuring signal generating circuit 11 determines either one of the edge signals of the rise edges (positive edges) or fall edges (negative edges), and either one of the rise edge signals of the input 1 and the input 2 or the fall edge signals of the input 1 and the input 2 determined by the measuring signal generating circuit 11 are continuously supplied to the first and second successive period measuring circuits 17 and 18, and the periods of occurrence of edges of the supplied edge signals to be measured are continuously measured. The results of the measurements (period data) are sent via the data lines 17D and 18D to the first and second buffer memories 19 and 20 and the write pulses are sent via the write lines 17W and 18W to the first and second buffer memories 19 and 20, respectively. These buffer memories 19 and 20 store all the measured data sent via the data lines 17D and 18D therein by the write pulses applied via the write lines 17W and 18W to the buffer memories 19 and 20. The number of data stored in the these buffer memories is preset by a user through the manipulation part 60. The operating and analyzing part 30 at the subsequent stage 30 calculates the various quantities in the domain of time/frequency using the measured results stored therein.

The first and second successive period measuring circuits 17 and 18 may be the same construction with each other, and the measurement of the period is performed as explained in the above first embodiment with reference to FIG. 3 in case the positive edges of the input 1 to be measured are supplied to the first successive period measuring circuit 17 as a typical example. That is, a period P1k to be measured is a time interval between a positive edge E11 of the input 1 at a time T11 and a positive edge E12 thereof at the next time T12, and as shown in FIG. 3, this period P1k can be calculated by finding a time interval t1 from the edge E11 which is the starting edge of the period P1k to the second counting clock after the edge E11, a time interval t2 from the edge E12 which is the terminating edge of the period P1k to the second counting clock after the edge E12, and a time interval of N·T0 where N is the number of counting clocks generated during the time interval from the end of the time interval t1 to the end of the time interval t2 and T0 is the period of the clock. Namely, the equation P1k+t2=NT0+t1 is formed from the results t1, t2 and NT0, and so the period P1k is found by the following equation:

$P1k=N \cdot T0+t1-t2$

Here, the reason that the second counting clock after the edge is selected is that if the first counting clock after the edge is selected, the edge and the first clock are very close in time to each other and as a result it may be possible that the time intervals of t1 and t2 cannot be measured with a high accuracy, as mentioned above. Therefore, it goes without saying that if the time intervals of t1 and t2 can be measured with a high accuracy, the first counting clock immediately after the edge may be selected.

The first and second successive period measuring circuits 17 and 18 output data Np1kT0 and Np2kT0 (corresponding to time intervals) and data ΔVp1k and ΔVp2k among the data calculated and obtained as stated above to the first and second buffer memories 19 and 20, respectively, where Np1k is the number of counting clocks generated during the time interval from the end of the time interval t1 to the end of the time interval t2, Np2k is also the number of counting clocks generated during the time interval from the end of the time interval t1 to the end of the time interval t2, and T0 is the period of the counting clock. The data Np1kT0 and Np2kT0 are digital values and so they are outputted from the first and second successive period measuring circuits 17 and 18 without any conversion, whereas the fraction time intervals t1 and t2 are subtracted to obtain the difference (t1–t2) (also referred to as "fraction quantity") which is converted into a voltage which is further converted into the digital values ΔVp1k and ΔVp2k by an analog-digital converter (A/D converter). Further, k in the count values Np1k and Np2k is an integer of 1 to m, and m is the number of measurements set by a user. The cumulated value of the measured results of the successive period represents the time when the data was acquired. Accordingly, the times on acquisition of the data are also all measured.

Figure 29:
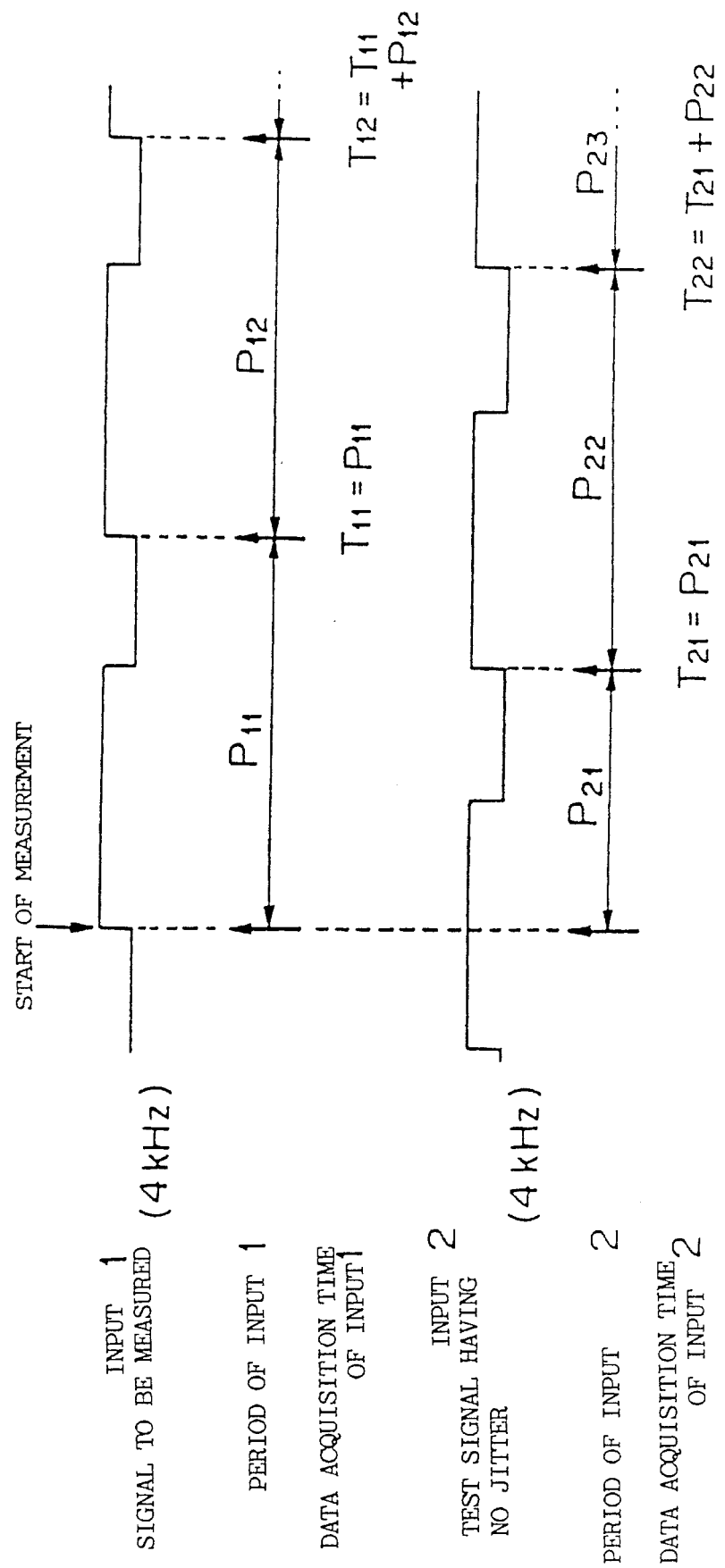
FIG. 29 is a timing chart for explaining how to accord the starting times of measurement of two successive period measuring circuits with each other in the jitter analyzer of FIG. 27.

In case of a relative jitter or a wander, it is needed to calculate or compute a time interval value from the difference between the period data acquisition times of the first and second successive period measuring circuits 17 and 18, and therefore it is necessary to accord the measurement start times of both circuits with each other. In case the measuring signal generating circuit 11 supplies, for example, positive edges of the measured signal of 4 KHz to the first successive period measuring circuit 17 as the input 1, and positive edges of a test signal of 4 KHz having no jitter are inputted into the second successive period measuring circuit 18 as the input 2, as shown in FIG. 29, a sequence is arranged by the measuring signal generating circuit 11 such that after the measurement is started, the second successive period measuring circuit 18 measures a time from the rise of the measured signal to the rise of the test signal only during a time duration immediately after the start of the measurement. That is, the measurement is started from the rise of the measured signal of the input 1, and the second successive period measuring circuit 18 measures a time interval P21 from this measurement start time to the first rise of the test signal at a time T21, which is stored as the initial time offset value (P21) thereby according the measurement start times.

As described above, the first and second buffer memories 19 and 20 store all the period data measured by the first and second successive period measuring circuits 17 and 18. The number of data stored in the buffer memories 19 and 20 is preset by a user through the manipulation part 60. The data stored in the buffer memories 19 and 20 are used by the operating and analyzing part 30 at the subsequent stage, in order to measure various quantities in time/frequency domain of the measured signal, for example, a period, a time interval or the like thereof, and also to analyze a statistical operation, a distribution of the number of occurrences, a variation relative to the elapsed time, MTIE, and a frequency component or components as to these various quantities.

The operating and analyzing part 30 comprises, in the present embodiment, first and second fraction quantity adding parts 31 and 32, a measuring quantity operating part 33, and an analysis operating part 34.

The first and second fraction quantity adding parts 31 and 32 turn the digital values (ΔVp1k, ΔVp2k) of the voltages corresponding to the times of the fraction quantities which cannot be measured out by the counting clock into data in time domain, and add the turned data to the period data (Np1kT0, Np2kT0) which were measured out by the counting clock thereby calculating or computing the final period data (P1k, P2k), respectively, based on the equations of calculation mentioned above. That is:

$P1k=Np1kT0+\Delta Vp1k$ $P2k=Np2kT0+\Delta Vp2k$

As an example, in case that the fraction quantity time t1–t2 is ΔT ns, Np1k and Np2k are N, ΔVp1k and ΔVp2k are ΔV, the number of digital bits of the voltages corresponding to the fraction quantity times in the A/D converters of the successive period measuring circuits 17 and 18 is 12 bits, and the period T0 of the counting clock is 10 ns, assuming that the voltages of sample and hold circuits, as described later, of the successive period measuring circuits 17 and 18 were –2048, –1024, 0, +1024, 2048 mV, and the outputs (ΔV) of the A/D converters thereof were 0, 1024, 2048, 3072, 4096 counts when ΔT=–20, –10, 0, 10, +20 ns, then the period P (=P1k=P2k) to be found is:

$$\begin{aligned}P &= NT0+\Delta T\\&= NT0+(\Delta V-2048)T0/1024\\&= T0(N+\Delta V-2048)/1024\end{aligned}$$

Assuming T0=1000, the above equation is as follows:

$P=1000(N-2+\Delta V/1024)$

Accordingly, if the A/D converters have an accuracy of 1 bit, the measurement up to 10 ps can be performed. Further, the relation of 10 ns=1024 mV can be formed by appropriately setting C, R or a voltage of the integrator of each of the fraction time measuring circuits.

The measuring quantity operating part 33 calculates or computes a period Pnk and a time interval Tk of the measured signal, and the acquisition times of the measured data using the final period data obtained in the fraction quantity adding parts 31, 32. Where n denotes an input channel number (a channel supplied with the input 1 to be measured is the input channel 1 and a channel supplied with the input 2 to be measured or the test signal is the input channel 2), and k=1 to m and m is the number of the measurements set by a user. Now, a method of calculating or computing a period Pnk and a time interval Tk will be described.

The period Pnk, when the measured signals in two systems (the measured input 1 and the measured input 2 or the test signal having no jitter) are supplied to the input channel 1 and the input channel 2 of the measuring signal generating circuit 11, are calculated by the first and second fraction quantity adding parts 31 and 32 as P1k for the period of the measured signal (input 1) on the input channel 1 and as P2k for the period of the measured signal (input 2) on the input channel 2 based on the above-mentioned equations of calculation. These periods are as shown in FIG. 4 likewise the case of the above first embodiment. As is apparent from FIG. 4, the periods of the measured signals in two systems supplied to both the input channels can be measured concurrently.

Next, a case of measuring a time interval between a measured signal supplied to the input channel 1 and a measured signal supplied to the input channel 2 will be described. As is described before, in the specification of the present application the difference between specified edges of two signals having the same rate is referred to as "time interval".

Figure 30:
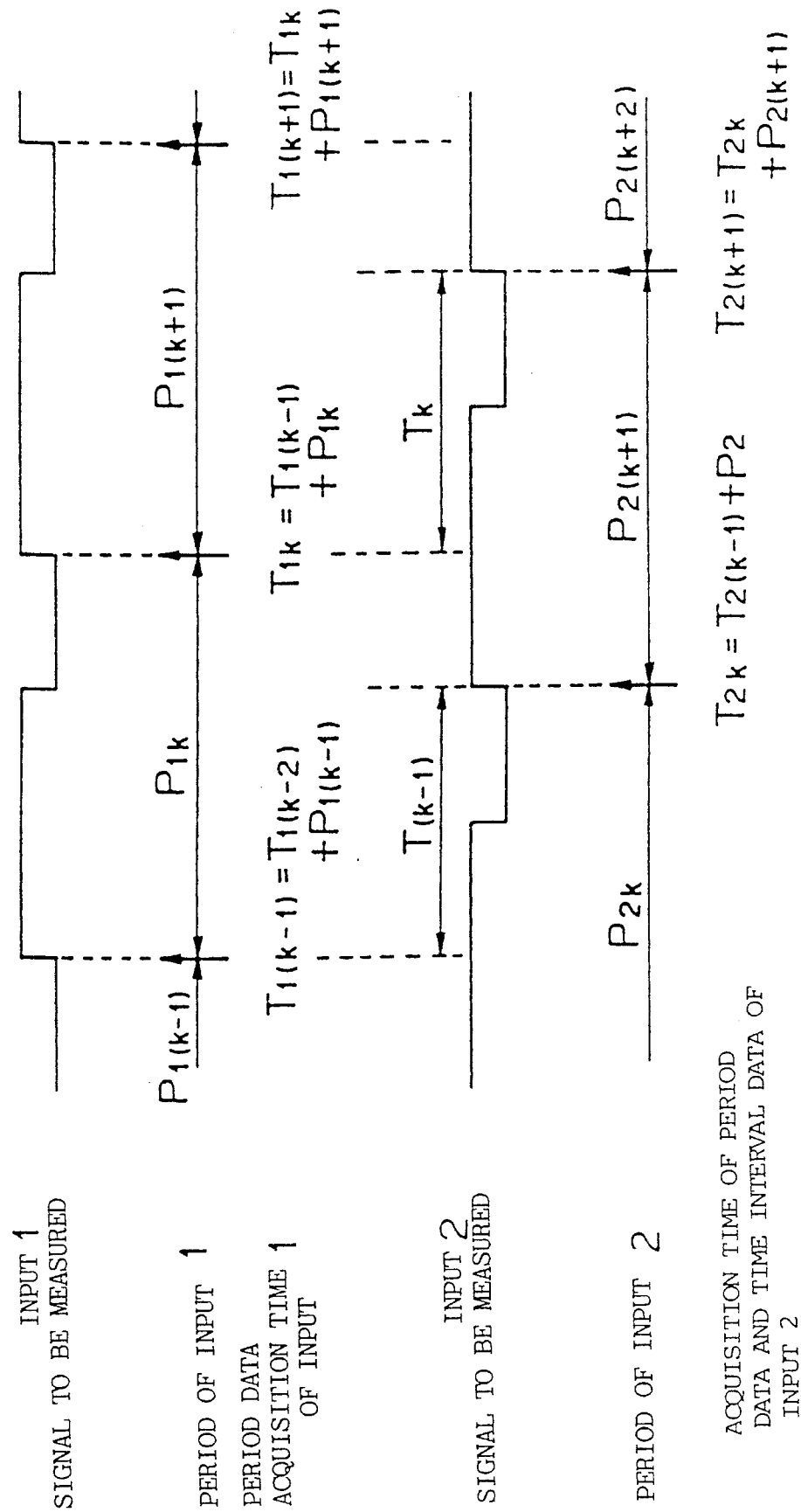
FIG. 30 is a timing chart for explaining the operation of the jitter analyzer of FIG. 27 in case of measuring a time interval between two input pulses.

The time interval Tk can be calculated or computed, as is apparent from FIG. 30, by subtracting the time of a positive edge T1k (typical example) of the input 1 from the time of a positive edge T2(k+1) (typical example) of the input 2. That is:

$$Tk=T2(k+1)-T1k$$

since T2(K+1)=T2K+P2(k+1) and T1k=T1(k−1)+P1k, the time interval Tk can be calculated from the periods P1k and P2(k+1) and the occurrence times T1(k−1) and T2k of positive edges of the input 1 and the input 2.

The various quantities in time/frequency domain, the period and the time interval in the present embodiment, arithmetically operated by the measuring quantity operating part 33 as described above are analyzed in the analysis operating part 34 as the case may be. Main analysis methods are of a statistical operation, a distribution of the number of occurrences, a variation in time (variation relative to the elapsed time), an operation of MTIE, and a jitter frequency component as shown in the block of FIG. 27. These analysis methods will be described briefly.

The analysis method of a statistical operation is a method in which an analysis is performed by using mean, variance, sample variance, standard deviation, sample standard deviation, maximum value, minimum value, Allan variance, root of Allan variance, normalization, ±offset, and multiplication and division of constant, of the calculated or computed data.

The analysis method of distribution of the number of occurrences is a method in which an analysis is performed by putting a measuring quantity, for example, a period Pk (a time interval can be) the abscissa and putting the number (frequency) of the period Pk obtained on the ordinate, and displaying a distribution of the frequency, as explained with reference to FIG. 7.

The analysis method of variation in time is a method in which an analysis is performed by putting a time elapsed tk on the abscissa and putting a measuring quantity, for example, a period Pk, on the ordinate, and displaying a variation of the period Pk relative to the time, as explained with reference to FIG. 8.

Next, the operation of MTIE (maximum time interval error) will be described.

In the measurement of a wander, from the maximum value of the time interval values within the observation time set by a user is subtracted the minimum value thereof, and the result is made an MTIE. The range of the observation time set by a user is assumed to be one from 50 msec to $10^7$ sec in the jitter analyzer of the present embodiment, in consideration of the advice of ITU/TS and the reality of the measuring time duration. For the purpose of briefly explaining an example of calculating or computing an MTIE, in the following description the observation time is set stepwise by decade unit except 50 msec, but other finer setting of the observation time can be effected though the minimum step is 250 μs.

Figure 31:
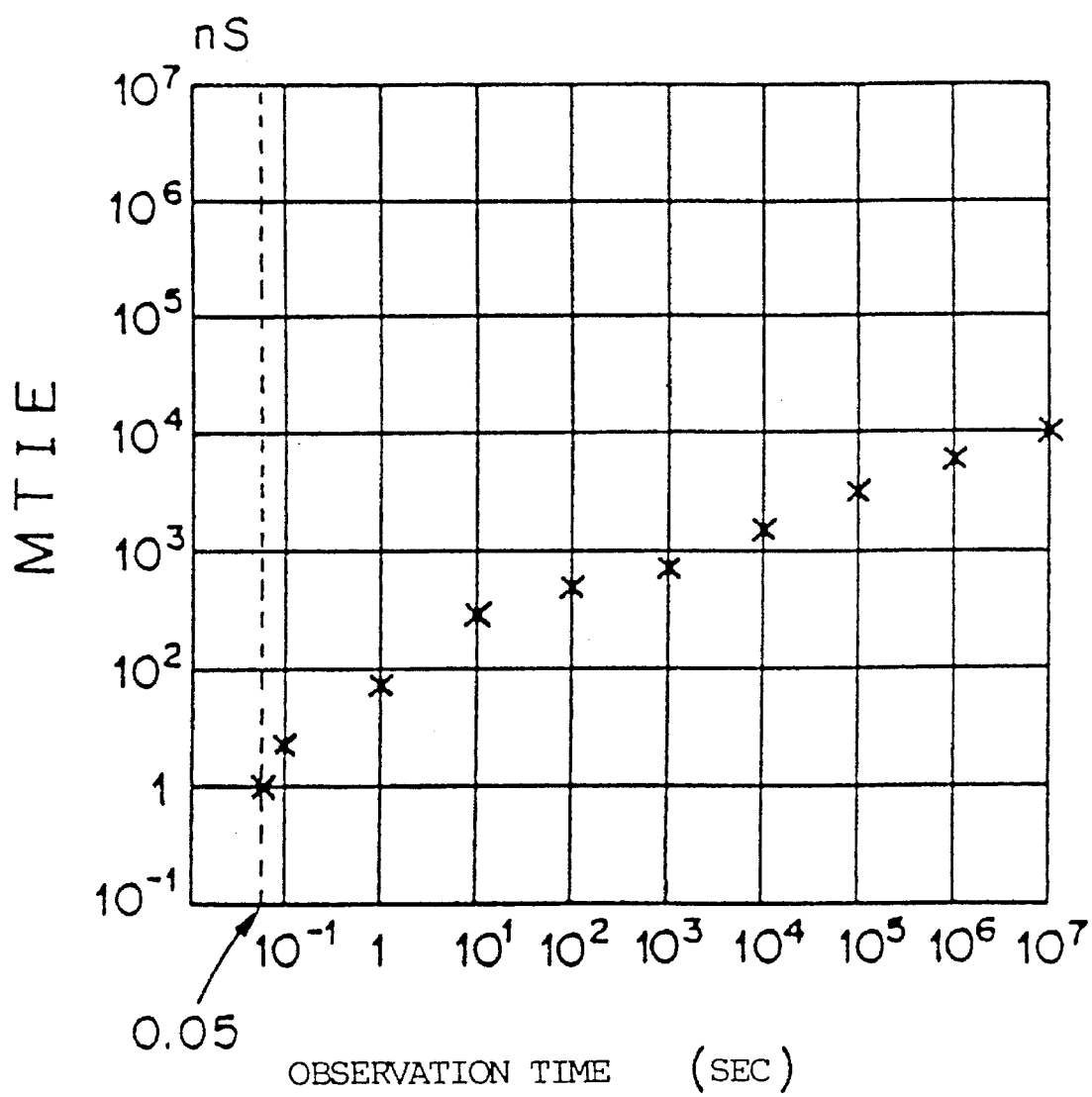
FIG. 31 is a graph explaining the operation for calculating a MTIE.

Also, an MTIE in an observation time shorter than the set observation time can be calculated at the same time by the following point, and it is possible to calculate MTIE's in different observation times by one measurement and to display them by a graph. examples of set values by a user for observation time: $5\times10^{-2}$ sec, $10^{-1}$ sec, $10^{0}$ sec, $10^{+1}$ sec, $10^{+2}$ sec, $10^{+3}$ sec, $10^{+4}$ sec, $10^{+5}$ sec, $10^{+6}$ sec, $10^{+7}$ sec Now, a case that the observation time is set to the maximum value of $10^{+7}$ sec will be described.

a) After the start of the measurement, the maximum value Xmax(1) and the minimum value Xmin(1) of the time interval values are detected at the time that a time duration of $5\times10^{-2}$sec which is the shortest observation time has elapsed, and these values Xmax(1) and Xmin(1) are stored in a memory. The measurement continues as it stands.

b) After a further time duration of $5\times10^{-2}$ sec has elapsed, namely, at the time that a time duration of $10^{-1}$ sec has elapsed from the start of the measurement, the maximum value Xmax(2) and the minimum value Xmin(2) of the time interval values are detected and are stored in the memory. The measurement continues as it stands.

c) After a further time duration of $9\times10^{-1}$ sec has elapsed, namely, at the time that a time duration of $10^0$ sec has elapsed from the start of the measurement, the maximum value Xmax(3) and the minimum value Xmin(3) of the time interval values are detected and are stored in the memory. The measurement continues as it stands.

d) Thereafter, in the same manner as stated above, the maximum value Xmax(n) and the minimum value Xmin(n) of the time interval values are detected and are stored in the memory until a time duration of $10^7$ sec which is the longest observation time has elapsed.

e) After the time duration of $10^7$ sec has elapsed, the subtraction of the minimum value Xmin(n) from the maximum value Xmax(n) is performed thereby calculating MTIE's, and a graph of observation time versus MTIE as shown in FIG. 31 is displayed.

$$MTIE=Xmax(n)-Xmin(n)$$

f) Also, a long-term frequency deviation (Δf/f) is calculated from the MTIE thus calculated.

$$\Delta f/f=MTIE/\text{observation time}$$

The analysis method of jitter frequency component is a method in which an analysis is performed by fast Fourier transforming the variation relative to the elapsed time as to the measured period or time interval by the FFT part (fast Fourier transform part) and deriving a frequency spectrum of the jitter therefrom. The measuring quantity data obtained from the present analyzer are not data which have been measured at a regular time intervals, and so they are converted into the measuring quantity data which would have been obtained when measured at regular time intervals in the interpolation part using a interpolation method based on the measuring quantity data and the acquisition time data thereof.

One example of the interpolation methods used in the interpolation part will be shown. Assuming that each of the measured period data obtained in the first and second fraction quantity adding part 31 and 32 of the operating and analyzing part 30 is $P_1, P_2, P_3, \ldots$, these period data are added with their preceding measured values for each measuring cycle, and the added values thereof are stored as $P_1=t_1$, $P_1+P_2=t_2$, $P_1+P_2+P_3=t_3, \ldots$ in an elapsed time memory (not shown). These times $t_1, t_2, t_3, \ldots$ are representative of elapsed times from the start of the measurement, and it is shown that at time 0 the measured value $P_1$, of the period has been obtained, at time $t_1$ the measured value $P_2$ of the period has been obtained, and at time $t_2$ the measured value $P_3$ of the period has been obtained. If the lapse of time in the variations of the period Pk is shown based on these values, it is, for example, as shown in FIG. 10A wherein the measured values Pk have been obtained at irregular time intervals, as in the case of the above-mentioned first embodiment.

The period data Psk which can be regarded as having been obtained by measuring periods at regular time intervals are calculated or computed in the interpolation part from the measured period data Pk. For example, in FIG. 10A, the period data which are regarded as having been obtained by measuring periods at sampling points $S_0$, $S_1$, $S_2$, . . . at regular time intervals starting at time 0 are found by use of a linear interpolation method which can be easiest to utilize. The eight period data Pk measured are represented at the coordinates (tk, Pk) as 1 (0, $P_1$), 2 ($t_1$, $P_2$), 3 ($t_2$, $P_3$), 4 ($t_3$, $P_4$), . . . , 8 ($t_7$, $P_8$), respectively. It is a matter of course that the period at the sampling point $S_0$ is $P_1$. The sampling point $S_1$ is found as follows. That is, assuming that a straight line 44 passing through three points ($t_1$, $P_2$), ($S_1$, $P_{s1}$), and ($t_2$, $P_3$) shown in FIG. 10B is P=At+B, $$A=(P_2-P_3)/(t_1-t_2)$$

$$B=(t_1P_3-t_2P_2)/(t_1-t_2)$$

Substitution of A, B and $S_1$ into the equation of the straight line gives the following equation:

$$P_{s1}=S_1(P_2-P_3)/(t_1-t_2)+(t_1P_3-t_2P_2)/(t_1-t_2)$$

Thus, the period $P_{s1}$ at the sampling point $S_1$ is found. Similarly, the periods $P_{s2}$, $P_{s3}$, $P_{s4}$, . . . can be found.

The period data $P_{sk}$ (data indicated by a mark X in FIG. 10A) at regular time intervals thus obtained are subjected to the fast Fourier transform in the FFT part. By displaying the frequency spectrum of the transformed results on a display device (not shown) of the display part 50, a display shown in FIG. 10C, for example, can be obtained. The frequency components of the fluctuation (jitter) of the periods Pk can be known from such display. In this case, the values of the periods Pk or the mean values thereof can be also displayed at the same time or the above frequency spectrum can be also displayed as a ratio thereof relative to Pk. Further, the percentage of the jitter to the period can be also found. To increase the precision of the period data $P_{sk}$ which can be regarded as having been obtained at regular time intervals, a spline method or other interpolation methods can be used.

Next, the respective parts of the analyzer of the present embodiment will be described in detail. It is desired as described before that the measuring part 10 can continuously acquire data without omitting them possibly and the time when the data was acquired (the time elapsed) can be accurately known. At first, specific examples of the measuring signal generating circuit 11, the switching circuit 95, and the first and second frequency dividers 96 and 97 are described with reference to FIG. 32, respectively.

The measuring signal generating circuit 11 comprises first, second, third and fourth, four D-type flip-flops F1, F2, F3 and F4, two OR gates G2 and G3, an exclusive-OR gate G4, an AND gate G5, and a delay circuit DL, and the input 1 from the first frequency divider 96 is supplied to the trigger terminal T of the first D-type flip-flop F1 and the input 2 from the second frequency divider 97 is supplied to the trigger terminal T of the third D-type flip-flop An external trigger input signal for starting the measurement is supplied to the trigger terminal T of the fourth D-type flip-flop F1 the data terminal D of which has a high level signal H applied thereto, and the high level signal H is supplied from the output terminal Q of the flip-flop F4 to the data terminal D of the first D-type flip-flop F1. The output terminal Q of the D-type flip-flop F1 is connected to the first successive period measuring circuit 17 and the trigger terminal T of the second D-type flip-flop F2, respectively, and the high level signal H applied to the data terminal of the flip-flop F2 is outputted from the output terminal Q thereof.

The high level signal H is also applied to the data terminal D of the second D-type flip-flop F2, and the output terminal Q of the flip-flop F2 is connected to the data terminal D of the third D-type flip-flop F3 and one input of the AND gate G5, and also connected to one input of the exclusive-OR gate G4 through the delay circuit DL. The other input of the exclusive-OR gate G4 has the output $\overline{Q}$ (logical inversion of Q) of the third D-type flip-flop F3 connected thereto, and the output of the exclusive-OR gate G4 is connected to the other input of the AND gate G5. The output of the AND gate G5 is connected to the second successive period measuring circuit 18. These delay circuit DL, the exclusive-OR gate G4 and the AND gate G5 serve as a pulse shaping function part for shaping a pulse waveform.

The first and second frequency dividers 95 and 97 have the same circuit construction with each other, and the first frequency divider 96 comprises a programmable frequency divider PD1 and a latch LT1, and the second frequency divider 97 also comprises a programmable frequency divider PD2 and a latch LT2, and these programmable frequency dividers are arranged such that the ratio of frequency division thereof can be changed depending upon the measuring conditions, as described before. The data preset by a user is inputted from the latches LT1, LT2 into the preset data terminals of the programmable frequency dividers PD1, PD2, respectively.

The switching circuit 95 is a logical switch which comprises two AND gates AG1, AG2, an inverter INV, and an OR gate, but may be a mechanical switch such as a relay or the like. This switching circuit 95 supplies the test signal of the reference phase from the frequency converting circuit 92 to the second frequency divider 97 when a switch (SW) control signal (a high level) is inputted thereinto from the control part 40, and, when the switch (SW) control signal is not inputted thereinto from the control part 40 (or a switch control signal of a low level is inputted thereinto), supplies the measured input 2 to the second frequency divider 97.

Figure 32:
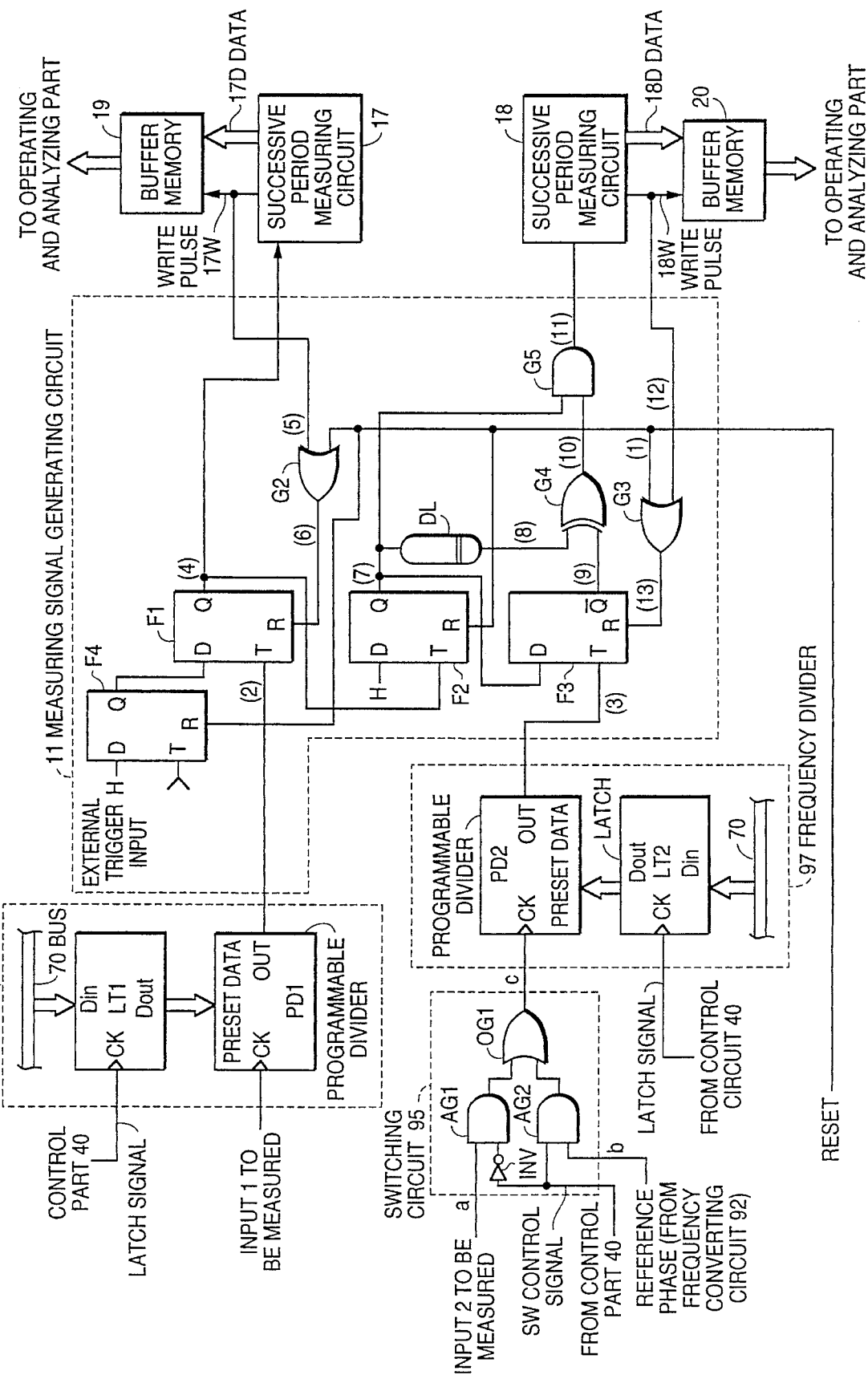
FIG. 32 is a block diagram schematically showing a measuring signal generating circuit, frequency dividers, and a switching circuit used in the jitter analyzer of FIG. 27.

With the construction as mentioned above, it is obvious that, when an external trigger signal is inputted into the trigger terminal T of the fourth D-type flip-flop F4 in the measuring signal generating circuit 11, the measurement operation is started, and the switching circuit 95 determines, in response to the switch control signal inputted from the control part 40, whether the measured input 2 or the test signal of the reference phase is to be supplied, and the input 1 and the input 2 are supplied to the measuring signal generating circuit 11 whereby the edges to be measured thereof are continuously generated, and the edges generated are supplied to the first and second successive period measuring circuits 17 and 18, and hence the numbers (1) to (13) of the waveforms at respective portions shown in FIG. 12 are shown in FIG. 32 and the explanation of the operation thereof is omitted. As in the case of the first embodiment, the waveforms shown in FIG. 12 are ones in case positive pulse signals having the pulse widths of Wx1, Wx2, Wx3, . . . as shown are inputted into the the trigger terminal T of the first flip-flop F1 as the input 1, and positive pulse signals in the form of the inverted versions of the waveforms of the input 1 are inputted into the the trigger terminal T of the third flip-flop F1 as the input 2.

Some explanation will be added. The second and fourth D-type flip-flops F2 and F4 are reset directly by the reset pulse (see waveform (1)), and the first D-type flip-flop F1 is reset through the OR gate G2 and the third D-type flip-flop F3 is reset through the OR gate G3 by the reset pulse (1), respectively, and simultaneously therewith the first and second successive period measuring circuits 17 and 18 are reset by the reset pulse (1). Also, the output Q of the first D-type flip-flop F1 is inverted by the rise edge of the input 1 so that the first D-type flip-flop F1 operates. In this respect, the first successive period measuring circuit 17 is arranged such that after a predetermined time period has elapsed from the time that the output Q of the first D-type flip-flop F1 was inverted, the first successive period measuring circuit 17 generates the write pulse (see waveform (5)) thereby writing the measured data (periods Pr1, Pr2, ... between the rise edges) into the buffer memory 19. This is for the sake of allowing for the time interval which is deemed to be needed by the first successive period measuring circuit 17 for dealing with in the inside thereof. The time interval tM1 in FIG. 12 is this time interval (including the generation of the write pulse (5)) which is deemed to be needed by the first successive period measuring circuit 17 for dealing with in the inside thereof.

The second successive period measuring circuit 18 is similarly arranged that the output $\overline{Q}$ of the third D-type flip-flop F3 is inverted by the rise edge of the input 2 (see waveform (3)) which rise edge is generated at the same time that the fall edge at the trailing edge of the pulse width Wx1 of the input 1 is generated, and after a predetermined time period has elapsed from the time that the output $\overline{Q}$ of the third D-type flip-flop F3 was inverted, the second successive period measuring circuit 18 generates the write pulse (see waveform (12)) thereby writing the measured data (periods Pf1, Pf2, ... between the fall edges) into the buffer memory 20. The time interval tM2 in FIG. 12 is the time interval (including the generation of the write pulse (12)) which is deemed to be needed by the second successive period measuring circuit 18 for dealing with in the inside thereof.

The first and third D-type flip-flops F1 and F3 are reset by the generation of the write pulses (5) and (12) through the OR gates G2 and G3, whereas the second D-type flip-flop F2 retains the high level at its output Q as it is because no reset pulse is applied thereto. In this respect, since the output Q of the second D-type flip-flop F2 is supplied to one input of the exclusive-OR gate G4 after delayed by a time interval t in the delay circuit D1, a pulse of the pulse duration t (see waveform (11)) is first generated from the AND gate G5. On the generation of this pulse it is possible to accord the measurement start times of the first and second successive period measuring circuits 17 and 18 with each other. Also, among the periods between the fall edges Pf1, Pf2, ... outputted from the AND gate G5, the first period Pf1 is equal to the pulse width Wx1 of the input 1. The contents of data (in case the duty ratio is near to 100%) written into the buffer memories 19 and 20 in such manner are as shown in FIG. 13, and also the equation of calculating or computing the pulse width is as described above. That is:

pulse width $Wxn=Wx(n-1)+Pfn+Pr(n-1)$

Further, specific examples of the first and second successive period measuring circuits 17, 18 may have the same circuit composition as that shown in FIG. 15, and the explanation thereof is omitted. That is, the circuit compositions of the successive period measuring circuits 17, 18 may be ones in which the fraction time intervals t1, t2 and data Np1kT0, Np2kT0 which are data of multiplying Np1k by T0 and Np2k by T0 can be calculated or computed, where Np1k and Np2k are the number of counting clocks generated during the time interval from the end of the time interval t1 to the end of the time interval t2, respectively, and T0 is the period of the counting clock, and among the data calculated, the data Np1kT0, Np2kT0 can be outputted as they are, and as to the fraction time intervals t1 and t2, the digital values $\Delta Vp1k$ and $\Delta Vp2k$ can be outputted, which are obtained by converting the difference (t1–t2) into a voltage and further converting the voltage into the digital values by an A/D converter.

Likewise, specific examples of the first and second buffer memories 19, 20 may have the same circuit composition as that shown in FIG. 16, and the explanation thereof is omitted. As is described above, the buffer memories 19, 20 are formed in a type of circulating ones in which, when a memory address has reached the last value of the address counter, it returns to the initial value, and the operating and analyzing part is adapted to read the measured values from the buffer memories 19, 20 in parallel with the acquisition of the measured values thereby sequentially performing the calculation or computation of the maximum value and the minimum value of the time interval values within the observation time set by a user.

Figure 33:
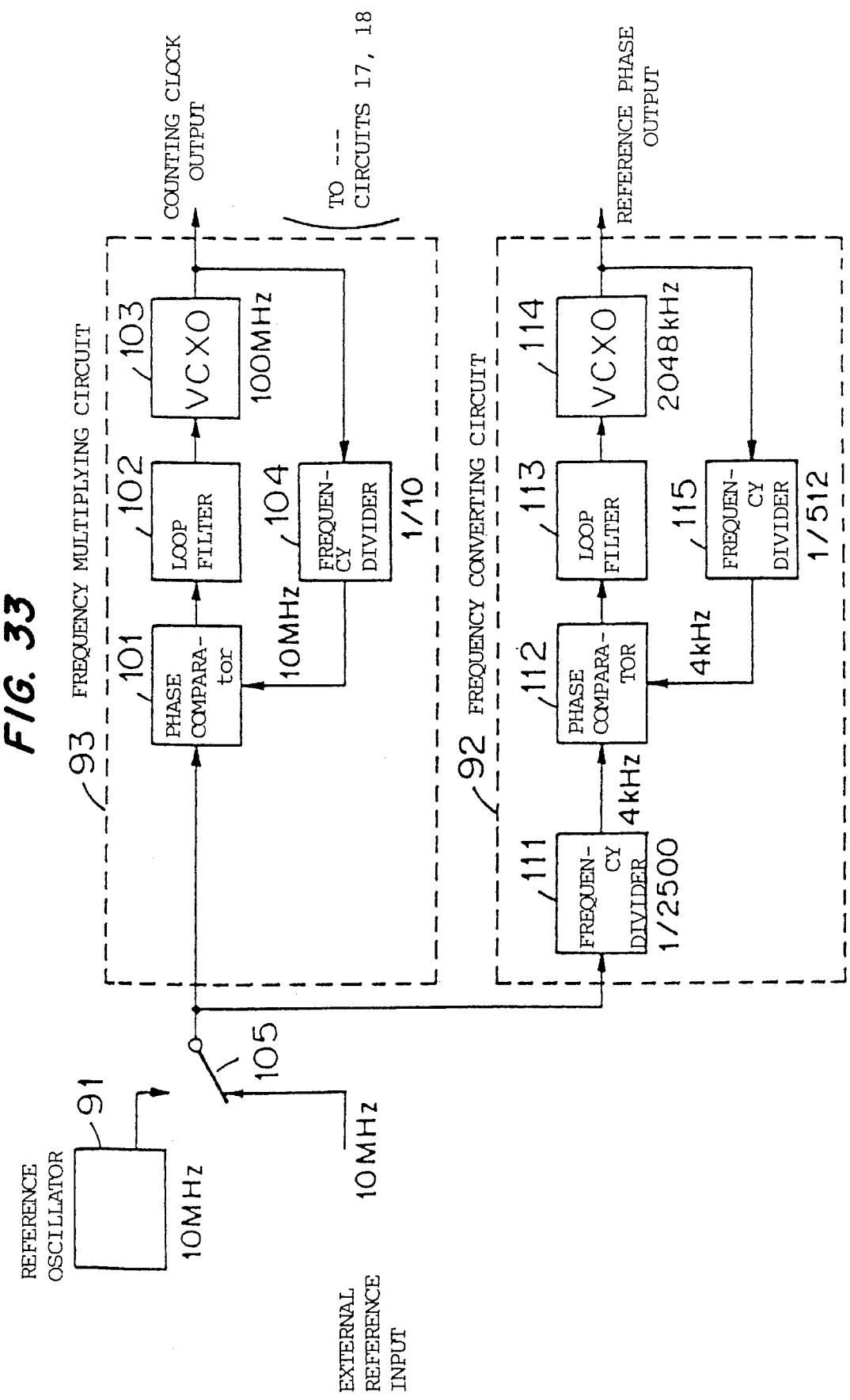
FIG. 33 is a block diagram schematically showing a frequency converter circuit and a frequency multiplier circuit used in the jitter analyzer of FIG. 27.

Specific examples of the frequency converting circuit 92 and the frequency multiplying circuit 93 are shown in FIG. 33. The following general conditions are applied to these circuits by way of example:

output frequency of reference oscillator: 10 MHz frequency of external reference input : 10 MHz frequency of counting clock : 100 MHz frequency of output of reference phase: 2048 KHz The frequency multiplying circuit 93 converts the output frequency of the reference oscillator 91 into a frequency of the counting clock by PLL (phase locked loop). By reason that the circuit can be formed of general purpose IC's (TTL, C-MOS, ECL and the like) which are commercially available, the frequency of the counting clock is set to 100 MHz or so, and there is used a voltage controlled oscillator using a quartz-crystal oscillator (VCXO) which has a low phase noise as the voltage controlled oscillator (VCO) forming PLL.

PLL forming the frequency multiplying circuit 93 comprises, as usual, a phase comparator 101 into which the output frequency signal of the reference oscillator 91 is inputted, a loop filter 102 for filtering the output signal from the phase comparator 101, a VCXO 103 the oscillating frequency of which is controlled by the voltage of the filtered signal by the loop filter 102, and a frequency divider 104 for dividing the frequency of the oscillation output from the VCXO 103 by 10. The frequency divided output of the frequency divider 104 is inputted into the phase comparator 101 wherein it is compared with the output signal from the reference oscillator 91. To divide the frequency by 10 in the frequency divider 104 is due to that the output frequency of the reference oscillator 91 is set to 10 MHz and the oscillating frequency of the VCXO 103 is set to 100 MHz.

Further, in this example, the output signal from the reference oscillator 91 is inputted through a change-over switch 105 into the frequency multiplying circuit 93 and the frequency converting circuit 92. The switch 105 switches between the output signal from the reference oscillator 91 and an external reference frequency signal (for example, a signal synchronized with UTC), and so in case that an external reference signal having the same frequency as the oscillation frequency of the reference oscillator 91 can be obtained, this external reference frequency signal can be used in place of the reference oscillator 91. Accordingly, in this case, the the reference oscillator 91 may be omitted.

In addition, though the scale of the circuitry is somewhat large, it is possible to constitute the frequency multiplying circuit 93 by an overdrive circuit and a tuning filter without using PLL. In this case, it is preferred to select a tuning filter which is strongly resistant to change in temperature and has a high Q.

The frequency converting circuit 93 converts the output frequency of the reference oscillator into a reference phase signal required when a wander is measured by PLL. Because of the reference phase, there is also used a VCXO which has a low phase noise as the voltage controlled oscillator (VCO) of PLL forming the frequency converting circuit 92. PLL forming the frequency converting circuit 92 has the same circuit construction and operates in the same manner as PLL of the frequency multiplying circuit 95 except that the output frequency from the reference oscillator 91 or an external reference frequency signal (10 MHz) is divided by 2900 in the frequency divider 111 to input the 4 KHz signal into the phase comparator 112, and that a frequency signal of 2048 KHz is oscillated from the VCXO 114 and is divided by in the frequency divider 115 to create the 4 KHz signal which is in turn inputted into the phase comparator 112, and therefore the explanation thereof is omitted. Further, the output signal of the phase comparator 112 is inputted into the VCXO 114 after it is filtered by the loop filter The frequency signal of the reference phase (test signal) from the frequency converting circuit 92 is supplied to the switching circuit 95 and the jitter adding circuit 94, as described above. Also, the frequency signal is taken out to the outside from a terminal not shown as a test signal having no jitter. Though a test signal of 2048 KHz is shown in this example, test signals of 1544 KHz and 2048 KHz are mainly used, and in case of using a test signal of 1544 KHz, it is necessary only to change the set values. Since it would be well that a user can utilize either one of the test signals, which is necessary for the user's country, it is not always necessary to generate both frequency signals. Therefore, in practice, if the frequency converting circuit 92 is mounted on an option board, a user is easy to change the test frequency by replacing the option board.

A specific example of the jitter adding circuit 94 is shown in FIG. 54. The jitter adding circuit 94 is one which artificially generates a jitter or jitters produced in, for example, various kinds of apparatus or devices and/or transmission lines, or a jitter or jitters within the allowable limits by ITU/TS, and the jitter adding circuit 94 outputs an jitter-added test signal in which a jitter of any waveform or frequency settable by a user has been added to the test signal of the reference phase from the frequency converting circuit 92. The jitter adding circuit 94 comprises a re-timing flip-flop RF1 for effecting the re-timing of a test signal PA (digital signal) of the reference phase to which a jitter is to be added, a frequency multiplier MP10 for multiplying the frequency of the test signal of the reference phase by 2 to create a clock signal PB from the test signal of the reference phase, an inverter INV10 for inverting the output signal of the multiplier MP10, a delay circuit DL11 for delaying the inverted output of the inverter INV10, a $2^n$ multiplier MP11 for multiplying the delayed clock signal by $2^n$, an n bit binary counter BCT1, an m bit address counter ADT1, a RAM, a microcomputer MC1, AND gates AG31 and AG32, and exclusive-OR gates EG1, EG2, ... EGn. The AND gate AG32 and the exclusive-OR gates EG1, EG2, ... EGn form an accord detecting circuit.

The jitter adding circuit 94 outputs the digital signal PJ (test signal) to which a jitter has been added from the output terminal Q of the re-timing flip-flop RF1, by inputting the test signal of the reference phase from the frequency converting circuit 92 into the data terminal D of the re-timing flip-flop RF1 as the digital signal PA to which a jitter is to be added, and by giving the test signal of the reference phase to the frequency multiplier MP10 thereby multiplying the test signal by 2, and thereafter inverting the multiplied test signal in the inverter INV10 thereby generating the clock signal PB, and creating a trigger signal for effecting the re-timing of the digital signal PA from the clock signal PB by the $2^n$ multiplier MP11, the n bit binary counter BCT1, the m bit address counter ADT1, the RAM, the AND gates AG31 and AG32, and the exclusive-OR gates EG1, EG2, ... EGn under the control of the microcomputer MC1, and giving the trigger signal to the trigger terminal T of the re-timing flip-flop RF1 from the AND gate AG31.

By inputting this jitter-added test signal PJ from the jitter adding circuit 94 into, for example, a device to be tested such as a jitter eliminating circuit or the like, or a device to be tested such as a network clock supply apparatus or the like within an exchange and/or a transmission apparatus and inputting the output signal thereof into the jitter analyzer of the present embodiment as a signal to be measured, the present analyzer can effect the analysis of the jitter suppressing effect, the jitter-resistant capability or the like of the device to be tested as well as the check of the unnecessary jitter output of the device to be tested.

Figure 34:
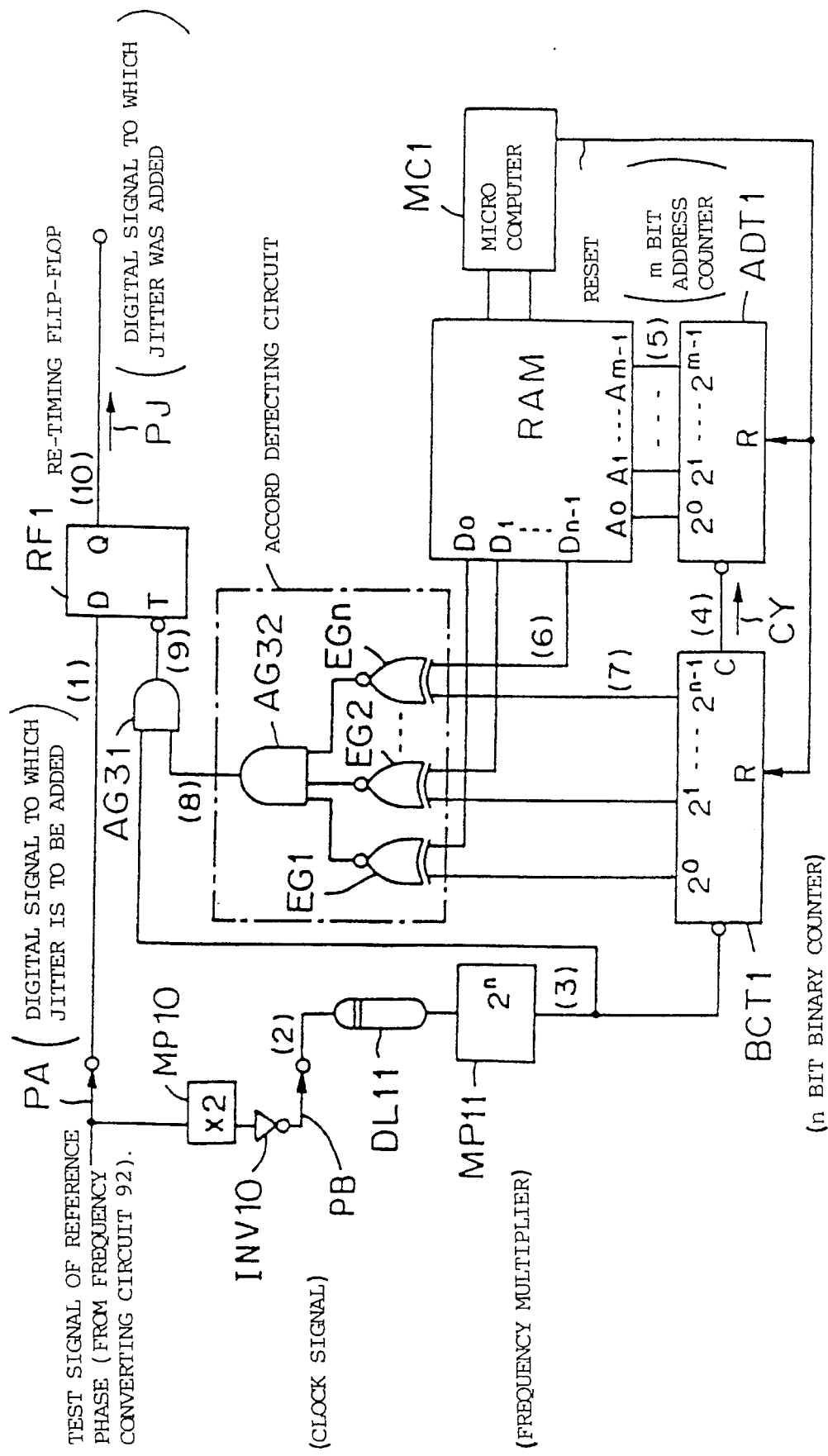
FIG. 34 is a block diagram schematically showing a jitter adding circuit used in the jitter analyzer of FIG. 27.

Further, the detailed explanation of the operation of the jitter adding circuit 94 is described in Japanese Patent Application No. 188723/1991 (Japanese Patent Application Public Disclosure No. 37311/1993) entitled "JITTER ADDING APPARATUS" filed by the same assignee as the present application, and so the waveforms (1) to (10) at respective parts of the circuit in FIG. 34 are shown in FIG. 35 in case that constants m and n in FIG. 34 are selected to 3, respectively, and the explanation thereof is omitted.

In this manner, in accordance with the second embodiment of the present invention, the periods of pulse-like signals to be measured can be continuously measured by inputting the rise edges or fall edges of the pulse-like signals to be measured into the successive period measuring circuits in two systems, and also the analysis of continuous frequency components of jitters ranging from a low frequency to a high frequency can be performed with a high accuracy, and the analysis of jitters of lower frequencies can be sufficiently performed, and moreover wanders based on MTIE according to the advice of ITU/TS can be measured over the observation interval ranging from 50 msec to $10^7$ sec, which is regarded as important, with a high accuracy and efficiently.

I claim:

1. A jitter analyzer comprising:

a first successive period measuring circuit supplied with one edge of each waveform of a pulse-like signal to be measured including a discontinuous burst signal, for continuously measuring the period between the edges;

a second successive period measuring circuit supplied with one edge of each waveform of a pulse-like signal to be measured including a discontinuous burst signal or the other edge of each waveform of said signal to be measured inputted into said first successive period measuring circuit, for continuously measuring the period between the edges;

first and second memories for storing measured period data therein each time said measured period data are provided thereto from said first and second successive period measuring circuits, respectively;

measuring quantity operating means for calculating various quantities in time/frequency domain of said signal to be measured on the basis of the measured period data stored in said first and second memories, said various quantities in time/frequency including at least a period and a pulse width;

analysis means for performing an analysis of the calculated various quantities in time/frequency of said signal to be measured; and first and second gate circuits for controlling the passage of the edges therethrough provided to said first and second successive period measuring circuits, respectively;

said first and second gate circuits being controlled so that they are turned on and off in case a discontinuous burst signal is inputted, thereby inhibiting the input of the signal into said successive period measuring circuits during off-time intervals of said burst signal.

2. A jitter analyzer having a time window trigger function comprising:

a first successive period measuring circuit supplied with one edge of each waveform of a pulse-like signal to be measured including a discontinuous burst signal, for continuously measuring the period between the edges;

a second successive period measuring circuit supplied with one edge of each waveform of a pulse-like signal to be measured including a discontinuous burst signal or the other edge of each waveform of said signal to be measured inputted into said first successive period measuring circuit, for continuously measuring the period between the edges;

first and second memories for storing therein measured period data outputted from said first and second successive period measuring circuits, respectively;

means having a time window trigger function for sequentially comparing measured period data outputted from said first or second successive period measuring circuit with a reference data preset by a user and inhibiting the measured data outputted from said first and second successive period measuring circuits from being stored in said first and second memories until a condition is satisfied as well as, when said condition is satisfied, generating a time window trigger signal thereby making it possible that the measured data outputted from said first and second successive period measuring circuits after the generation of said time window trigger signal are stored in said first and second memories;

measuring quantity operating means for calculating various quantities in time/frequency domain of said signal to be measured on the basis of the measured period data stored in said first and second memories, said various quantities in time/frequency including at least a period and a pulse width; and analysis means for performing an analysis of the calculated various quantities in time/frequency of said signal to be measured.

3. A jitter analyzer having a time window trigger function comprising:

a first successive period measuring circuit supplied with one edge of each waveform of a pulse-like signal to be measured including a discontinuous burst signal, for continuously measuring the period between the edges;

a second successive period measuring circuit supplied with one edge of each waveform of a pulse-like signal to be measured including a discontinuous burst signal or the other edge of each waveform of said signal to be measured inputted into said first successive period measuring circuit, for continuously measuring the period between the edges;

first and second memories for storing therein measured period data outputted from said first and second successive period measuring circuits, respectively;

means having a time window trigger function for sequentially comparing measured period data outputted from said first or second successive period measuring circuit with a reference data preset by a user and making it possible that the measured data outputted from said first and second successive period measuring circuits are stored in said first and second memories until a condition is satisfied as well as, when said condition is satisfied, generating a time window trigger signal thereby inhibiting the measured data outputted from said first and second successive period measuring circuits after the generation of said time window trigger signal from being stored in said first and second memories;

measuring quantity operating means for calculating various quantities in time/frequency domain of said signal to be measured on the basis of the measured period data stored in said first and second memories, said various quantities in time/frequency including at least a period and a pulse width; and analysis means for performing an analysis of the calculated various quantities in time/frequency of said signal to be measured.

4. The jitter analyzer set forth in claim 3, wherein comparator means in said means having a time window trigger function for sequentially comparing measured period data outputted from said first or second successive period measuring circuit with a reference data preset by a user is a magnitude comparator for comparing these data in magnitudes thereof, and the resolution of the trigger data acquisition is made to be equal to that of the measurement.

5. The jitter analyzer set forth in claim 3, further including a control circuit supplied with the edges of said signal to be measured, for controlling on/off of the input of the edges of said signal to be measured into said first and second successive period measuring circuits on the basis of said edges, and wherein in case that a discontinuous burst signal is inputted and a burst on/off signal is not inputted from the outside, a gate on/off signal is supplied from said control circuit thereby inhibiting the input of the signal into said successive period measuring circuits during off-time intervals of said burst signal.

6. The jitter analyzer set forth in claim 3, wherein various quantities in time/frequency domain such as a period, a frequency, a pulse width, a duty ratio, a time interval, a phase or the like of said signal to be measured can be calculated on the basis of the measured period data stored in said first and second memories, and also the result of an analysis of a statistical operation, a distribution of the number of occurrences, a variation relative to the elapsed time, frequency components or the like as to said various quantities can be obtained, and further, acquisition time of each data is all stored so that, when a discontinuous burst signal is analyzed, unnecessary data generated during the off-intervals of said burst signal can be eliminated and an interpolation of data can be done on the basis of the relation between the times before and after the eliminated data.

7. A jitter analyzer having a wander analyzing function comprising:

a first successive period measuring circuit supplied with one edge of each waveform of a pulse-like signal to be measured, for continuously measuring the period between the edges;

a second successive period measuring circuit supplied with one edge of each waveform of a pulse-like signal to be measured or one edge of each waveform of a test signal of a reference phase having a predetermined frequency and created within the analyzer, for continuously measuring the period between the edges;

first and second memories for storing therein measured period data outputted from said first and second successive period measuring circuits, respectively;

measuring quantity operating means for calculating various quantities in time/frequency domain of said signal to be measured on the basis of the measured period data stored in said first and second memories, said various quantities in time/frequency including at least a period and a time interval;

analysis means for performing an analysis of the calculated various quantities in time/frequency of said signal to be measured; and first and second frequency dividing means for selectively dividing in frequency the signals to be measured inputted into said first and second successive period measuring circuits, respectively.

8. The jitter analyzer set forth in claim 7, wherein said analysis means for performing an analysis of the calculated various quantities in time/frequency of the signal to be measured includes means for finding a frequency spectrum of the jitter in the signal to be measured by effecting the fast Fourier transform of the variation relative to the elapsed time of each of the measured values calculated in said measuring quantity operating means and analyzing the transformed results.

9. The jitter analyzer set forth in claim 7, wherein the periods of the two signals to be measured are concurrently and continuously measured by said first and second successive period measuring circuits, and frequency spectrums of the jitters in said two signals to be measured are concurrently found by effecting the fast Fourier transform of the variation relative to the elapsed time of each of the measured values calculated in said measuring quantity operating means and analyzing the transformed results by said analysis means.

10. The jitter analyzer set forth in claim 7, wherein the periods of the two signals to be measured are concurrently and continuously measured by said first and second successive period measuring circuits, and a time interval value between both signals is calculated on the basis of the measured period values of both signals in said measuring quantity operating means, and a relative frequency spectrum of the jitters is found by effecting the fast Fourier transform of the variation relative to the elapsed time of said time interval value calculated in said measuring quantity operating means and analyzing the transformed result by said analysis means.

11. The jitter analyzer set forth in claim 7, wherein signals to be measured are divided in frequency into appropriate frequencies by said first and second frequency dividing means and the periods of the frequency divided signals to be measured are measured by said first and second successive period measuring circuits whereby the overall time interval of the measurement is made long, and a relatively low frequency spectrum of the jitter in the signal to be measured is found by effecting the fast Fourier transform of the variation relative to the elapsed time of each of the measured values calculated in said measuring quantity operating means and analyzing the transformed result by said analysis means.

12. The jitter analyzer set forth in claim 7, wherein a signal to be measured and said test signal of the reference phase having a predetermined frequency are divided in frequency into an appropriate frequency where both the signals accord with each other in frequency by said first and second frequency dividing means, and the periods of the frequency divided signals are measured by said first and second successive period measuring circuits, respectively, and a time interval value between both frequency divided signals is calculated on the basis of the measured values of the frequency divided periods of both signals in said measuring quantity operating means, and the maximum value and the minimum value among the time interval values between both said frequency divided signals calculated in said measuring quantity operating means are calculated, respectively, and concurrently MTIE's in plural observation times and a long-term frequency deviation from the calculated maximum and minimum values by said analysis means so that a wander which is a variation in phase over a long time can be analyzed efficiently.

13. The jitter analyzer set forth in claim 7, further including a jitter adding means for adding a jitter to said test signal of the reference phase having a predetermined frequency and outputting the jitter-added test signal to the outside, and wherein a jitter-added test signal having any waveform and any frequency which a user can set is outputted from said jitter adding means to an external device to be tested, and the output signal from said device to be tested is inputted into the analyzer as a signal to be measured whereby the jitter suppressing effects and the jitter-resistant capability of said device to be tested can be analyzed.

14. The jitter/wander analyzer set forth in claim 7, including a terminal for outputting said test signal having the reference phase and a predetermined frequency to the outside, and wherein a pure test signal having no jitter is outputted from said terminal to an external device to be tested and the output signal from said device to be tested is inputted into the analyzer as a signal to be measured whereby the jitter produced only by said device to be tested can be analyzed.

\* \* \* \* \*

UNITED STATES PATENT AND TRADEMARK OFFICE
CERTIFICATE OF CORRECTION

PATENT NO. : 5,557,196
DATED : September 17, 1996
INVENTOR(S) : Hitoshi UJIE

It is certified that error appears in the above-indentified patent and that said Letters Patent is hereby corrected as shown below:

Column 3, lines 48 and 59, delete "aft" and insert --art--.

Column 13, line 61, change "-1" to --$^{-}$1--.

Column 14, lines 2 and 14, change "-1" to --$^{-}$1--;

line 18, after "memories" insert --19--;

line 36, after "part" (second occurrence) insert --34.--; and line 58, "2048 mV" should be -- +2048 mV--

Column 15, lines 15, 49, 61 and 66, change "-1" to --$^{-}$1--.

Column 16, lines 2, 3, 15 and 19, change "-1" to --$^{-}$1--.

Column 18, line 10, "t $_3$" should be --$t_3$--;

line 30, "I(0, $W_1$)" should be --1(0, $W_1$);

line 43, in the equation, "($W_2 W_3$)" should be --($W_2$-$W_3$)-- and

"($t_1 W_3 t_2 W_2$)" should be --($t_1 W_3$-$t_2 W_2$)--; and

UNITED STATES PATENT AND TRADEMARK OFFICE
CERTIFICATE OF CORRECTION

PATENT NO. : 5,557,196
DATED : September 17, 1996
INVENTOR(S) : Hitoshi UJIE

It is certified that error appears in the above-indentified patent and that said Letters Patent is hereby corrected as shown below:

line 44, delete "," (second occurrence).

Column 21, line 39, after "switch" insert --SW1--.

Column 24, line 34, after "circuit" insert --11.--.

Column 30, line 53, change "..." to -- ··· . --.

Column 31, lines 21 and 44, change "..." to -- ··· . --.

Column 35, line 27, after "circuits" insert --17,--.

Column 41, line 65, after "flip-flop" insert --F3.--.

Column 42, line 1, "F1" should be --F4--;

lines 14 and 19, "GS" should be --G5--.

Column 45, line 18, "95" should be --93--;

line 20, "2900" should be --2500--;

UNITED STATES PATENT AND TRADEMARK OFFICE
CERTIFICATE OF CORRECTION

PATENT NO. : 5,557,196
DATED : September 17, 1996
INVENTOR(S) : Hitoshi UJIE

It is certified that error appears in the above-indentified patent and that said Letters Patent is hereby corrected as shown below:

Column 45, line 23, after "by" insert --512--;

line 28, after "filter" insert --113.--; and line 45, "FIG. 54" should be --FIG. 34--.

Signed and Sealed this

Seventh Day of January, 1997

Attest:

BRUCE LEHMAN

*Attesting Officer*      *Commissioner of Patents and Trademarks*